(12) United States Patent
Asao et al.

(10) Patent No.: US 12,170,106 B2
(45) Date of Patent: Dec. 17, 2024

(54) MAGNETIC MEMORY DEVICE

(71) Applicant: KIOXIA CORPORATION, Tokyo (JP)

(72) Inventors: Yoshiaki Asao, Kawasaki Kanagawa (JP); Masatoshi Yoshikawa, Tokyo (JP)

(73) Assignee: Kioxia Corporation, Tokyo (JP)

( * ) Notice: Subject to any disclaimer, the term of this patent is extended or adjusted under 35 U.S.C. 154(b) by 206 days.

(21) Appl. No.: 17/682,667

(22) Filed: Feb. 28, 2022

(65) Prior Publication Data

US 2023/0069841 A1 Mar. 9, 2023

(30) Foreign Application Priority Data

Sep. 8, 2021 (JP) .................................. 2021-146187

(51) Int. Cl.
*G11C 11/16* (2006.01)
*G11C 5/08* (2006.01)
(Continued)

(52) U.S. Cl.
CPC ............ *G11C 11/1675* (2013.01); *G11C 5/08* (2013.01); *G11C 11/1673* (2013.01);
(Continued)

(58) Field of Classification Search
CPC ... G11C 11/1675; G11C 5/08; G11C 11/1673; H10B 61/10; H10B 61/20; H10N 50/10; H10N 50/85
See application file for complete search history.

(56) References Cited

U.S. PATENT DOCUMENTS

| 7,184,301 B2 | 2/2007 | Sugibayashi et al. |
| 9,385,160 B2 | 7/2016 | Asao |

(Continued)

FOREIGN PATENT DOCUMENTS

| JP | 3888463 B2 | 3/2007 |
| JP | 2012235063 A | 11/2012 |

(Continued)

OTHER PUBLICATIONS

Yu-Ching Liao et al., "Spin-Orbit-Torque Material Exploration for Maximum Array-Level Read/Write Performance", IEEE International Electron Devices Meeting (IEDM), 2020, DOI: 10.1109/IEDM13553.2020.9371979, 4 pages.

(Continued)

*Primary Examiner* — Mohammed A Bashar
(74) *Attorney, Agent, or Firm* — Kim & Stewart LLP

(57) ABSTRACT

According to one embodiment, a magnetic memory device includes first to third conductor layers, and a three-terminal-type memory cell connected to the first to third conductor layers. The first memory cell includes a fourth conductor layer, a magnetoresistance effect element, a two-terminal-type first switching element, and a two-terminal-type second switching element. The fourth conductor layer includes a first portion connected to the first conductor layer, a second portion connected to the second conductor layer, and a third portion which is connected to the third conductor layer. The magnetoresistance effect element is connected between the third conductor layer and the fourth conductor layer. The first switching element is connected between the second conductor layer and the fourth conductor layer. The second switching element is connected between the first conductor layer and the third conductor layer.

20 Claims, 27 Drawing Sheets

(51) Int. Cl.
  *H10B 61/00* (2023.01)
  *H10N 50/10* (2023.01)

(52) U.S. Cl.
  CPC ............ *H10B 61/10* (2023.02); *H10B 61/20* (2023.02); *H10N 50/10* (2023.02)

(56) References Cited

U.S. PATENT DOCUMENTS

| | | | |
|---|---|---|---|
| 9,830,968 | B2 | 11/2017 | Shimomura et al. |
| 10,134,457 | B1 | 11/2018 | Mihajlovic et al. |
| 10,770,214 | B2 | 9/2020 | Shiokawa |
| 2010/0315866 | A1* | 12/2010 | Park ............... G11C 13/004 257/E47.001 |
| 2012/0286339 | A1 | 11/2012 | Asao |
| 2014/0160830 | A1* | 6/2014 | Chung ............... G11C 17/18 365/96 |
| 2014/0319634 | A1* | 10/2014 | Shukh ............... G11C 11/161 257/427 |
| 2017/0077177 | A1 | 3/2017 | Shimomura et al. |
| 2017/0117027 | A1 | 4/2017 | Braganca et al. |
| 2017/0270985 | A1 | 9/2017 | Shimomura et al. |
| 2018/0174635 | A1 | 6/2018 | Yoda et al. |
| 2020/0091409 | A1* | 3/2020 | Ito ............... H10N 50/80 |
| 2020/0135251 | A1* | 4/2020 | Osborne ............ G11C 13/004 |
| 2020/0303625 | A1 | 9/2020 | Yoshikawa et al. |
| 2021/0012820 | A1 | 1/2021 | Shiokawa |

FOREIGN PATENT DOCUMENTS

| | | |
|---|---|---|
| JP | 5677187 B2 | 2/2015 |
| JP | 2017059679 A | 3/2017 |
| JP | 2017112359 A | 6/2017 |
| JP | 6178451 B1 | 8/2017 |
| JP | 2018098468 A | 6/2018 |
| JP | 2019161175 A | 9/2019 |
| JP | 2020155488 A | 9/2020 |
| JP | 2020188138 A | 11/2020 |
| JP | 6799566 B2 | 12/2020 |
| JP | 2021015839 A | 2/2021 |

OTHER PUBLICATIONS

Changhyun Cho et al., "A 6F2 DRAM Technology in 60nm era for Gigabit Densities", Symposium on VLSI Technology Digest of Technical Papers, 2005, pp. 36-37.
S. Fukami et al., "A spin-orbit torque switching scheme with collinear magnetic easy axis and current configuration", Nature Nanotechnology, vol. 11, Jul. 2016, Macmillan Publishers Limited, Published online: Mar. 21, 2016, DOI: 10.1038/NNAMO.2016.29, www.nature.com/naturenanotechnology, pp. 621-626.
Yeongkyo Seo et al., Area-Efficient SOT-MRAM With a Schottky Diode, IEEE Electron Device Letters, vol. 37, No. 8, Aug. 2016, pp. 982-985.
Xiang Li et al., Materials Requirements of High-Speed and Low-Power Spin-Orbit-Torque Magnetic Random-Access Memory, Journal of the Electron Devices Society, vol. 8, 2020, DOI: 10.1109/JEDS.2020.2984610, pp. 674-680.

* cited by examiner

FIG. 17
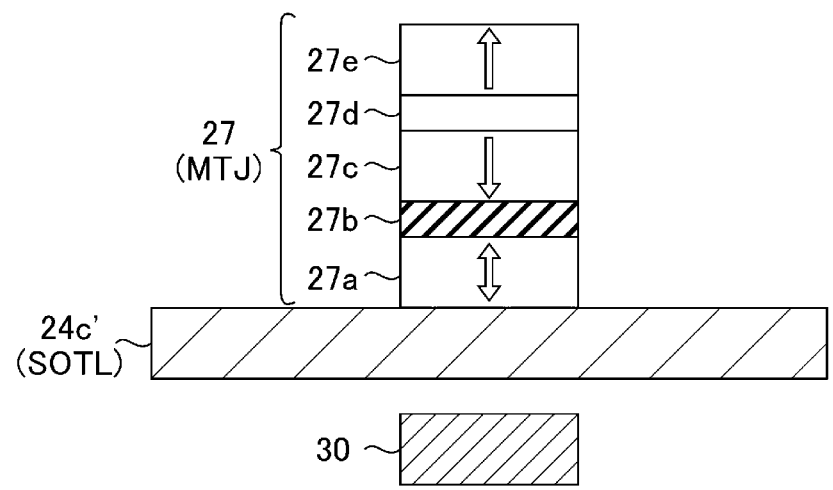
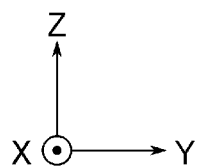
FIG. 18
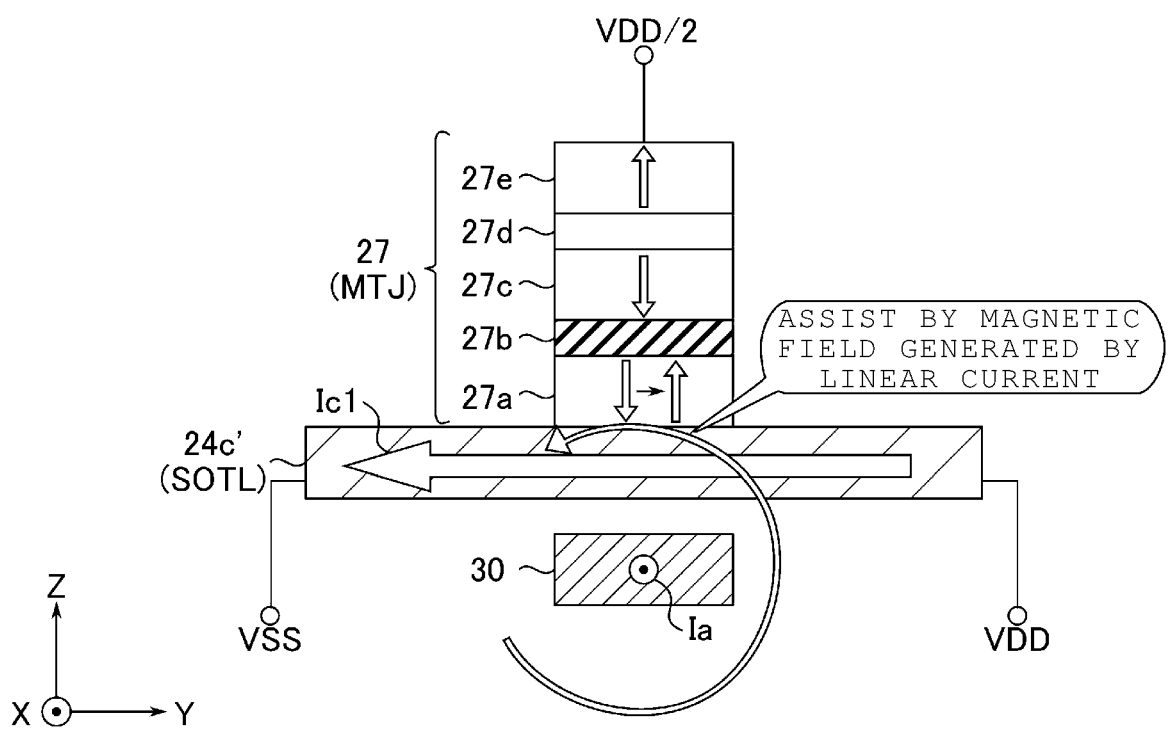

MAGNETIC MEMORY DEVICE

CROSS-REFERENCE TO RELATED APPLICATION

This application is based upon and claims the benefit of priority from Japanese Patent Application No. 2021-146187, filed Sep. 8, 2021, the entire contents of which are incorporated herein by reference.

FIELD

Embodiments described herein relate generally to a magnetic memory device.

BACKGROUND

A magnetic memory device using a magnetoresistance effect element as a storage element is known. Various methods have been suggested for writing data to the magnetoresistance effect element.

BRIEF DESCRIPTION OF THE DRAWINGS

FIG. 17 is a cross-sectional view of a magnetoresistance effect element and a peripheral wiring according to a second modification of the first embodiment.

FIG. 18 is a circuit diagram related to a write operation in a magnetic memory device according to a second modification of a first embodiment.

DETAILED DESCRIPTION

Figure 1:
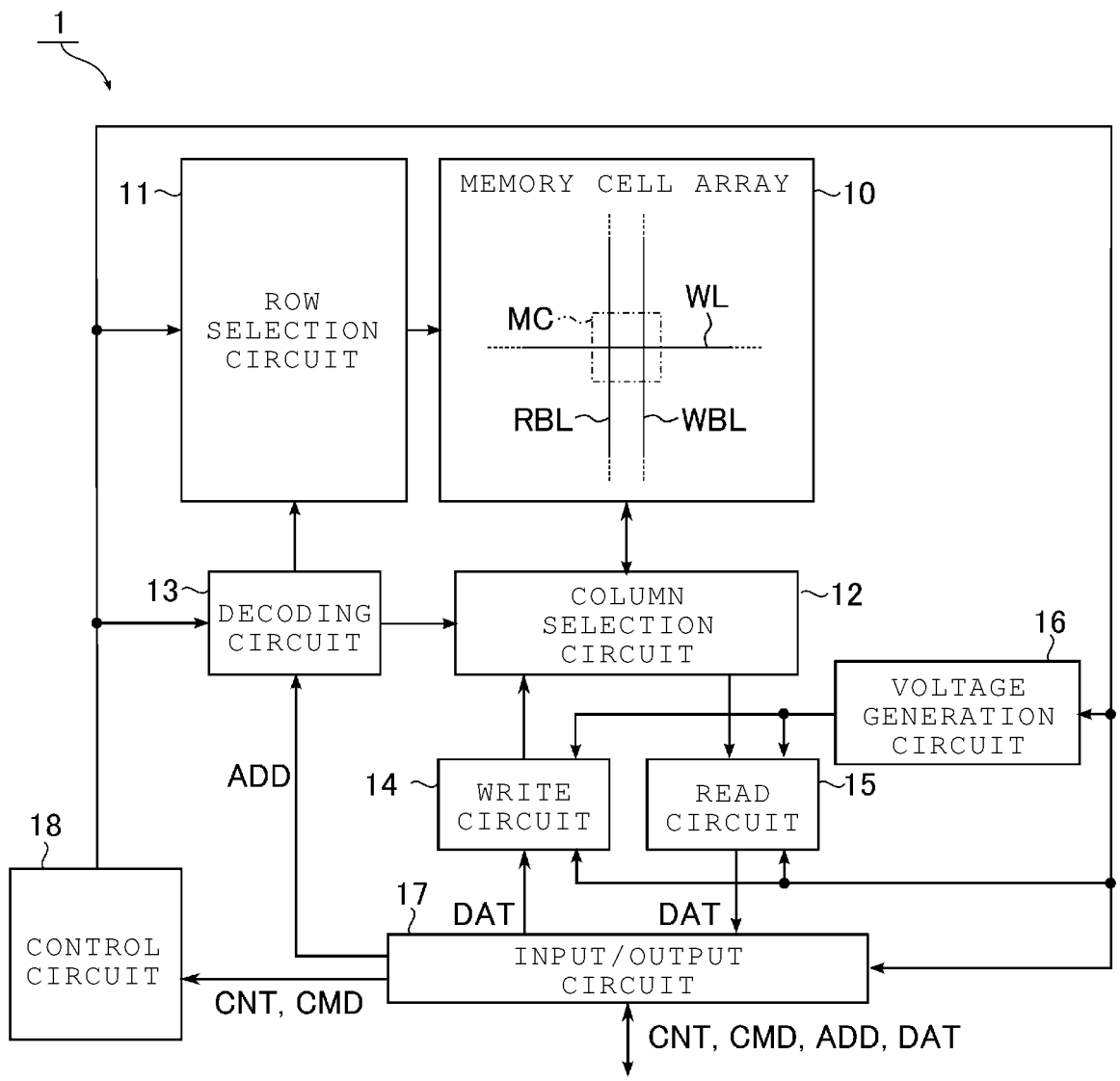
FIG. 1 is a block diagram of a magnetic memory device according to a first embodiment.

Embodiments provide a magnetic memory device in which it is possible to reduce the size of memory cells.

In general, according to one embodiment, a magnetic memory device includes a first conductor layer, a second conductor layer, a third conductor layer, and a three-terminal-type first memory cell connected to the first conductor layer, the second conductor layer, and the third conductor layer. The first memory cell includes a fourth conductor layer, a first magnetoresistance effect element, a two-terminal-type first switching element, and a two-terminal-type second switching element. The fourth conductor layer includes a first portion connected to the first conductor layer, a second portion connected to the second conductor layer, and a third portion that is connected to the third conductor layer. The first magnetoresistance effect element is connected between the third conductor layer and the fourth conductor layer. The first switching element is connected between the second conductor layer and the fourth conductor layer. The second switching element is connected between the first conductor layer and the third conductor layer.

Hereinafter, certain example embodiments are described with reference to the drawings. In the following description, components having the same function and configuration are designated by a common reference numeral. When a plurality of components having a common reference numeral are to be distinguished from one another, suffixes are added to the common reference numeral. When it is not necessary to distinguish between such components, only the common reference numeral is used and no suffix is added. Suffixes are not limited to subscripts and superscripts, and include, for example, lowercase alphabets, symbols, and indexes meaning arrays added to the end of reference numeral.

In the present specification, the magnetic memory device is, for example, a Magnetoresistive Random Access Memory (MRAM). The magnetic memory device includes a magnetoresistance effect element as a storage element. The magnetoresistance effect element is a variable resistance element having a magnetoresistance effect by magnetic tunnel junction (MTJ). The magnetoresistance effect element is also referred to as MTJ element.

1. First Embodiment

A first embodiment is described.

1.1 Configuration

First, the configuration of a magnetic memory device according to the first embodiment is described.

1.1.1 Magnetic Memory Device

FIG. 1 is a block diagram illustrating an example of a configuration of the magnetic memory device according to the first embodiment. A magnetic memory device 1 includes a memory cell array 10, a row selection circuit 11, a column selection circuit 12, a decoding circuit 13, a write circuit 14, a read circuit 15, a voltage generation circuit 16, an input/output circuit 17, and a control circuit 18.

The memory cell array 10 is a storage unit for the data in the magnetic memory device 1. The memory cell array 10 includes a plurality of memory cells MC. The memory cells MC can be associated with sets including rows or columns. The memory cells MC in the same row are connected to the same word lines WL, and the memory cells MC in the same column are connected to the same read bit lines RBL and the same write bit lines WBL.

The row selection circuit 11 is for selecting the row of the memory cell array 10. The row selection circuit 11 is connected to the memory cell array 10 via the word lines WL. A decoding result (row address) of an address ADD from the decoding circuit 13 is supplied to the row selection circuit 11. The row selection circuit 11 selects the word line WL based on the decoding result of the address ADD. The word lines WL other than the selected word line WL are referred to as non-selected word lines WL.

The column selection circuit 12 is for selecting a column of the memory cell array 10. The column selection circuit 12 is connected to the memory cell array 10 via the read bit lines RBL and the write bit lines WBL. A decoding result (column address) of the address ADD from the decoding circuit 13 is supplied to the column selection circuit 12. The column selection circuit 12 selects the read bit line RBL and the write bit line WBL based on the decoding result of the address ADD. The read bit lines RBL other than the selected bit line RBL are referred to as non-selected bit lines RBL. The write bit lines WBL other than the selected write bit line WBL are referred to as non-selected bit line WBL.

The decoding circuit 13 is a decoder that decodes the address ADD from the input/output circuit 17. The decoding circuit 13 supplies the decoding result from the address ADD to the row selection circuit 11 and the column selection circuit 12. The address ADD includes the selected column address and the selected row address.

The write circuit 14 includes, for example, a write driver. The write circuit 14 writes data to the memory cell MC.

The read circuit 15 includes, for example, a sense amplifier. The read circuit 15 reads data from the memory cell MC.

The voltage generation circuit 16 uses a power supply voltage provided from the outside of the magnetic memory device 1 to generate voltages for various operations of the memory cell array 10. For example, the voltage generation circuit 16 generates various voltages necessary during the write operation and outputs the voltages to the write circuit 14. The voltage generation circuit 16 generates various voltages necessary during the read operation and outputs these voltages to the read circuit 15.

The input/output circuit 17 controls the communication with the outside of the magnetic memory device 1. The input/output circuit 17 transmits the address ADD from the outside of the magnetic memory device 1 to the decoding circuit 13. The input/output circuit 17 transmits a command CMD from the outside of the magnetic memory device 1 to the control circuit 18. The input/output circuit 17 transmits and receives various control signals CNT between the outside of the magnetic memory device 1 and the control circuit 18. The input/output circuit 17 transmits data DAT from the outside of the magnetic memory device 1 to the write circuit 14 and outputs data DAT transmitted from the read circuit 15 to the outside of the magnetic memory device 1.

For example, the control circuit 18 includes a processor such as a central processing unit (CPU) and a read only memory (ROM). The control circuit 18 controls operations of the row selection circuit 11, the column selection circuit 12, the decoding circuit 13, the write circuit 14, the read circuit 15, the voltage generation circuit 16, and the input/output circuit 17 in the magnetic memory device 1 based on the control signals CNT and the command CMD.

1.1.2 Memory Cell Array

A memory cell array of the magnetic memory device according to the first embodiment is described.
(Circuit Configuration)

Figure 2:
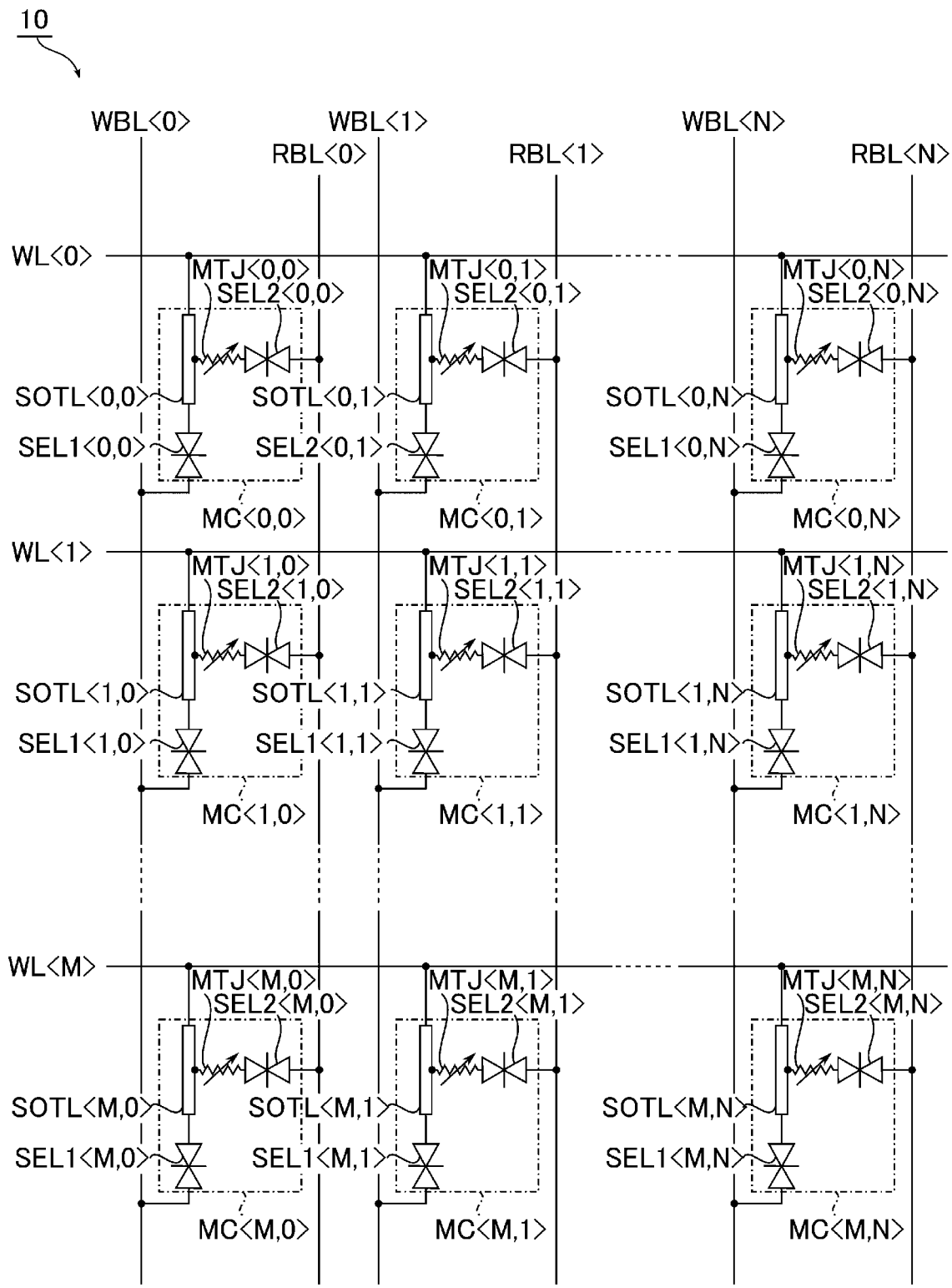
FIG. 2 is a circuit diagram of a memory cell array according to a first embodiment.

FIG. 2 is a circuit diagram illustrating an example of the circuit configuration of the memory cell array according to the first embodiment. In FIG. 2, the word lines WL, the read bit lines RBL, and the write bit lines WBL are described by being classified by suffixes including indexes ("< >").

The memory cell array 10 includes the plurality of memory cells MC, the plurality of word lines WL, the plurality of read bit lines RBL, and the plurality of write bit lines WBL. In the example of FIG. 2, the plurality of memory cells MC include (M+1)×(N+1) memory cells MC<0, 0>, MC<0, 1>, . . . MC<0, N>, MC<1, 0>, . . . and MC<M, N> (M and N are integers of 2 or more). In the example of FIG. 2, a case where M and N are integers of 2 or more is provided, but the embodiment is not limited thereto. M and N may be 0 or 1. The plurality of word lines WL include (M+1) word lines WL<0>, WL<1>, . . . and WL<M>. The plurality of read bit lines RBL include (N+1) read bit lines RBL<0>, RBL<1>, . . . and RBL<N>. The plurality of write bit lines WBL include (N+1) write bit lines WBL<0>, WBL<1>, . . . and WBL<N>.

The plurality of memory cells MC are arranged in a matrix configuration in the memory cell array 10. The memory cells MC are associated with a set including one of the plurality of word lines WL and one set including the read bit line RBL and the write bit line WBL among the plurality of read bit lines RBL and the plurality of write bit lines WBL. That is, the memory cell MC<i, j> (0≤i≤M, and 0≤j≤N) is connected to the word line WL<i>, the read bit line RBL<j>, and the write bit line WBL<j>.

The memory cell MC<i, j> is a three-terminal-type memory cell having a first end connected to the word line WL<i>, a second end connected to the write bit line WBL<j>, and a third end connected to the read bit line RBL<j>. The memory cell MC<i, j> includes switching elements SEL1<i, j> and SEL2<i, j>, a magnetoresistance effect element MTJ<i, j>, and a wiring SOTL<i, j>.

The wiring SOTL<i, j> includes a first portion, a second portion, and a third portion between the first portion and the second portion. The first portion of the wiring SOTL<i, j> is connected to the word line WL<i>. The second portion of the wiring SOTL<i, j> is connected to the write bit line WBL<j>. The third portion of the wiring SOTL<i, j> is connected to the read bit line RBL<j>. The switching element SEL1<i, j> is connected between the second portion of the wiring SOTL<i, j> and the write bit line WBL<j>. The magnetoresistance effect element MTJ<i, j> is connected between the third portion of the wiring SOTL<i, j> and the read bit line RBL<j>. The switching element SEL2<i, j> is connected between the magnetoresistance effect element MTJ<i, j> and the read bit line RBL<j>.

The switching elements SEL1 and SEL2 are two-terminal-type switching elements. The two-terminal-type switching element is different from a three-terminal-type switching element such as transistor in that the two-terminal-type switching element does not include the third terminal. When the voltages applied between the two terminals are lower than threshold voltages Vth1 and Vth2, respectively, the switching elements SEL1 and SEL2 are in a "high resistance" state or an "off" state, for example, an electrically non-conductive state. When the voltages applied between two terminals are the threshold voltages Vth1 and Vth2 or higher, respectively, the switching elements SEL1 and SEL2 changes to the "low resistance" state or the "on" state, for example, an electrically conductive state. More specifically, for example, when the voltages applied to the corresponding memory cells MC are lower than the threshold voltages Vth1 and Vth2, the switching elements SEL1 and SEL2 cut off the current as the insulators having large resistance values (enter an off state). When the voltages applied to the corresponding memory cells MC are higher than the threshold voltages Vth1 and Vth2, the switching elements SEL1 and SEL2 allow the current to flow as the conductors having small resistance values (enter an on state). The switching elements SEL1 and SEL2 switch whether to cut off or flow the current according to the magnitude of the voltage applied to the corresponding memory cells MC regardless of the polarity of the voltage applied between the two terminals (regardless of the direction of the flowing current).

The wiring SOTL is a current path in the memory cell MC. For example, when the switching element SEL1 is in an on state and the switching element SEL2 is in an off state, the wiring SOTL functions as a current path between the word line WL and the write bit line WBL. For example, when the switching element SEL1 is in an off state, and the switching element SEL2 is in an on state, a portion of the wiring SOTL functions as a current path between the word line WL and the read bit line RBL.

The magnetoresistance effect element MTJ is a variable resistance element. The magnetoresistance effect element MTJ can switch the resistance value to the low resistance state and the high resistance state based on the current of which the path is controlled by the switching elements SEL1 and SEL2. The magnetoresistance effect element MTJ functions as a storage element that non-voluntarily stores the data according to the change of the resistance state.

(Planar Layout)

A planar layout of the memory cell array according to the first embodiment is described.

Figure 3:
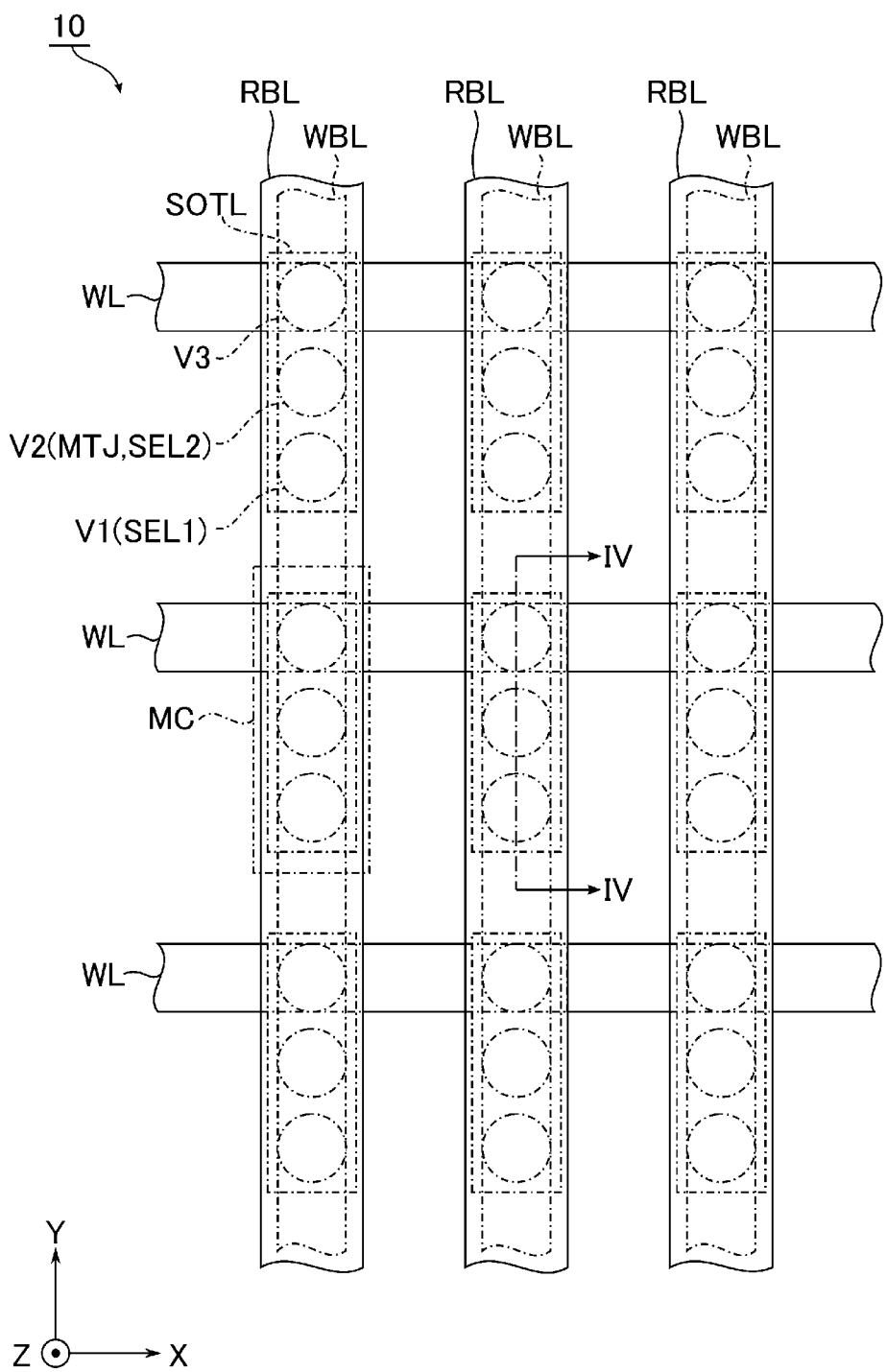
FIG. 3 is a plan view of a memory cell array according to a first embodiment.

FIG. 3 is a plan view illustrating an example of the planar layout of the memory cell array according to the first embodiment. In FIG. 3, the structure of an insulator layer and the like is omitted.

The memory cell array 10 further includes a plurality of vertical structures V1, a plurality of vertical structures V2, and a plurality of vertical structures V3. Each of the plurality of vertical structures V1 includes the switching element SEL1. Each of the plurality of vertical structures V2 includes the magnetoresistance effect element MTJ and the switching element SEL2.

The plurality of write bit lines WBL are arranged in the X direction. Each of the plurality of write bit lines WBL extends in the Y direction.

The plurality of word lines WL are provided above the plurality of write bit lines WBL. The plurality of word lines WL are arranged in the Y direction. Each of the plurality of word lines WL extends in the X direction.

The plurality of wirings SOTL are provided above the plurality of word lines WL. In a plan view, each of the plurality of wirings SOTL has a rectangular shape extending in the Y direction with respect to the X direction. Each of the plurality of wirings SOTL extends in the Y direction. In a plan view, each of the plurality of wirings SOTL corresponds to a position where one word line WL and one write bit line WBL overlap with each other and is provided in a matrix configuration.

The plurality of read bit lines RBL are provided above the plurality of wirings SOTL. The plurality of read bit lines RBL are arranged in the X direction. Each of the plurality of read bit lines RBL extends in the Y direction. In a plan view, the plurality of read bit lines RBL are provided at positions overlapping with the plurality of write bit lines WBL, respectively.

The plurality of vertical structures V1 extends in the Z direction. In a plan view, the plurality of vertical structures V1 each have a circular shape. Each of the plurality of vertical structures V1 is connected between one corresponding write bit line WBL and one corresponding wiring SOTL.

The plurality of vertical structures V2 extend in the Z direction. In a plan view, the vertical structures V2 each have a circular shape. Each of the vertical structures V2 is connected to one corresponding read bit line RBL and one corresponding wiring SOTL.

The vertical structures V3 extend in the Z direction. In a plan view, the vertical structures V3 each have a circular shape. Each of the vertical structures V3 is connected to one corresponding word line WL and one corresponding wiring SOTL.

In the configuration as above, a set including one wiring SOTL and one vertical structure V1, one vertical structure V2, and one vertical structure V3 connected to the one corresponding wiring SOTL functions as one memory cell MC.

(Cross-Sectional Structure)

A cross-sectional structure of the memory cell array according to the first embodiment is described.

Figure 4:
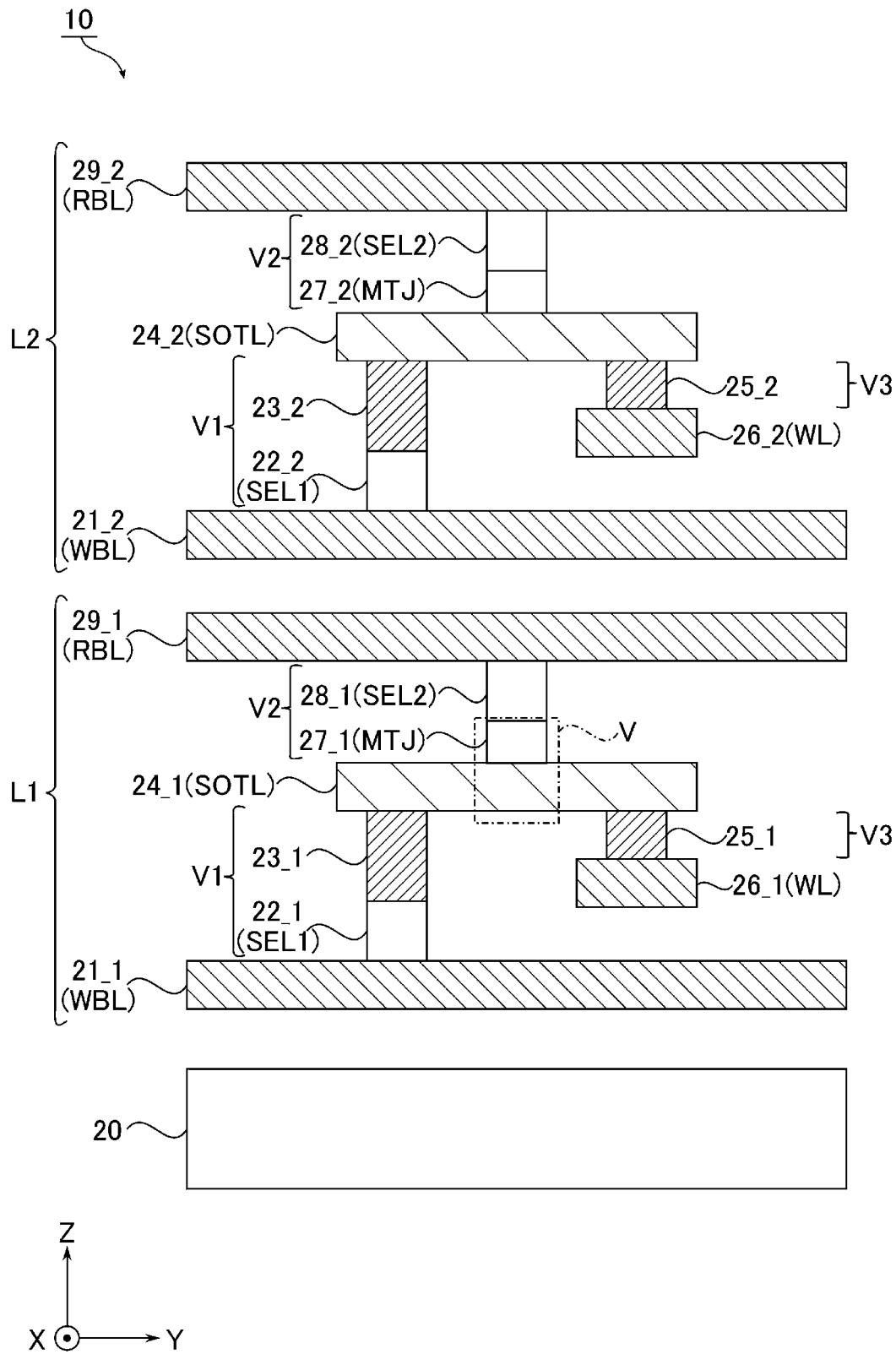
FIG. 4 is a cross-sectional view of a memory cell array according to a first embodiment.

FIG. 4 is a cross-sectional view illustrating an example of the cross-sectional structure of the memory cell array according to the first embodiment, which is taken along the line IV-IV of FIG. 3. The memory cell array 10 includes a semiconductor substrate 20 and hierarchical structures L1 and L2. The hierarchical structure L1 includes conductor layers 21_1, 23_1, 24_1, 25_1, 26_1, and 29_1, and element layers 22_1, 27_1, and 28_1. The hierarchical structure L2 includes conductor layers 21_2, 23_2, 24_2, 25_2, 26_2, and 29_2, and element layers 22_2, 27_2, and 28_2. A configuration to which a suffix "_x" is added indicates a configuration belonging to a hierarchical structure Lx (x is an integer of 1 or more).

The hierarchical structures L1 and L2 are stacked in this order in the Z direction above the semiconductor substrate 20. Each of the hierarchical structures L1 and L2 corresponds to the planar layout illustrated in FIG. 3.

Peripheral circuits such as the row selection circuit 11 and the column selection circuit 12 may be provided between the semiconductor substrate 20 and the hierarchical structure L1. A circuit may not be formed between the semiconductor substrate 20 and the hierarchical structure L1. When a circuit is not formed between the semiconductor substrate 20 and the hierarchical structure L1, a shallow trench isolation (STI) may be formed in the portion positioned under the hierarchical structure L1 on the semiconductor substrate 20.

The hierarchical structure L1 is described.

The conductor layer 21_1 is provided above the semiconductor substrate 20. The conductor layer 21_1 is used as the write bit line WBL. The conductor layer 21_1 extends in the Y direction.

The element layer 22_1 is provided on the upper surface of the conductor layer 21_1. The element layer 22_1 is used as the switching element SEL1.

The conductor layer 23_1 is provided on the upper surface of the element layer 22_1. The conductor layer 23_1 is used as a contact. The element layer 22_1 and the conductor layer 23_1 configure the vertical structure V1.

The conductor layer 24_1 is provided on the upper surface of the conductor layer 23_1. The conductor layer 24_1 is used as the wiring SOTL. The conductor layer 24_1 extends in the Y direction.

The conductor layer 25_1 is provided in a portion of the lower surface of the conductor layer 24_1 different from the portion where the conductor layer 23_1 is provided. The conductor layer 25_1 is used as a contact. The conductor layer 25_1 configures the vertical structure V3.

The conductor layer 26_1 is provided on the lower surface of the conductor layer 25_1. The conductor layer 26_1 is used as the word line WL. The conductor layer 26_1 extends in the X direction.

The element layer 27_1 is provided in a portion of the upper surface of the conductor layer 24_1 between the portion where the conductor layer 23_1 is provided and the portion where the conductor layer 25_1 is provided. The element layer 27_1 is used as the magnetoresistance effect element MTJ.

The element layer 28_1 is provided on the upper surface of the element layer 27_1. The element layer 28_1 is used as the switching element SEL2. The element layers 27_1 and 28_1 configure the vertical structure V2.

The conductor layer 29_1 is provided on the upper surface of the element layer 28_1. The conductor layer 29_1 is used as the read bit line RBL. The conductor layer 29_1 extends in the Y direction.

In the configuration as above, one set including the conductor layer 24_1 and the vertical structures V1, V2, and V3 in the hierarchical structure L1 functions as one memory cell MC having three terminals connected to the conductor layers 21_1, 26_1, and 29_1, respectively.

The hierarchical structure L2 has the same configuration as the hierarchical structure L1. That is, the conductor layers 21_2, 23_2, 24_2, 25_2, 26_2, and 29_2, and the element layers 22_2, 27_2, and 28_2 have the same structures and the functions as the conductor layers 21_1, 23_1, 24_1, 25_1, 26_1, and 29_1, and the element layers 22_1, 27_1, and 28_1, respectively. Accordingly, one set including the conductor layer 24_2 and the vertical structures V1, V2, and V3 in the hierarchical structure L2 functions as one memory cell MC having three terminals connected to the conductor layers 21_2, 26_2, and 29_2, respectively.

1.1.3 Magnetoresistance Effect Element and Peripheral Wiring

Figure 5:
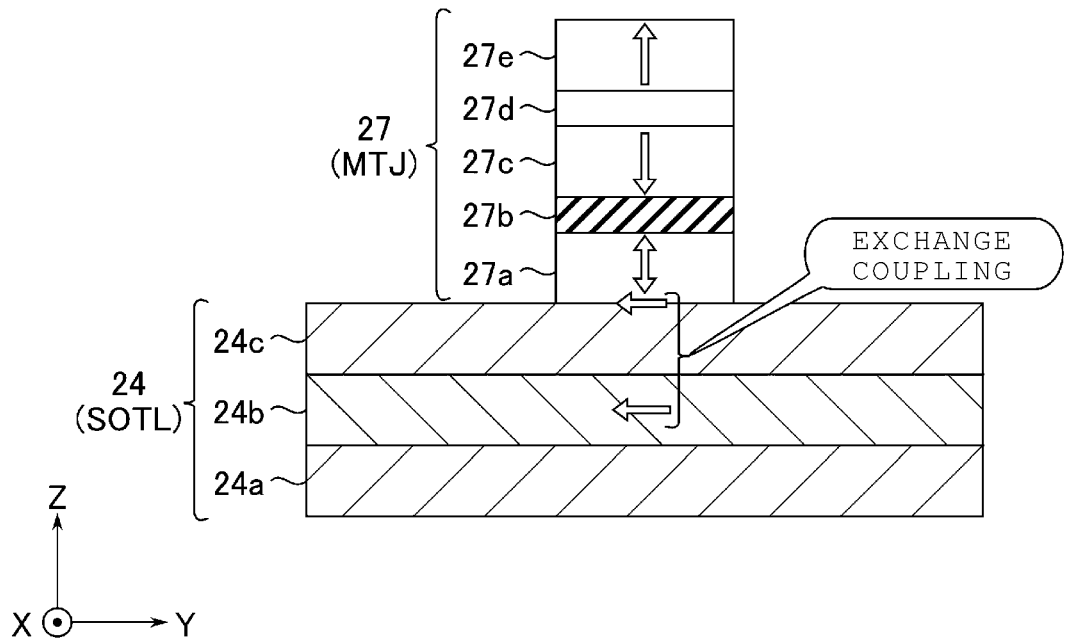
FIG. 5 is a cross-sectional view of a magnetoresistance effect element and a peripheral wiring according to a first embodiment.

FIG. 5 is a cross-sectional view of an area V of FIG. 4, illustrating an example of the cross-sectional structures of the magnetoresistance effect element and the peripheral wiring according to the first embodiment. A conductor layer 24 includes an antiferromagnetic layer 24a, a ferromagnetic layer 24b, and a non-magnetic layer 24c. An element layer 27 includes a ferromagnetic layer 27a, a non-magnetic layer 27b, a ferromagnetic layer 27c, a non-magnetic layer 27d, and a ferromagnetic layer 27e.

First, details of the structure of the conductor layer 24 are described.

The antiferromagnetic layer 24a is a conductive film having antiferromagnetism. The antiferromagnetic layer 24a stabilizes the magnetization direction of the ferromagnetic layer 24b by the exchange coupling with the ferromagnetic layer 24b. The antiferromagnetic layer 24a contains, for example, platinum manganese (PtMn).

The ferromagnetic layer 24b is provided on the upper surface of the antiferromagnetic layer 24a. The ferromagnetic layer 24b is a conductive film having ferromagnetism. The ferromagnetic layer 24b includes the easy magnetization axial direction in the direction (the Y direction) in which the ferromagnetic layer 24b extends. The magnetization direction of the ferromagnetic layer 24b is stabilized along the Y direction by exchange coupling with the antiferromagnetic layer 24a in addition to shape anisotropy. The magnetization direction of the ferromagnetic layer 24b is reversed according to the direction of the current flowing in the ferromagnetic layer 24b. The ferromagnetic layer 24b contains, for example, cobalt iron (CoFe).

The non-magnetic layer 24c is provided on the upper surface of the ferromagnetic layer 24b. The non-magnetic layer 24c is a non-magnetic heavy metal conductive film. The non-magnetic layer 24c generates spin orbit torque (SOT) by the current flowing the non-magnetic layer 24c. The spin orbit torque is injected into the ferromagnetic layer 27a. The non-magnetic layer 24c also causes the ferromagnetic layer 24b and the ferromagnetic layer 27a to be subjected to the interlayer exchange coupling. The non-magnetic layer 24c contains, for example, at least one element selected from platinum (Pt), palladium (Pd), gold (Au), and silver (Ag).

The ferromagnetic layer 27a is provided on the upper surface of the non-magnetic layer 24c. The ferromagnetic layer 27a is a conductive film having ferromagnetism. The ferromagnetic layer 27a is used as a storage layer SL. The ferromagnetic layer 27a includes an easy magnetization axial direction in a direction perpendicular to the film surface (the Z direction). A bias magnetic field in the Y direction is applied to the ferromagnetic layer 27a by the interlayer exchange coupling with the ferromagnetic layer 24b via the non-magnetic layer 24c on the interface with the non-magnetic layer 24c. The spin orbit torque generated on the non-magnetic layer 24c is injected into the ferromagnetic layer 27a. The magnetization direction of the ferromagnetic layer 27a is configured to be reversed based on the bias magnetic field in the Y direction and the spin orbit torque.

The ferromagnetic layer 27a contains iron (Fe). The ferromagnetic layer 27a can further contain at least one element of cobalt (Co) and nickel (Ni). The ferromagnetic layer 27a can further contain boron (B). More specifically, for example, the ferromagnetic layer 27a contains iron cobalt boron (FeCoB) or iron boride (FeB).

The non-magnetic layer 27b is provided on the upper surface of the ferromagnetic layer 27a. The non-magnetic layer 27b is a non-magnetic insulating film. The non-magnetic layer 27b is used as a tunnel barrier layer TB. The non-magnetic layer 27b is provided between the ferromagnetic layer 27a and the ferromagnetic layer 27c and forms the magnetic tunnel junction together with these two ferromagnetic layers. The non-magnetic layer 27b functions as a seed material to be a core for growing a crystalline film from the interface with the ferromagnetic layer 27a in a crystallization process of the ferromagnetic layer 27a. The non-magnetic layer 27b has a NaCl crystal structure in which the film surface is oriented toward a (001) plane. The non-magnetic layer 27b contains, for example, magnesium oxide (MgO).

The ferromagnetic layer 27c is provided on the upper surface of the non-magnetic layer 27b. The ferromagnetic layer 27c is a conductive film having ferromagnetism. The ferromagnetic layer 27c is used as a reference layer RL. The ferromagnetic layer 27c has an easy magnetization axial direction in a direction perpendicular to the film surface (the Z direction). The magnetization direction of the ferromagnetic layer 27c is fixed. In the example of FIG. 5, the magnetization direction of the ferromagnetic layer 27c is directed towards the ferromagnetic layer 27a. In this context, the expression "the magnetization direction is fixed" means that the magnetization direction is not changed by torque of the magnitude that reverses the magnetization direction of the ferromagnetic layer 27a. The ferromagnetic layer 27c contains at least one compound selected from cobalt platinum (CoPt), cobalt nickel (CoNi), and cobalt palladium (Coed).

The non-magnetic layer 27d is provided on the upper surface of the ferromagnetic layer 27c. The non-magnetic layer 27d is a non-magnetic conductive film. The non-magnetic layer 27d is used as a spacer layer. The non-magnetic layer 27d contains at least one element selected from ruthenium (Ru), osmium (Os), rhodium (Rh), iridium (Ir), vanadium (V), and chromium (Cr).

The ferromagnetic layer 27e is provided on the upper surface of the non-magnetic layer 27d. The ferromagnetic layer 27e is a conductive film having ferromagnetism. The ferromagnetic layer 27e is used as a shift cancelling layer. The ferromagnetic layer 27e has the easy magnetization axial direction in the direction perpendicular to the film surface (the Z direction). The ferromagnetic layer 27e includes, for example, at least one compound selected from cobalt platinum (CoPt), cobalt nickel (CoNi), and cobalt palladium (Coed).

The ferromagnetic layers 27c and 27e are antiferromagnetically coupled by the non-magnetic layer 27d. That is, the ferromagnetic layers 27c and 27e are coupled to have magnetization directions antiparallel to each other. Such a coupling structure of the ferromagnetic layer 27c, the non-magnetic layer 27d, and the ferromagnetic layer 27e is referred to as a Synthetic Anti-Ferromagnetic (SAF) structure. By the SAF structure, the ferromagnetic layer 27e can cancel the influence of the leakage magnetic field of the ferromagnetic layer 27c in the magnetization direction of the ferromagnetic layer 27a.

The magnetoresistance effect element MTJ can take either of the low resistance state or the high resistance state depending on whether the relative relationship of the magnetization direction of the storage layer SL and the reference layer RL is parallel or antiparallel. According to the first embodiment, without allowing the write current to flow through this magnetoresistance effect element MTJ, the magnetization direction of the storage layer SL to the magnetization direction of the reference layer RL is controlled. Specifically, a writing method using the spin orbit torque generated by allowing the current to flow through the wiring SOTL is employed.

When a write current Ic0 having a certain magnitude in the Y direction flows to the wiring SOTL, the relative relationship of the storage layer SL and the reference layer RL in the magnetization direction becomes parallel. In case of this parallel state, the resistance value of the magnetoresistance effect element MTJ is the lowest, and thus the magnetoresistance effect element MTJ is set to the low resistance state. This low resistance state is referred to as a "parallel (P) state" and, in this example, corresponds to a data value "0" state.

When a write current Ic1 larger than the write current Ic0 flows to the wiring SOTL in the direction opposite to the write current Ic0, the relative relationship of the storage layer SL and the reference layer RL in the magnetization direction becomes antiparallel. In this antiparallel state, the resistance value of the magnetoresistance effect element MTJ becomes the highest, and the magnetoresistance effect element MTJ is set to the high resistance state. This high resistance state is referred to as an "anti-parallel (AP) state" and, in this example, corresponds to the data value "1" state.

The following description is made according to the data value convention described above, but the present disclosure is not limited to this convention. For example, the P state may be the data value "1" state, and the AP state may be the data value "0" state.

1.1.4 Switching Element

The switching element SEL1 is switched from the off state to the on state mainly during the write operation. In contrast, the switching element SEL2 is switched from the off state to the on state mainly during the read operation. In this manner, with respect to the switching elements SEL1 and SEL2, the switching timings from the off state to the on state are different. Therefore, suitable current-voltage characteristics of the switching elements SEL1 and SEL2 are different from each other. Specifically, for example, the switching element SEL1 preferably has current-voltage characteristics with snapback. In contrast, the switching element SEL2 has preferably current-voltage characteristics without snapback.

Figure 6:
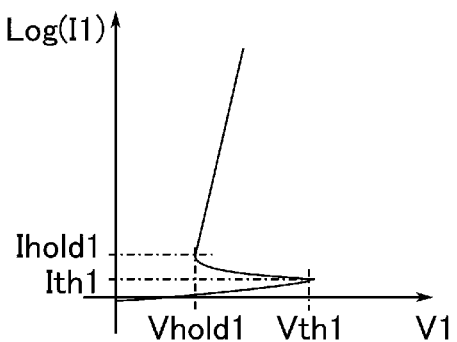
FIG. 6 is a diagram illustrating an example of the characteristics of a switching element of a magnetic memory device according to a first embodiment.
Figure 7:
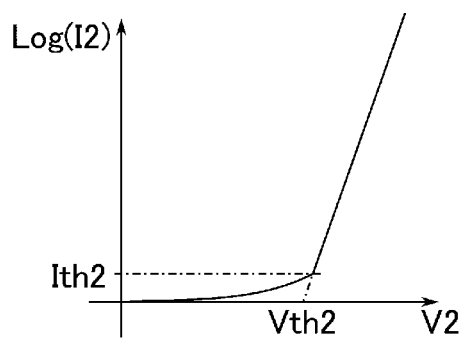
FIG. 7 is a diagram illustrating an example of the characteristics of a switching element of a magnetic memory device according to the first embodiment.

FIGS. 6 and 7 are diagrams illustrating an example of the characteristics of the switching element according to the first embodiment. FIG. 6 is an example of the current-voltage characteristics of the switching element SEL1 having the current-voltage characteristics with snapback. FIG. 7 is an example of the current-voltage characteristics of the switching element SEL2 having the current-voltage characteristics without snapback.

First, the current-voltage characteristics with snapback are described with reference to FIG. 6.

When the voltage applied to both ends of the switching element SEL1 (an applied voltage V1) becomes the threshold voltage Vth1 from 0 V, the current flowing through the switching element SEL1 (a current I1) becomes a threshold value current Ith1. The threshold value current Ith1 is about 1 μA, and is negligibly small. Therefore, in the range in which the applied voltage V1 is 0 V to the threshold voltage Vth1, the switching element SEL1 enters an off state.

When the current I1 exceeds the threshold value current Ith1, the switching element SEL1 enters an on state and simultaneously, snapback occurs. The snapback is a phenomenon in which the amount of voltage drop decreases from the threshold voltage Vth1, and the current larger than the threshold value current Ith1 flows. When the current I1 reaches a hold current Ihold1 (>Ith1), and the amount of voltage drop becomes a hold voltage Vhold1 (<Vth1) by the switching element SELL When the voltage reaches the hold voltage Vhold1 by snapback, the amount of voltage drop of the switching element SEL1 is in a state of being seldom changed by the increase of the current I1.

In this manner, in the switching element SEL1, the resistance when entering an on state becomes the hold voltage Vhold1 lower than the threshold voltage Vth1. Therefore, when the switching element SEL1 enters an on state, it is easy to allow the larger current to flow.

The current-voltage characteristics without snapback are described with reference to FIG. 7.

When the voltage (an applied voltage V2) applied to both ends of the switching element SEL2 becomes the threshold voltage Vth2 from 0 V, the current (a current I2) flowing through the switching element SEL2 becomes a threshold value current Ith2. The threshold value current Ith2 becomes about 1 μA and is negligibly small. Therefore, in the range of the applied voltage V2 from 0 V to the threshold voltage Vth2, the switching element SEL2 enters an off state.

When the current I2 exceeds the threshold value current Ith2, the switching element SEL2 enters an on state without occurrence of the snapback. Accordingly, the amount of voltage drop of the switching element SEL2 goes into a state of being seldom changed by the increase of the current I2.

In this manner, when the switching element SEL2 enters an on state, the amount of voltage drop is not instantaneously changed. Therefore, when the switching element SEL2 enters an on state, it is possible to prevent the instantaneous application of a high voltage to the element that is serially connected to the switching element SEL2 (for example, the magnetoresistance effect element MTJ).

1.2 Operation

Operations of the magnetic memory device according to the first embodiment are described.

1.2.1 Write Operation

Figure 8:
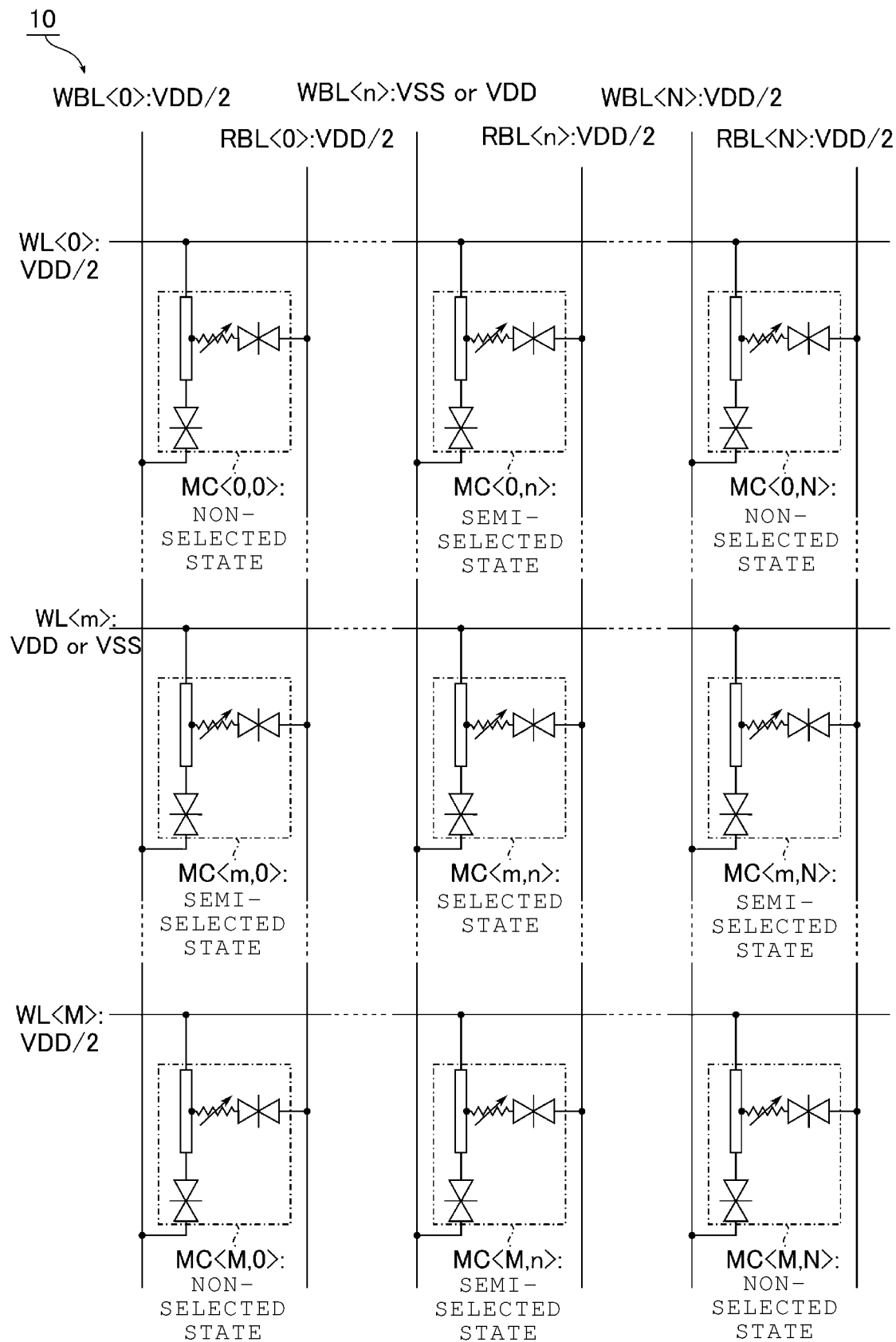
FIG. 8 is a circuit diagram related to a write operation in a magnetic memory device according to a first embodiment.

FIG. 8 is a circuit diagram illustrating an example of the write operation in the magnetic memory device according to the first embodiment. In the example of FIG. 8, a case where the data is written to the memory cell MC<m, n> (0<m<M, and 0<n<N) among the plurality of memory cells MC is illustrated.

When the data is written to the memory cell MC<m, n>, a voltage VDD or VSS is applied to each of a word line WL<m> and a write bit line WBL<n>. When the voltage VDD is applied to the word line WL<m>, the voltage VSS is applied to the write bit line WBL<n>. When the voltage VSS is applied to the word line WL<m>, the voltage VDD is applied to the write bit line WBL<n>. A voltage VDD/2 is applied to all of the word lines WL other than the word line WL<m>, all of the write bit lines WBL other than the write bit line WBL<n>, and all of the read bit lines RBL.

The voltage VSS is a reference potential. The voltage VSS is, for example, 0 V. The voltage VDD (the potential difference VDD) to the voltage VSS is a voltage that causes the switching elements SEL1 and SEL2 to enter an on state. The potential difference VDD is a voltage that can allow the current for changing the resistance state of the magnetoresistance effect element MTJ to flow. A potential difference VDD/2 is a voltage of causing the switching elements SEL1 and SEL2 to enter an off state.

Accordingly, the potential difference VDD occurs between the word line WL<m> and the write bit line WBL<n>. The potential difference VDD/2 is generated between the word line WL<m> and write bit lines WBL other than the write bit line WBL<n>. The potential difference VDD/2 occurs between the word line WL<m> and the read bit lines RBL.

The potential difference VDD/2 occurs between word lines WL other than the word line WL<m> and the write bit line WBL<n>.

The potential difference VDD/2 occurs between the write bit line WBL<n> and a read bit line RBL<n>.

Therefore, the switching element SEL1<m, n> enters an on state. The switching elements SEL1 except for the switching element SEL1<m, n> enter an off state. The switching elements SEL2<m, n> also enter an off state.

Consequently, it is possible to allow the current to flow through the wiring SOTL<m, n> without causing the current to flow through any of the wirings SOTL other than the wiring SOTL<m, n>.

In the write operation described above, the state of the memory cell MC<m, n> can be referred to as the selected state. The states of the memory cells MC<0, n> to MC<m−1, n>, MC<m+1, n> to MC<M, n>, MC<m, 0> to MC<m, n−1>, and MC<m, n+1> to MC<m, N> can be referred to as a semi-selected state. The state of the memory cells MC that are not in the selected state or the semi-selected state can be referred to as a non-selected state.

Figure 9:
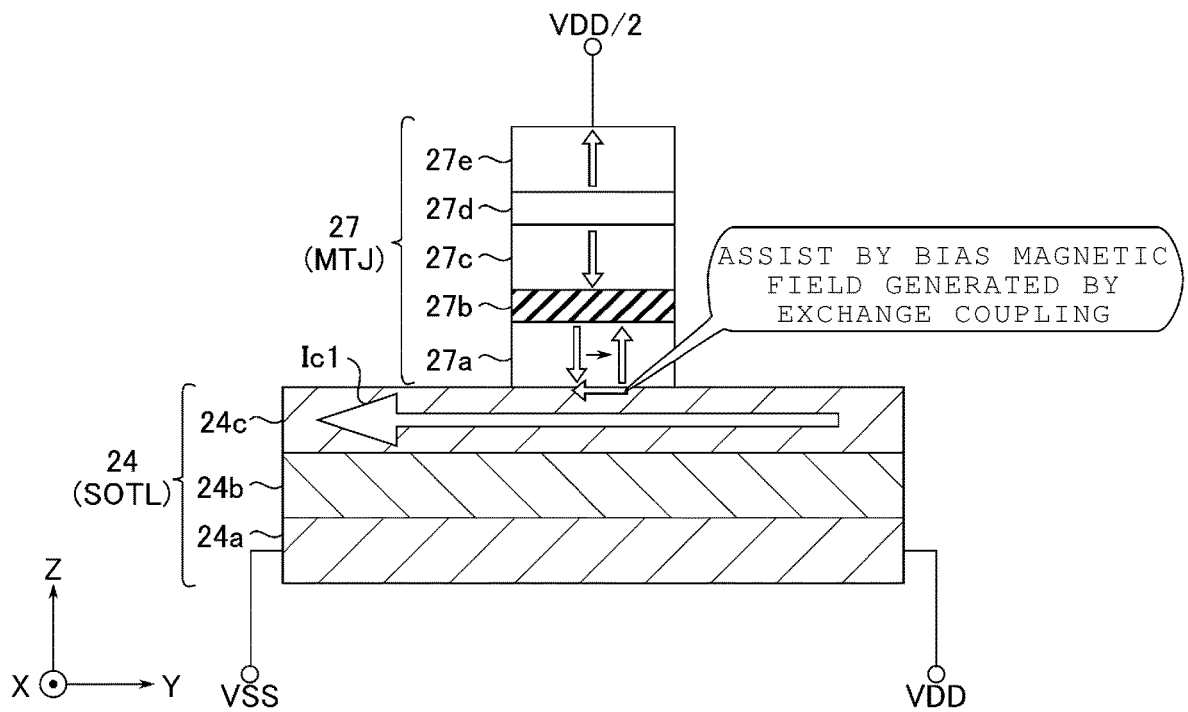
FIG. 9 is a cross-sectional view related to a write operation in a magnetic memory device according to a first embodiment.
Figure 10:
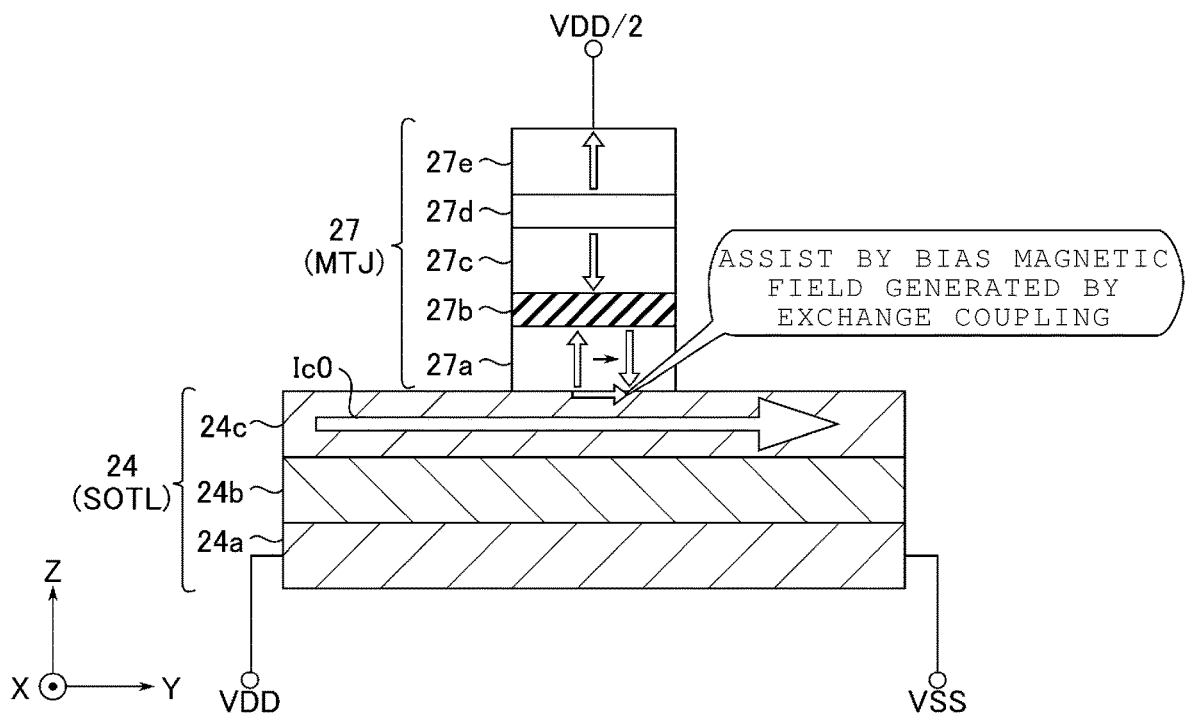
FIG. 10 is a cross-sectional view related to a write operation in a magnetic memory device according to a first embodiment.

FIGS. 9 and 10 are cross-sectional views illustrating examples of the write operation in the magnetic memory device according to the first embodiment. In FIGS. 9 and 10, the current flowing to the memory cells MC in the selected state and the magnetization direction of the magnetoresistance effect element MTJ are schematically illustrated. FIG. 9 corresponds to the write operation when the data "1" is written. FIG. 10 corresponds to the write operation when the data "0" is written.

First, the write operation of the data "1" is described with reference to FIG. 9. In the example of FIG. 9, a case where the write current Ic1 flows from the word lines WL on the right side toward the write bit lines WBL on the left side is illustrated.

As described above, the potential difference VDD that causes the switching element SEL1 to enter an on state occurs at both ends of the conductor layer 24. By controlling the potential difference VDD, the write current Ic1 flows into the conductor layer 24. By causing the write current Ic1 to flow into the conductor layer 24, particularly into the non-magnetic layer 24c, a spin orbit torque that causes the magnetization direction of the ferromagnetic layer 27a to be antiparallel to the magnetization direction of the ferromagnetic layer 27c is generated. The spin orbit torque is injected to the ferromagnetic layer 27a that is close to the non-magnetic layer 24c.

In addition, the magnetization direction of the ferromagnetic layer 24b matches the direction in which the write current Ic1 flows. Therefore, the bias magnetic field in the Y direction that is generated by the interlayer exchange coupling with the ferromagnetic layer 24b via the non-magnetic layer 24c is applied to the ferromagnetic layer 27a.

Accordingly, the magnetization direction of the ferromagnetic layer 27a is reversed in the direction antiparallel to the magnetization direction of the ferromagnetic layer 27c by the spin orbit torque and the assist by the bias magnetic field in the Y direction that is generated by the exchange coupling.

The write operation of the data "0" is described with reference to FIG. 10. In the example of FIG. 10, a case where the write current Ic0 flows from the write bit lines WBL (on the left side) toward the word lines WL (on the right side) is illustrated.

As described above, the potential difference VDD that causes the switching element SEL1 to enter an on state is generated at both ends of the conductor layer 24. By controlling the potential difference VDD, the write current Ic0 flows into the conductor layer 24. By the flow of the write current Ic0 into the conductor layer 24, particularly into the non-magnetic layer 24c, the spin orbit torque that causes the magnetization direction of the ferromagnetic layer 27a to be parallel to the magnetization direction of the ferromagnetic layer 27c is generated. The spin orbit torque is injected into the ferromagnetic layer 27a close to the non-magnetic layer 24c.

In addition, the magnetization direction of the ferromagnetic layer 24b matches the direction in which the write current Ic0 flows. Therefore, the bias magnetic field in the Y direction that is generated by the interlayer exchange coupling with the ferromagnetic layer 24b via the non-magnetic layer 24c is applied to the ferromagnetic layer 27a.

Accordingly, the magnetization direction of the ferromagnetic layer 27a is reversed to the direction parallel to the magnetization direction of the ferromagnetic layer 27c by the spin orbit torque and the assist by the bias magnetic field in the Y direction that is generated by the exchange coupling.

1.2.2 Read Operation

Figure 11:
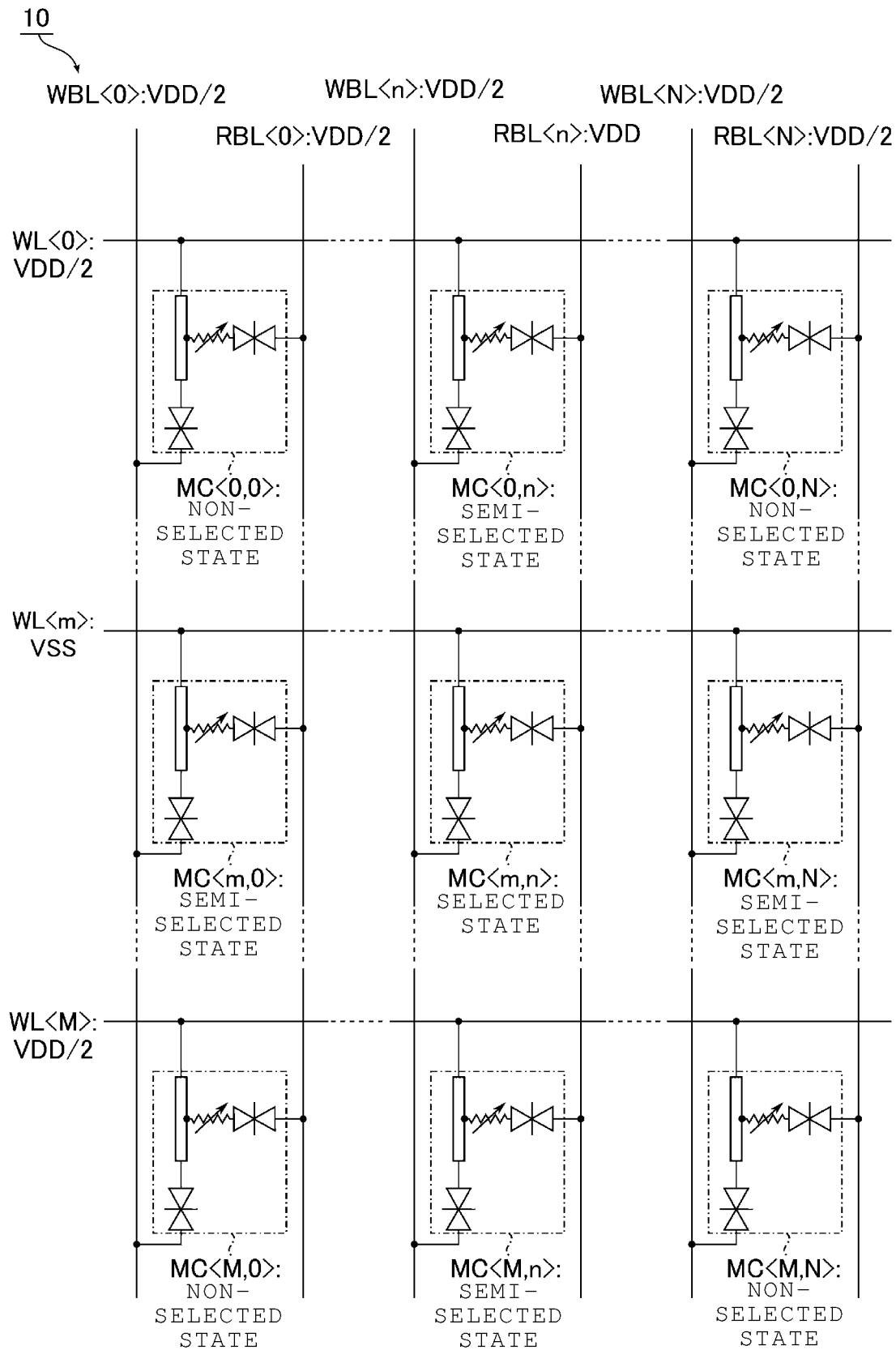
FIG. 11 is a circuit diagram related to a read operation in a magnetic memory device according to a first embodiment.

FIG. 11 is a circuit diagram illustrating an example of the read operation in the magnetic memory device according to the first embodiment. In the example of FIG. 11, as in the case of FIG. 8, a case where the data is read from the memory cell MC<m, n> is illustrated.

When the data is read from the memory cell MC<m, n>, the voltages VDD and VSS are applied to the read bit line RBL<n> and the word line WL<m>, respectively. The voltage VDD/2 is applied to all of the word lines WL other than the word line WL<m>, all of the read bit lines RBL other than the read bit line RBL<n>, and all of the write bit lines WBL.

Accordingly, the potential difference VDD is generated between the word line WL<m> and the read bit line RBL<n>. The potential difference VDD/2 occurs between the word line WL<m> and read bit lines RBL other than the read bit line RBL<n>. The potential difference VDD/2 occurs between the word line WL<m> and any write bit lines WBL.

The potential difference VDD/2 occurs between word lines WL other than the word line WL<m> and the read bit line RBL<n>.

The potential difference VDD/2 occurs between the write bit line WBL<n> and the read bit line RBL<n>. This potential difference does not occur between write bit lines WBL (other than the write bit line WBL<n>) and corresponding read bit lines RBL.

Therefore, the switching element SEL2<m, n> enters an on state. All of the switching elements SEL2 except for the switching element SEL2<m, n> enter an off state. All of the switching elements SEL1<m, n> enter an off state.

Consequently, it is possible to cause the current to flow through the magnetoresistance effect element MTJ<m, n> without causing the current to flow through any of the magnetoresistance effect elements MTJ other than the magnetoresistance effect element MTJ<m, n>.

In the read operation described above, the state of the memory cell MC<m, n> is also referred to as a selected state. The states of the memory cells MC<0, n> to MC<m−1, n>, MC<m+1, n> to MC<M, n>, MC<m, 0> to MC<m, n−1>, and MC<m, n+1> to MC<m, N> are referred to as a semi-selected state. The states of the memory cells MC that are not a selected state or a semi-selected state are referred to as a non-selected state.

Figure 12:
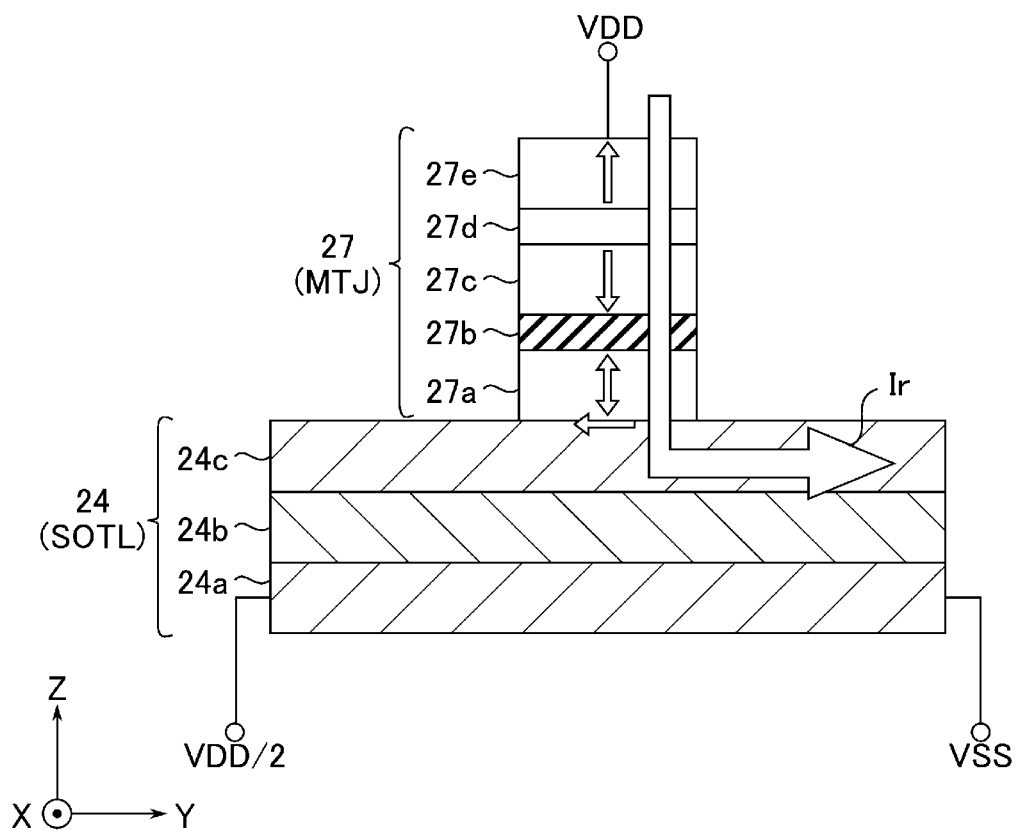
FIG. 12 is a cross-sectional view related to a read operation in a magnetic memory device according to a first embodiment.

FIG. 12 is a cross-sectional view illustrating an example of the read operation in the magnetic memory device according to the first embodiment. In FIG. 12, the current flowing to the memory cells MC in the selected state and the magnetization direction of the magnetoresistance effect element MTJ are schematically illustrated. In the example of FIG. 12, a case where a read current Ir flows from the magnetoresistance effect element MTJ toward the word lines WL is illustrated.

As described above, the potential difference VDD that causes the switching element SEL2 to enter an on state occurs at the upper end of the element layer 27 and the right end of the conductor layer 24. By controlling the potential difference VDD, the read current Ir flows from the upper end of the element layer 27 toward the right end of the conductor layer 24. The read current Ir flows into the element layer 27, and thus the read circuit 15 can determine whether the element layer 27 is in the high resistance state or the low resistance state based on the read current Ir. In addition, the read current Ir is controlled to be smaller than the write currents Ic0 and Ic1. Accordingly, the dielectric breakdown of the non-magnetic layer 27b can be prevented.

1.3. Effect According to First Embodiment

According to the first embodiment, the wiring SOTL includes a first portion connected to the word line WL, a second portion connected to the write bit line WBL, and a third portion connected to the read bit line RBL. The magnetoresistance effect element MTJ is connected between the third portion of the wiring SOTL and the read bit line RBL. The switching element SEL1 is connected between the second portion of the wiring SOTL and the write bit line WBL. The switching element SEL2 is connected between the magnetoresistance effect element MTJ and the read bit line RBL. Each of the switching elements SEL1 and SEL2 is a two-terminal-type switching element. Accordingly, without using a transistor or the like that is a three-terminaltype switching element, the memory cell MC to which a writing method using the spin orbit torque is applied can be formed.

Specifically, in a plan view, the wiring SOTL has a rectangular shape extending in the Y direction. The switching element SEL1 overlaps with the second portion of the wiring SOTL in the Z direction. The magnetoresistance effect element MTJ and the switching element SEL1 are stacked in this order so as to be overlapped with the third portion of the wiring SOTL in the Z direction. Therefore, the size of the memory cell can be reduced compared with the case where the memory cell includes the three-terminal-type switching element.

The switching element SEL1 has the current-voltage characteristics with snapback. Accordingly, compared with a case where the switching element having the current-voltage characteristics without snapback is used for the switching element SEL1, it is easy to allow a larger write current to flow in the memory cell MC in the selected state during the write operation. Therefore, the load of the write operation can be reduced.

The switching element SEL2 has current-voltage characteristics without snapback. Accordingly, compared to a case where the switching element having the current-voltage characteristics with snapback is used for the switching element SEL2, the unintentional application of the high voltage to the magnetoresistance effect element MTJ during the read operation can be prevented. Therefore, the deterioration of the endurance of the magnetoresistance effect element MTJ can be prevented.

The conductor layer 24 functioning as the wiring SOTL includes the ferromagnetic layer 24b and the non-magnetic layer 24c. The non-magnetic layer 24c is provided between the ferromagnetic layer 24b and the ferromagnetic layer 27a functioning as the storage layer SL. The non-magnetic layer 24c contains at least one element selected from platinum (Pt), palladium (Pd), gold (Au), and silver (Ag). Accordingly, the non-magnetic layer 24c can perform interlayer exchange coupling on the ferromagnetic layers 24b and 27a. Therefore, the bias magnetic field along the write current direction can be applied to the ferromagnetic layer 27a. In addition, by allowing the write current to flow to the non-magnetic layer 24c, the non-magnetic layer 24c can inject the spin orbit torque to the ferromagnetic layer 27a. Consequently, even when the magnetization direction of the magnetoresistance effect element MTJ is perpendicular to the film surface, without applying the external magnetic field and without allowing the write current to flow to the magnetoresistance effect element MTJ, the magnetization direction of the ferromagnetic layer 27a can be reversed.

1.4 Modification

The first embodiment is not limited to the example described above, and various modifications can be applied.

1.4.1 First Modification

In the first embodiment described above, a case where the magnetization direction of the storage layer SL is reversed without allowing the write current to flow into the magnetoresistance effect element MTJ is described, but the embodiment is not limited thereto. For example, the magnetic memory device may be operated to assist the reversion of the magnetization direction of the storage layer SL by allowing the write current to flow to the magnetoresistance effect element MTJ. In the following description, the configurations and the operations different from those in the first embodiment are mainly described. The description of the configurations and the operations that are the same as those in the first embodiment may be omitted.

1.4.1.1 Magnetoresistance Effect Element and Peripheral Wiring

Figure 13:
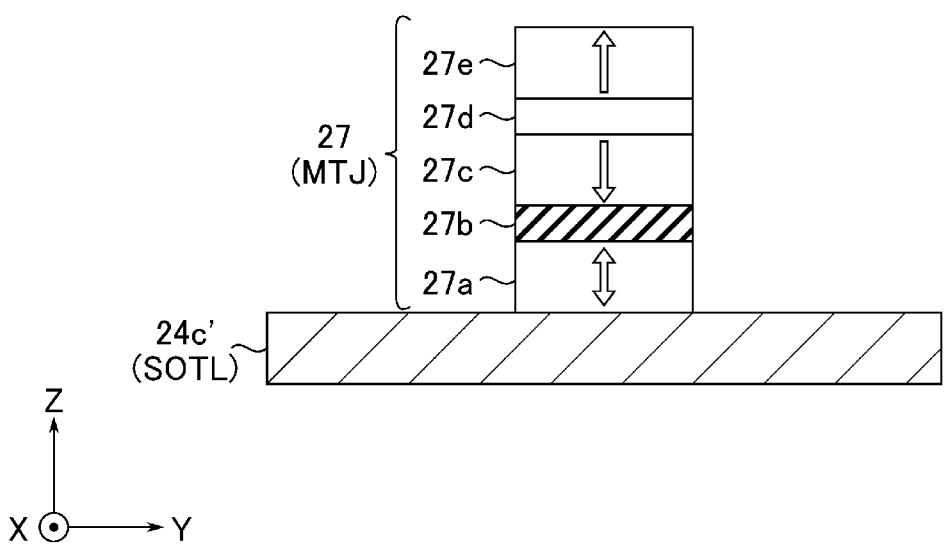
FIG. 13 is a cross-sectional view of a magnetoresistance effect element and a peripheral wiring according to a first modification of a first embodiment.

FIG. 13 is a cross-sectional view illustrating an example of cross-sectional structures of a magnetoresistance effect element and a peripheral wiring according to a first modification of the first embodiment. FIG. 13 corresponds to FIG. 5 in the first embodiment. In the first modification of the first embodiment, the conductor layer 24 includes a non-magnetic layer 24c' instead of the antiferromagnetic layer 24a, the ferromagnetic layer 24b, and the non-magnetic layer 24c.

The non-magnetic layer 24c' is a non-magnetic heavy metal conductive film. The non-magnetic layer 24c' generates the spin orbit torque by the current flowing through the non-magnetic layer 24c'. The generated spin orbit torque is injected into the ferromagnetic layer 27a. The non-magnetic layer 24c' contains, for example, at least one element selected from platinum (Pt), palladium (Pd), gold (Au), silver (Ag), hafnium (Hf), tantalum (Ta), and tungsten (W). The non-magnetic layer 24c' may be an alloy including at least one element selected from platinum (Pt), palladium (Pd), gold (Au), silver (Ag), hafnium (Hf), tantalum (Ta), and tungsten (W). The non-magnetic layer 24c' may further contain boron (B), carbon (C), arsenic (As), antimony (Sb), and bismuth (Bi).

The element layer 27 is provided on the upper surface of the non-magnetic layer 24c'. The configuration of the element layer 27 is the same as that of the element layer 27 in the first embodiment.

1.4.1.2 Write Operation

Figure 14:
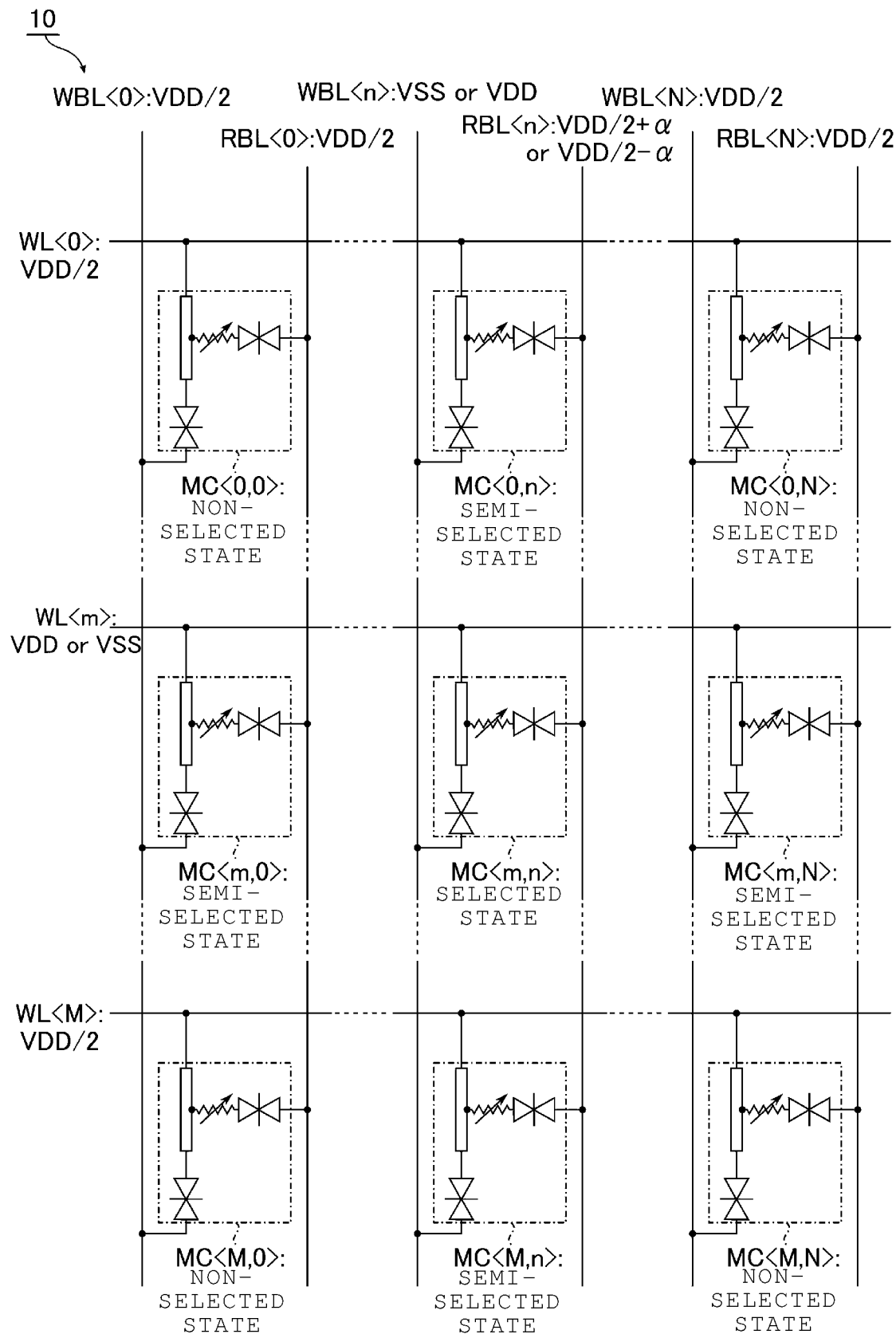
FIG. 14 is a circuit diagram related to a write operation in a magnetic memory device according to a first modification of a first embodiment.

FIG. 14 is a circuit diagram illustrating an example of the write operation in the magnetic memory device according to the first modification of the first embodiment. FIG. 14 corresponds to FIG. 8 according to the first embodiment.

When data is written to the memory cell MC<m, n>, the voltage VDD or VSS is applied to each of the word line WL<m> and the write bit line WBL<n>. The voltage VDD/2+α or VDD/2−α is applied to the read bit line RBL<n>. When the voltage VDD is applied to the word line WL<m>, the voltage VSS and VDD/2+α are applied to the write bit line WBL<n> and the read bit line RBL<n>, respectively. When the voltage VSS is applied to the word line WL<m>, the voltages VDD and VDD/2−α are applied to the write bit line WBL<n> and the read bit line RBL<n>, respectively. The voltage VDD/2 is applied to all of the word lines WL other than the word line WL<m>, all of the write bit lines WBL other than the write bit line WBL<n>, and all of the read bit lines RBL other than the read bit line RBL<n>.

The potential difference VDD/2+α is a voltage that causes the switching elements SEL1 and SEL2 to enter an on state. The potential difference VDD/2−α is a voltage that causes the switching elements SEL1 and SEL2 to enter an off state. A potential difference α is a voltage that causes the switching elements SEL1 and SEL2 to enter an off state.

The potential difference VDD occurs between the word line WL<m> and the write bit line WBL<n>. The potential difference VDD/2−α occurs between the word line WL<m> and the read bit line RBL<n>. The potential difference VDD/2 occurs between the word line WL<m> and write bit lines WBL other than the write bit line WBL<n>. The potential difference VDD/2 occurs between the word line WL<m> and read bit lines RBL other than the read bit line RBL<n>.

The potential difference VDD/2 occurs between word lines WL other than the word line WL<m> and the write bit line WBL<n>. The potential difference α occurs between word lines WL other than the word line WL<m> and the read bit line RBL<n>.

The potential difference VDD/2+α occurs between the write bit line WBL<n> and the read bit line RBL<n>.

Therefore, the switching elements SEL1<m, n> and SEL2<m, n> enters an on state. All of the switching elements SEL1 other than the switching element SEL1<m, n> enter an off state. All of the switching elements SEL2<m, n> enter an off state.

Consequently, it is possible to allow the current to flow to the wiring SOTL<m, n> and the magnetoresistance effect element MTJ<m, n> without allowing the current to flow through any of the wirings SOTL other than the wiring SOTL<m, n> or any the magnetoresistance effect elements MTJ other than the magnetoresistance effect element MTJ<m, n>.

Figure 15:
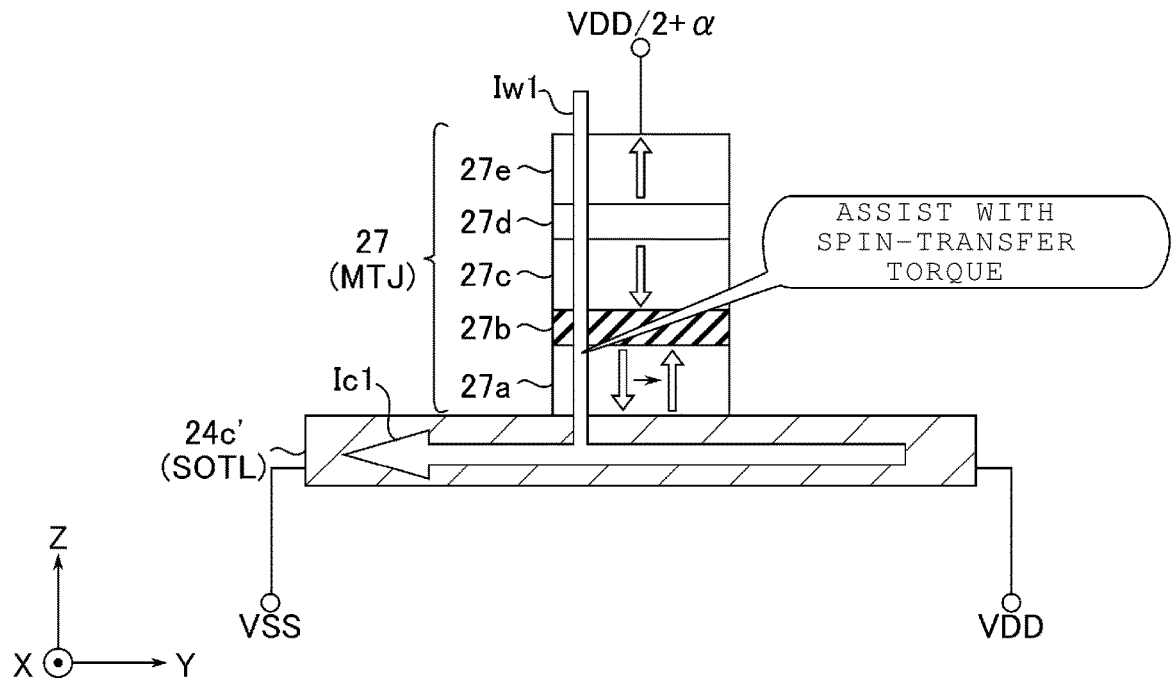
FIG. 15 is a circuit diagram related to a write operation in a magnetic memory device according to a first modification of a first embodiment.
Figure 16:
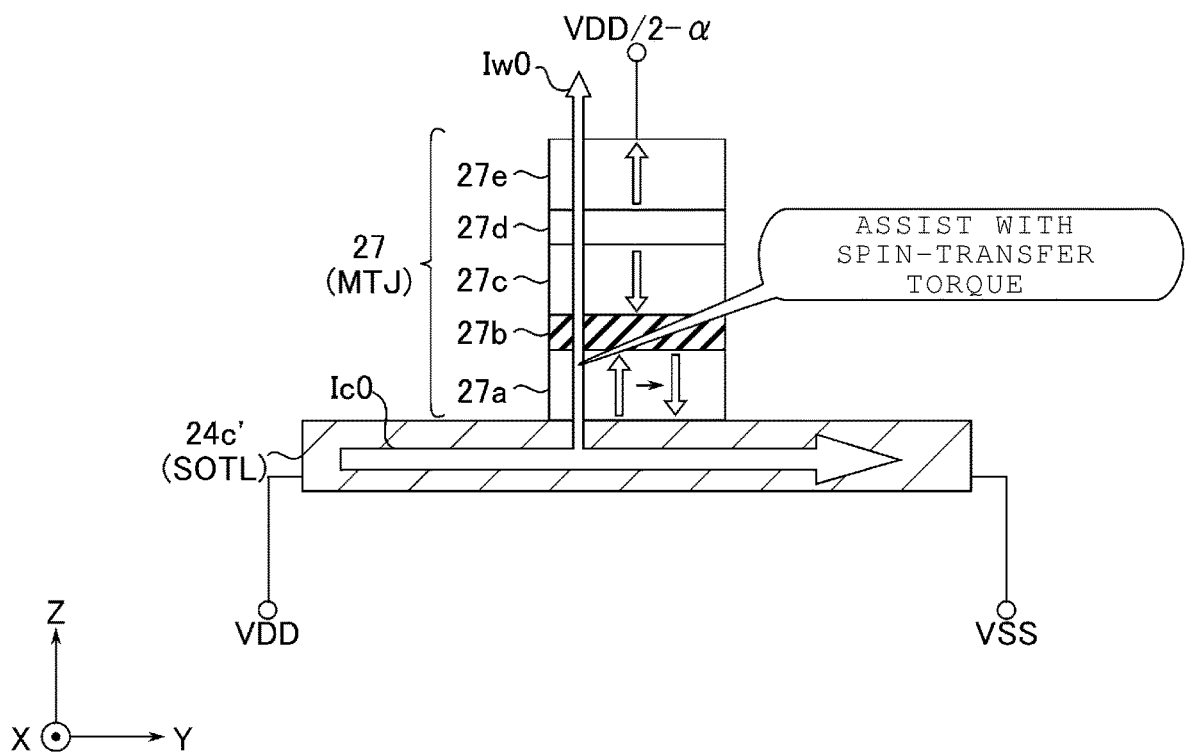
FIG. 16 is a cross-sectional view related to a write operation in a magnetic memory device according to a first modification of a first embodiment.

FIGS. 15 and 16 are cross-sectional views illustrating examples of the write operation in the magnetic memory device according to the first modification of the first embodiment. FIGS. 15 and 16 correspond to FIGS. 9 and 10 according to the first embodiment, respectively.

First, the write operation of the data "1" is described with reference to FIG. 15. In the example of FIG. 15, a case where the write current Ic1 flows from the word lines WL (on the right side) toward the write bit lines WBL (on the left side), and a current Iw1 flows from the magnetoresistance effect element MTJ toward the write bit lines WBL is illustrated.

As described above, the potential difference VDD that causes the switching element SEL1 to enter an on state occurs at both ends of the conductor layer 24. By controlling the potential difference VDD, the write current Ic1 flows into the conductor layer 24. Due to the flow of the write current Ic1 into the non-magnetic layer 24c' in the conductor layer 24, the spin orbit torque that causes the magnetization direction of the ferromagnetic layer 27a to be antiparallel to the magnetization direction of the ferromagnetic layer 27c is generated. The spin orbit torque is injected into the ferromagnetic layer 27a that is close to the non-magnetic layer 24c'.

In addition, the potential difference VDD/2+α that causes the switching element SEL2 to enter an on state occurs at the upper end of the element layer 27 and the left end of the conductor layer 24. By controlling the potential difference VDD/2+α, the current Iw1 flows from the upper end of the element layer 27 toward the left end of the conductor layer 24. Due to the flow of the current Iw1 into the element layer 27, the spin transfer torque that causes the magnetization direction of the ferromagnetic layer 27a to be antiparallel to the magnetization direction of the ferromagnetic layer 27c is generated.

Accordingly, the magnetization direction of the ferromagnetic layer 27a is reversed in the direction antiparallel to the magnetization direction of the ferromagnetic layer 27c by the spin orbit torque and the assist by the spin transfer torque.

The current Iw1 is controlled to a value smaller than the write current Ic1 and larger than the read current Ir (Ir<Iw1<Ic1). Accordingly, the dielectric breakdown of the non-magnetic layer 27b is prevented, and the magnetization direction of the ferromagnetic layer 27a can be effectively reversed.

The write operation of the data "0" is described with reference to FIG. 16. In the example of FIG. 16, a case where the write current Ic0 flows from the write bit lines WBL (on the left side) toward the word lines WL (on the right side), and a current Iw0 smaller than the current Iw1 flows from the write bit lines WBL toward the magnetoresistance effect element MTJ is illustrated.

As described above, the potential difference VDD that causes the switching element SEL1 to enter an on state occurs at both ends of the conductor layer 24. By controlling the potential difference VDD, the write current Ic0 flows into the conductor layer 24. Due to the flow of the write current Ic0 into the non-magnetic layer 24c' in the conductor layer 24, the spin orbit torque that causes the magnetization direction of the ferromagnetic layer 27a to be parallel to the magnetization direction of the ferromagnetic layer 27c is generated. The spin orbit torque is injected into the ferromagnetic layer 27a that is close to the non-magnetic layer 24c'.

In addition, the potential difference VDD/2+α that causes the switching element SEL2 to enter an on state occurs at the upper end of the element layer 27 and the left end of the conductor layer 24. By controlling the potential difference VDD/2+α, the current Iw0 flows from the left end of the conductor layer 24 toward the upper end of the element layer 27. Due to the flow of the current Iw0 into the element layer 27, the spin transfer torque that causes the magnetization direction of the ferromagnetic layer 27a to be parallel to the magnetization direction of the ferromagnetic layer 27c is generated.

Accordingly, the magnetization direction of the ferromagnetic layer 27a is reversed in the direction parallel to the magnetization direction of the ferromagnetic layer 27c by the spin orbit torque and the assist by the spin transfer torque.

The current Iw0 is controlled to a value smaller than the write current Ic0 and larger than the read current Ir (Ir<Iw0<Ic0). Accordingly, the dielectric breakdown of the non-magnetic layer 27b is prevented, and the magnetization direction of the ferromagnetic layer 27a can be effectively reversed.

1.4.1.3 Effect According to First Modification of First Embodiment

According to the first modification of the first embodiment, the non-magnetic layer 24c' may be, for example, an alloy containing at least one element selected from platinum (Pt), palladium (Pd), gold (Au), silver (Ag), hafnium (Hf), tantalum (Ta), and tungsten (W), and can further contain, for example, boron (B), carbon (C), arsenic (As), antimony (Sb), and bismuth (Bi). Accordingly, the non-magnetic layer 24c' can inject a larger spin orbit torque into the ferromagnetic layer 27a.

In the write operation, the magnetic memory device 1 is configured to allow the current Iw to flow to the magnetoresistance effect element MTJ in the selected state. Accordingly, the magnetoresistance effect element MTJ can generate the spin transfer torque. Therefore, even when the magnetization direction of the magnetoresistance effect element MTJ is perpendicular to the film surface, the magnetization direction of the ferromagnetic layer 27a can be reversed without applying the external magnetic field.

1.4.2 Second Modification

In the first embodiment and the first modification of the first embodiment described above, cases respectively using the bias magnetic field by the interlayer exchange coupling and the spin transfer torque for the assist of the spin orbit torque are described, but the embodiment is not limited thereto. For example, the magnetic memory device may use the magnetic field generated by the current in order to assist the spin orbit torque. In the following description, the configurations and the operations different from those in the first embodiment or the first modification of the first embodiment are mainly described. The description of the configurations and the operations that are the same as those in the first embodiment or the first modification of the first embodiment may be appropriately omitted.

1.4.2.1 Magnetoresistance Effect Element and Peripheral Wiring

FIG. 17 is a cross-sectional view illustrating an example of cross-sectional structures of the magnetoresistance effect element and the peripheral wiring according to a second modification of the first embodiment. FIG. 17 corresponds to FIG. 13 according to the first modification of the first embodiment. In the second modification of the first embodiment, the memory cell array 10 further includes a conductor layer 30. The configurations of the conductor layer 24 and the element layer 27 are the same as those of the conductor layer 24 and the element layer 27 according to the first modification of the first embodiment.

The conductor layer 30 is provided under the non-magnetic layer 24c'. The conductor layer 30 is a conductive film for generating a magnetic field to be applied to the magnetoresistance effect element MTJ. The conductor layer 30 extends in a direction orthogonal to the long side direction of the conductor layer 24 (the X direction). The conductor layer 30 is electrically insulated, for example, from all the other configurations in the memory cell MC (the conductor layers 21, 23, 24, 25, 26, and 29, and the element layers 22, 27, and 28). The conductor layer 30 is configured to be able to allow the current to flow from the first end toward the second end along the X direction.

In the example of FIG. 17, a case where the conductor layer 30 is provided under the non-magnetic layer 24c' is illustrated, but the embodiment is not limited thereto. For example, the conductor layer 30 may be provided above the non-magnetic layer 24c' (for example, above the conductor layer 29).

1.4.2.2 Write Operation

The voltages applied to various wirings in the memory cell MC during the write operation in the magnetic memory device according to the second modification of the first embodiment is the same as those in the case of FIG. 8 according to the first embodiment.

Figure 19:
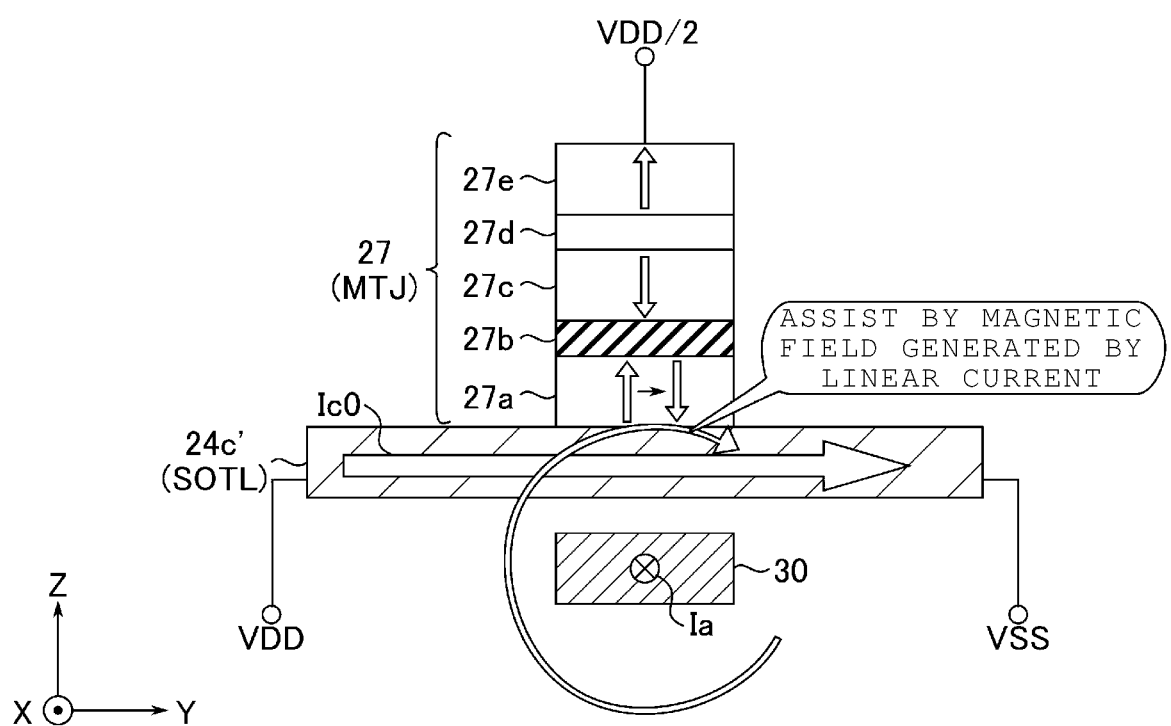
FIG. 19 is a cross-sectional view related to a write operation in a magnetic memory device according to a second modification of a first embodiment.

FIGS. 18 and 19 are cross-sectional views illustrating examples of the write operation in the magnetic memory device according to the second modification of the first embodiment. FIGS. 18 and 19 correspond to FIGS. 9 and 10 according to the first embodiment.

First, the write operation of the data "1" is described with reference to FIG. 18. In the example of FIG. 18, a case where the write current Ic1 flows from the word lines WL (on the right side) toward the write bit lines WBL (on the left side) and a current Ia flows in the +X direction (out-of-page direction) in the conductor layer 30 is illustrated.

As described above, the potential difference VDD that causes the switching element SEL1 to enter an on state occurs at both ends of the conductor layer 24. By controlling the potential difference VDD, the write current Ic1 flows into the conductor layer 24. Due to the flow of the write current Ic1 into the non-magnetic layer 24c' in the conductor layer 24, the spin orbit torque that causes the magnetization direction of the ferromagnetic layer 27a to be antiparallel to the magnetization direction of the ferromagnetic layer 27c is generated. The spin orbit torque is injected into the ferromagnetic layer 27a that is close to the non-magnetic layer 24c'.

In addition, the current Ia flows into the conductor layer 30. Since the current Ia is a linear current flowing in the X direction, a circular magnetic field centered on the current Ia in the YZ plane is generated. The direction of the corresponding circular magnetic field is directed to the −Y direction in the portion intersecting with the ferromagnetic layer 27a.

Accordingly, the magnetization direction of the ferromagnetic layer 27a is reversed in the direction antiparallel to the magnetization direction of the ferromagnetic layer 27c by the spin orbit torque and the assist by the magnetic field generated by the current Ia.

The write operation of the data "0" is described with reference to FIG. 19. In the example of FIG. 19, a case where the write current Ic0 flows from the write bit lines WBL (on the left side) toward the word lines WL (on the right side), and a current Ia flows in the −X direction (into the page) in the conductor layer 30 is illustrated.

As described above, the potential difference VDD that causes the switching element SEL1 to enter an on state occurs at both ends of the conductor layer 24. By controlling the potential difference VDD, the write current Ic0 flows into the conductor layer 24. Due to the flow of the write current Ic0 into the non-magnetic layer 24c' in the conductor layer 24, the spin orbit torque that causes the magnetization direction of the ferromagnetic layer 27a to be parallel to the magnetization direction of the ferromagnetic layer 27c is generated. The spin orbit torque is injected into the ferromagnetic layer 27a that is close to the non-magnetic layer 24c'.

In addition, the current Ia flows into the conductor layer 30. Since the current Ia is a linear current flowing in the −X direction, a circular magnetic field centered on the current Ia in the YZ plane is generated. The direction of the corresponding circular magnetic field is directed to the Y direction in the portion intersecting with the ferromagnetic layer 27a.

Accordingly, the magnetization direction of the ferromagnetic layer 27a is reversed in the direction parallel to the magnetization direction of the ferromagnetic layer 27c by the spin orbit torque and the assist by the magnetic field generated by the current Ia.

1.4.2.3 Effect According to Second Modification of First Embodiment

According to the second modification of the first embodiment, the conductor layer 30 extends in the direction orthogonal to the wiring SOTL. The magnetic memory device 1 is configured to allow the current Ia to flow to the conductor layer 30 during the write operation. Accordingly, the conductor layer 30 can apply the magnetic field parallel to the write current to the ferromagnetic layer 27a. Therefore, even when the magnetization direction of the magnetoresistance effect element MTJ is perpendicular to the film surface, the magnetization direction of the ferromagnetic layer 27a can be reversed without applying the external magnetic field nor without allowing the write current to flow to the magnetoresistance effect element MTJ.

In the second modification of the first embodiment, a case where the magnetization direction of the magnetoresistance effect element MTJ is perpendicular to the film surface is described, but the embodiment is not limited thereto. For example, the magnetization direction of the magnetoresistance effect element MTJ may be parallel to the film surface. Specifically, when the magnetization direction of the magnetoresistance effect element MTJ is directed to the X direction, the assist corresponding to the external magnetic field in the Z direction is required for reversing the magnetization direction of the ferromagnetic layer 27a without allowing the write current to flow to the magnetoresistance effect element MTJ. In this case, the conductor layer 30 is provided, for example, so as to be aligned with the magnetoresistance effect elements MTJ in the Y direction. Accordingly, the direction of the magnetic field generated by the current Ia can be caused to be directed to the Z direction in the portion intersecting with the ferromagnetic layer 27a. Therefore, even when the magnetization direction of the magnetoresistance effect element MTJ is parallel to the film surface, the magnetization direction of the ferromagnetic layer 27a can be reversed without applying the external magnetic field nor without allowing the write current to flow to the magnetoresistance effect element MTJ.

1.4.3 Third Modification of First Embodiment

In the first embodiment and the first modification and the second modification of the first embodiment described above, a case where the magnetoresistance effect element MTJ has the magnetization direction perpendicular to the film surface is described, but the embodiment is not limited thereto. For example, the magnetoresistance effect element may have the magnetization direction parallel to the film surface. In the following description, the configurations and the operations different from those in the first embodiment and the first modification and the second modification of the first embodiment are mainly described. The description of the configurations and the operations that are the same as those in the first embodiment and the first modification and the second modification of the first embodiment may be appropriately omitted.

1.4.3.1 Planar Layout of Memory Cell Array

Figure 20:
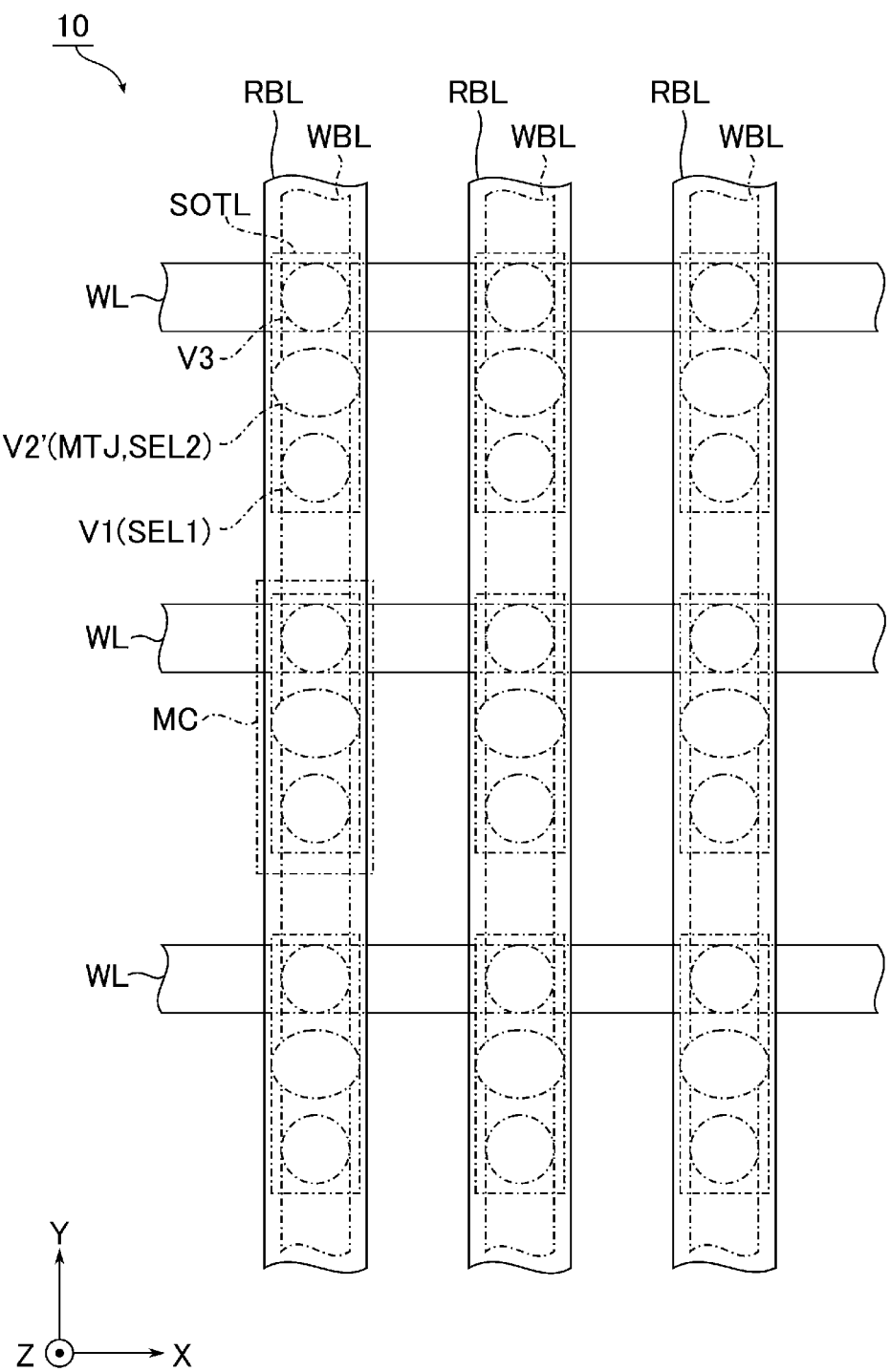
FIG. 20 is a plan view of a memory cell array according to a third modification of the first embodiment.

FIG. 20 is a plan view illustrating an example of a planar layout of a memory cell array according to a third modification of the first embodiment. FIG. 20 corresponds to FIG. 3 in the first embodiment.

The memory cell array 10 includes a plurality of vertical structures V2' instead of the plurality of vertical structures V2. Each of the vertical structures V2' includes the magnetoresistance effect element MTJ and the switching element SEL2.

The vertical structures V2' extend in the Z direction. In a plan view, the vertical structures V2' each have an oval shape. The vertical structures V2' are disposed so that the long axis direction of the oval shape is parallel to the short side direction of the wiring SOTL (that is, the X direction).

Each of the vertical structures V2' is connected between one corresponding read bit line RBL and one corresponding wiring SOTL.

1.4.3.2 Magnetoresistance Effect Element and Peripheral Wiring

Figure 21:
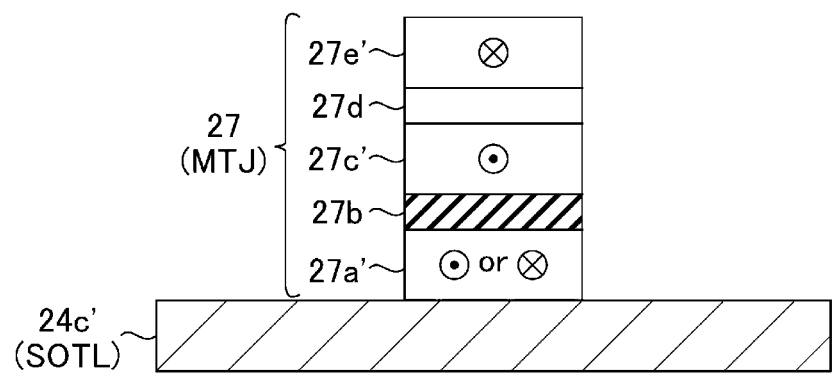
FIG. 21 is a cross-sectional view of a magnetoresistance effect element and a peripheral wiring according to a third modification of a first embodiment.

FIG. 21 is a cross-sectional view illustrating an example of the cross-sectional structures of the magnetoresistance effect elements and the peripheral wiring according to the third modification of the first embodiment. FIG. 21 corresponds to FIG. 13 according to the first modification of the first embodiment. The configuration of the conductor layer 24 according to the third modification of the first embodiment is the same as that of the conductor layer 24 including the non-magnetic layer 24c' according to the first modification of the first embodiment. The element layer 27 includes a ferromagnetic layer 27a', the non-magnetic layer 27b, a ferromagnetic layer 27c', the non-magnetic layer 27d, and a ferromagnetic layer 27e'.

The ferromagnetic layer 27a' is provided on the upper surface of the non-magnetic layer 24c'. The non-magnetic layer 27b is provided on the upper surface of the ferromagnetic layer 27a'. The ferromagnetic layer 27c' is provided on the upper surface of the non-magnetic layer 27b. The non-magnetic layer 27d is provided on the upper surface of the ferromagnetic layer 27c'. The ferromagnetic layer 27e' is provided on the upper surface of the non-magnetic layer 27d.

The ferromagnetic layers 27a', 27c', and 27e' are respectively the same as the ferromagnetic layers 27a, 27c, and 27e according to the first embodiment except ferromagnetic layers 27a', 27c', and 27e' have the easy magnetization axial direction in the long axis direction of the oval shape of the vertical structure V2' in a plan view (the X direction). In the example of FIG. 21, the ferromagnetic layer 27a' has the magnetization direction in the +X direction (out of the page) or the −X direction (into the page). The ferromagnetic layer 27c' has the magnetization direction in the +X direction. The ferromagnetic layer 27e' has the magnetization direction in the −X direction. That is, the element layer 27 functions as an in-plane magnetization type magnetoresistance effect element MTJ.

1.4.3.3 Write Operation

The voltage applied to various wirings in the memory cell MC during the write operation in the magnetic memory device according to the third modification of the first embodiment is the same as those in the case of FIG. 8 according to the first embodiment.

Figure 22:
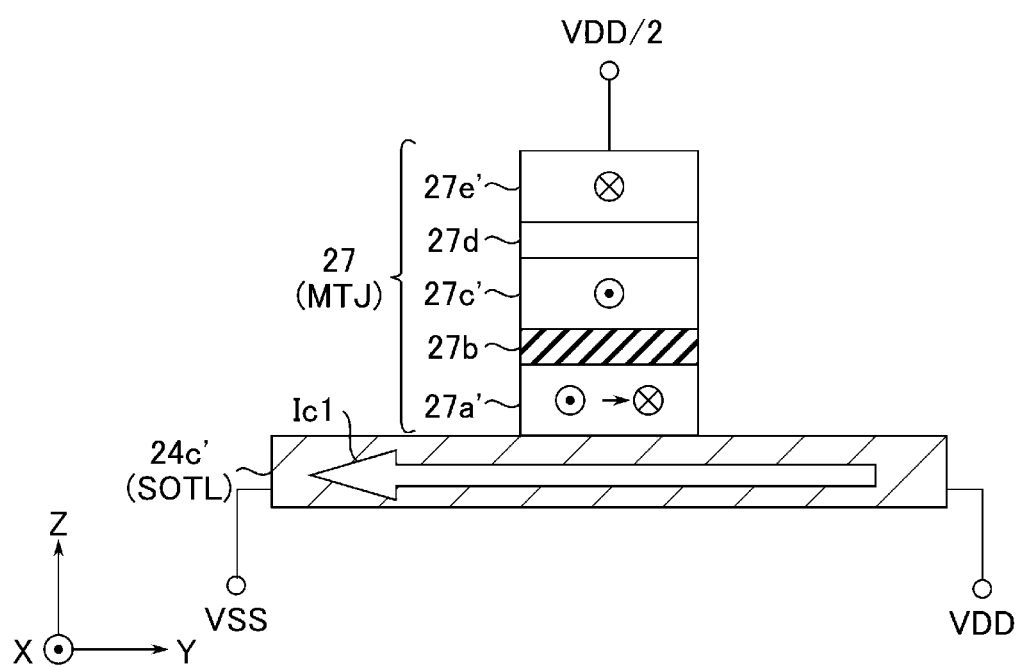
FIG. 22 is a circuit diagram related to a write operation in a magnetic memory device according to a third modification of a first embodiment.
Figure 23:
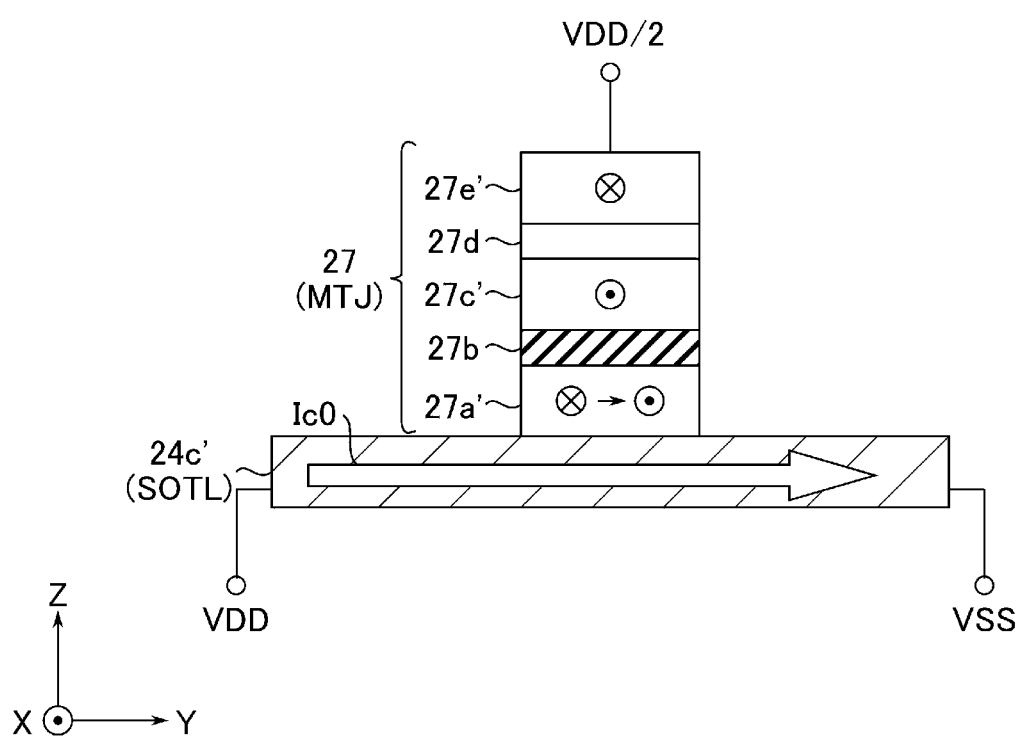
FIG. 23 is a cross-sectional view related to a write operation in a magnetic memory device according to a third modification of a first embodiment.

FIGS. 22 and 23 are cross-sectional views illustrating examples of the write operation in the magnetic memory device according to the third modification of the first embodiment. FIGS. 22 and 23 correspond to FIGS. 9 and 10 according to the first embodiment, respectively.

First, the write operation of the data "1" is described with reference to FIG. 22. In the example of FIG. 22, a case where the write current Ic1 flows from the word line WL (on the right side) toward the write bit line WBL (on the left side) is illustrated.

As described above, the potential difference VDD that causes the switching element SEL1 to enter an on state occurs at both ends of the conductor layer 24. By controlling the potential difference VDD, the write current Ic1 flows into the conductor layer 24. Due to the flow of the write current Ic1 into the non-magnetic layer 24c' in the conductor layer 24, the spin orbit torque that causes the magnetization direction of the ferromagnetic layer 27a to be antiparallel to the magnetization direction of the ferromagnetic layer 27c is generated. The spin orbit torque is injected into the ferromagnetic layer 27a that is close to the non-magnetic layer 24c'.

Accordingly, the magnetization direction of the ferromagnetic layer 27a is reversed in the direction antiparallel to the magnetization direction of the ferromagnetic layer 27c by the spin orbit torque.

The write operation of the data "0" is described with reference to FIG. 23. In the example of FIG. 23, a case where the write current Ic0 flows from the write bit lines WBL (on the left side) toward the word lines WL (on the right side) is illustrated.

As described above, the potential difference VDD that causes the switching element SEL1 to enter an on state occurs at both ends of the conductor layer 24. By controlling the potential difference VDD, the write current Ic0 flows into the conductor layer 24. Due to the flow of the write current Ic0 into the non-magnetic layer 24c' in the conductor layer 24, the spin orbit torque that causes the magnetization direction of the ferromagnetic layer 27a to be parallel to the magnetization direction of the ferromagnetic layer 27c is generated. The spin orbit torque is injected into the ferromagnetic layer 27a that is close to the non-magnetic layer 24c'.

Accordingly, the magnetization direction of the ferromagnetic layer 27a is reversed in the direction parallel to the magnetization direction of the ferromagnetic layer 27c by the spin orbit torque.

1.4.3.4 Effect According to Third Modification of First Embodiment

According to the third modification of the first embodiment, the vertical structure V2' including the element layer 27 has an oval shape in a plan view. The long axis direction in the oval shape is parallel to the short side direction of the wiring SOTL (the X direction). Accordingly, the magnetoresistance effect element MTJ is configured to have the easy magnetization axial direction in the X direction. Therefore, the magnetoresistance effect element MTJ can reverse the magnetization direction of the ferromagnetic layer 27a' only by the spin orbit torque without applying the external magnetic field nor without applying a method in substitution for the external magnetic field.

2. Second Embodiment

According to the second embodiment, the position at which the switching element SEL2 is formed is different from the first embodiment. In the following description, the configurations and the operations different from those in the first embodiment are mainly described. The description of the configurations and the operations that are the same as those in the first embodiment may be omitted.

2.1 Circuit Configuration of Memory Cell Array

Figure 24:
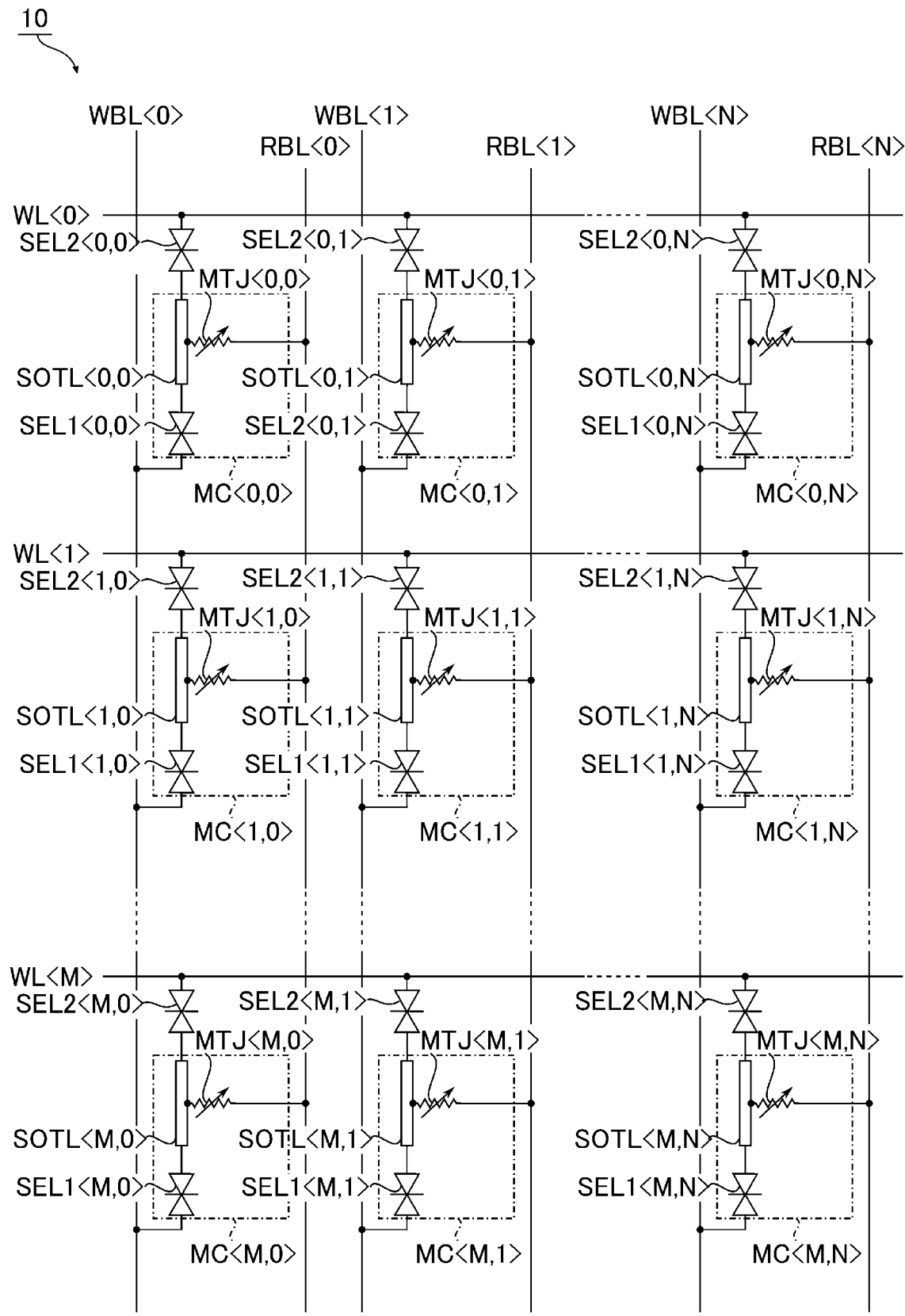
FIG. 24 is a circuit diagram of a memory cell array according to a second embodiment.

FIG. 24 is a circuit diagram illustrating an example of the circuit configuration of the memory cell array according to the second embodiment. FIG. 24 corresponds to FIG. 2 according to the first embodiment.

The switching element SEL2<i, j> is connected between the first portion of the wiring SOTL<i, j> and the word line WL<i>. The switching element SEL1<i, j> is connected between the second portion of the wiring SOTL<i, j> and the write bit line WBL<j>. The magnetoresistance effect element MTJ<i, j> is connected between the third portion of the wiring SOTL<i, j> and the read bit line RBL<j>.

2.2 Planar Layout of Memory Cell Array

Figure 25:
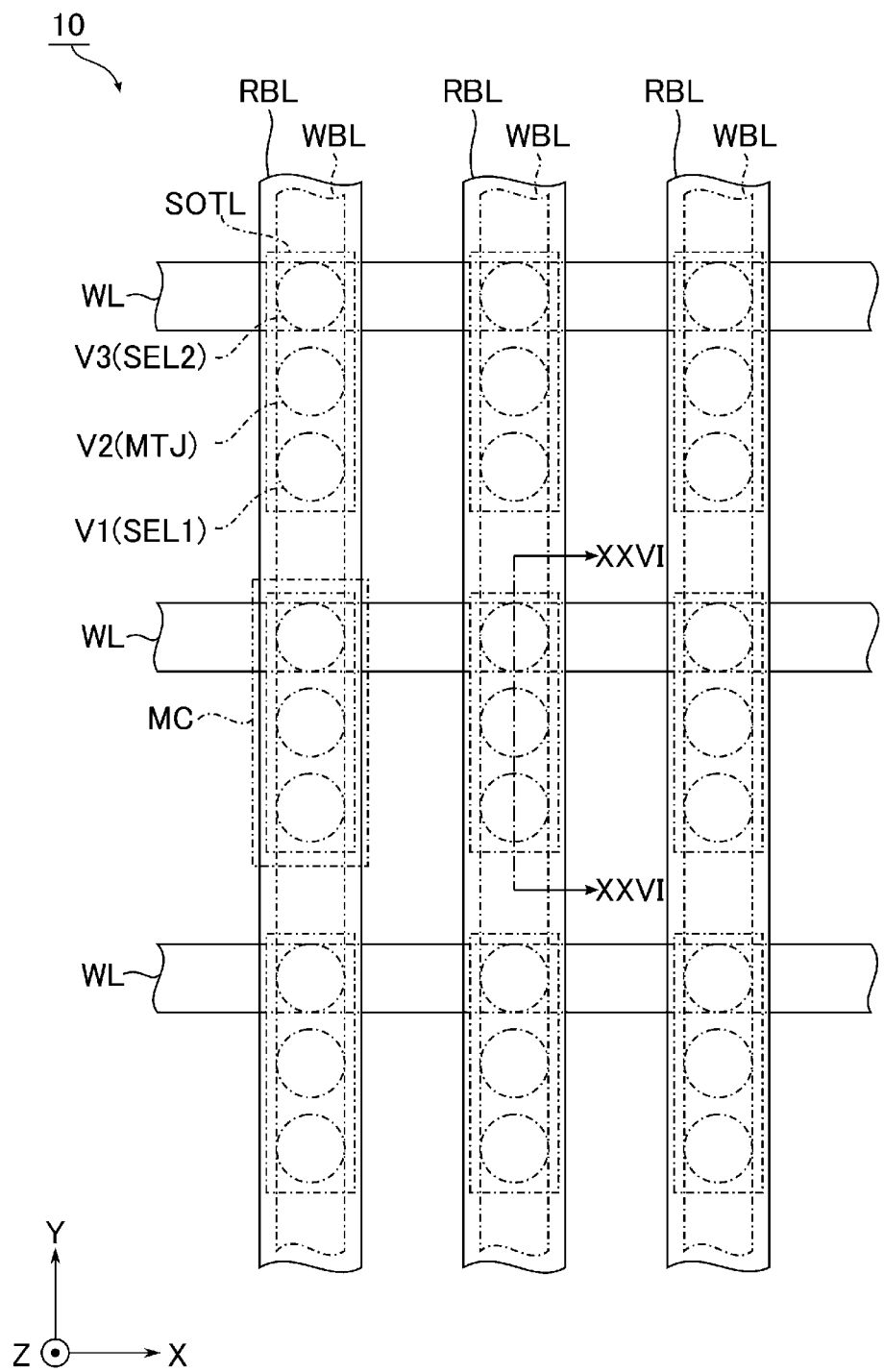
FIG. 25 is a plan view of a memory cell array according to a second embodiment.

FIG. 25 is a plan view illustrating an example of the planar layout of the memory cell array according to the second embodiment. FIG. 25 corresponds to FIG. 3 according to the first embodiment.

In the memory cell array 10, each of the vertical structures V1 includes the switching element SEL1. Each of the vertical structures V2 includes the magnetoresistance effect element MTJ. Each of the vertical structures V3 includes the switching element SEL2.

In the configuration as above, a set including one wiring SOTL and one vertical structure V1, one vertical structure V2, and one vertical structure V3 connected to one corresponding wiring SOTL function as one memory cell MC.

2.3 Cross-Sectional Structure of Memory Cell Array

Figure 26:
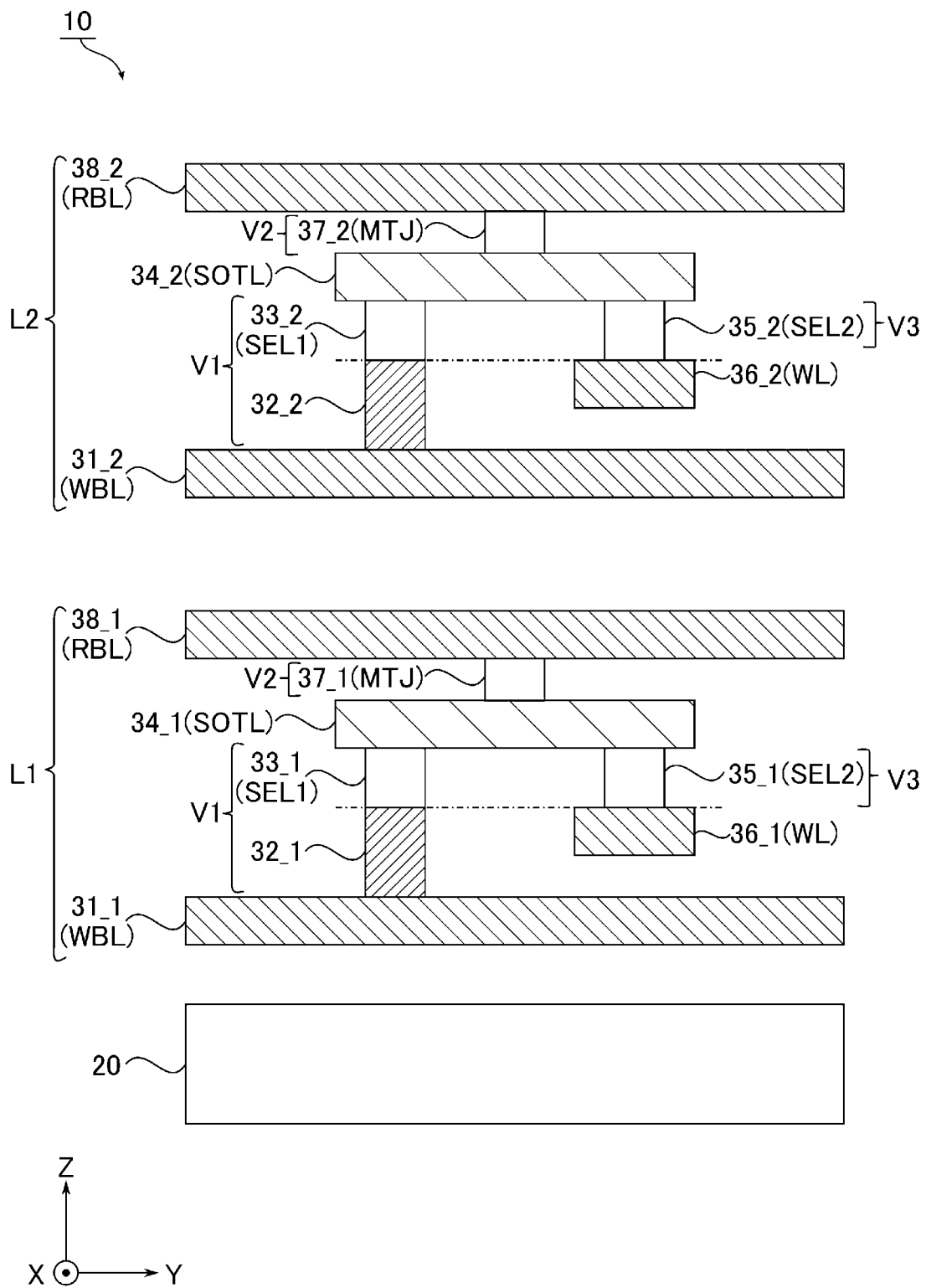
FIG. 26 is a cross-sectional view of a memory cell array according to the second embodiment.

FIG. 26 is a cross-sectional view illustrating an example of the cross-sectional structure of the memory cell array according to the second embodiment, which is taken along the line XXVI-XXVI of FIG. 25. FIG. 26 corresponds to FIG. 4 according to the first embodiment. The hierarchical structure L1 includes conductor layers 31_1, 32_1, 34_1, 36_1, and 38_1, and the element layers 33_1, 35_1, and 37_1. The hierarchical structure L2 includes conductor layers 31_2, 32_2, 34_2, 36_2, and 38_2, and element layers 33_2, 35_2, and 37_2.

First, the hierarchical structure L1 is described.

The conductor layer 31_1 is provided above the semiconductor substrate 20. The conductor layer 31_1 is used as the write bit line WBL. The conductor layer 31_1 extends in the Y direction.

The conductor layer 32_1 is provided on the upper surface of the conductor layer 31_1. The conductor layer 32_1 is used as the contact.

The element layer 33_1 is provided on the upper surface of the conductor layer 32_1. The element layer 33_1 is used as the switching element SEL1. The conductor layer 32_1 and the element layer 33_1 configure the vertical structure V1.

The conductor layer 34_1 is provided on the upper surface of the element layer 33_1. The conductor layer 34_1 is used as the wiring SOTL. The conductor layer 34_1 extends in the Y direction.

The element layer 35_1 is provided in a portion of the lower surface of the conductor layer 34_1 different from the portion where the element layer 33_1 is provided. The element layer 35_1 is used as the switching element SEL2. The element layer 35_1 configures the vertical structure V3.

The element layers 33_1 and 35_1 are formed by the same process. In this case, the element layers 33_1 and 35_1 are provided at the same height. That is, the lower surface of the element layer 33_1 is positioned on the same XY plane as the lower surface of the element layer 35_1. Also, the element layers 33_1 and 35_1 are formed to have the same current-voltage characteristics. For example, all of the element layers 33_1 and 35_1 have current-voltage characteristics with snapback.

The conductor layer 36_1 is provided on the lower surface of the element layer 35_1. The conductor layer 36_1 is used as the word line WL. The conductor layer 36_1 extends in the X direction.

The element layer 37_1 is provided in a portion of the upper surface of the conductor layer 34_1 between the portion where the element layer 33_1 is provided and the portion where the element layer 35_1 is provided. The element layer 37_1 is used as the magnetoresistance effect element MTJ.

The conductor layer 38_1 is provided on the upper surface of the element layer 37_1. The conductor layer 38_1 is used as the read bit line RBL. The conductor layer 38_1 extends in the Y direction.

In the configuration as above, one set including the conductor layer 34_1 and the vertical structures V1, V2, and V3 in the hierarchical structure L1 functions as one memory cell MC having three terminals respectively connected to the conductor layers 31_1, 36_1, and 38_1.

The hierarchical structure L2 has the same configuration as the hierarchical structure L1. That is, the conductor layers 31_2, 32_2, 34_2, 36_2, and 38_2, and the element layers 33_2, 35_2, and 37_2 have the same structure and the same function as the conductor layers 31_1, 32_1, 34_1, 36_1, and 38_1, and the element layers 33_1, 35_1, and 37_1, respectively. Accordingly, one set including the conductor layer 34_2, and the vertical structures V1, V2, and V3 in the hierarchical structure L2 functions as one memory cell MC having three terminals connected to the conductor layers 31_2, 36_2, and 38_2, respectively.

2.4 Effect of Second Embodiment

According to the second embodiment, the switching element SEL2 is connected between the wiring SOTL and the word line WL. The element layer 33 functioning as the switching element SEL1 and the element layer 35 functioning as the switching element SEL2 are provided at the same height. Accordingly, the element layers 33 and 35 can be formed in the same process. Therefore, the manufacturing load of the memory cell array 10 can be reduced. When the element layers 33 and 35 are formed in the same process, the element layer 35 is formed to have the current-voltage characteristics with snapback in the same manner as the element layer 33. Accordingly, the effect that it is easy to a larger write current to flow in the memory cell MC in the selected state during the write operation can be maintained.

In the magnetic memory device according to the second embodiment, the configuration and the operation according to the first modification of the first embodiment, the second modification of the first embodiment, and the third modification of the first embodiment can be applied. In this case, the magnetic memory device according to the second embodiment can exhibit the same effect as the first modification of the first embodiment, the second modification of the first embodiment, and the third modification of the first embodiment.

3. Third Embodiment

A magnetic memory device according to a third embodiment is described. The third embodiment is different from the first embodiment and the second embodiment, in that the word line WL is shared by the plurality of memory cells MC. In the following description, the configurations and the operations different from those in the first embodiment are mainly described. The description of the configurations and the operations that are the same as those in the first embodiment may be omitted.

3.1 Circuit Configuration of Memory Cell Array

Figure 27:
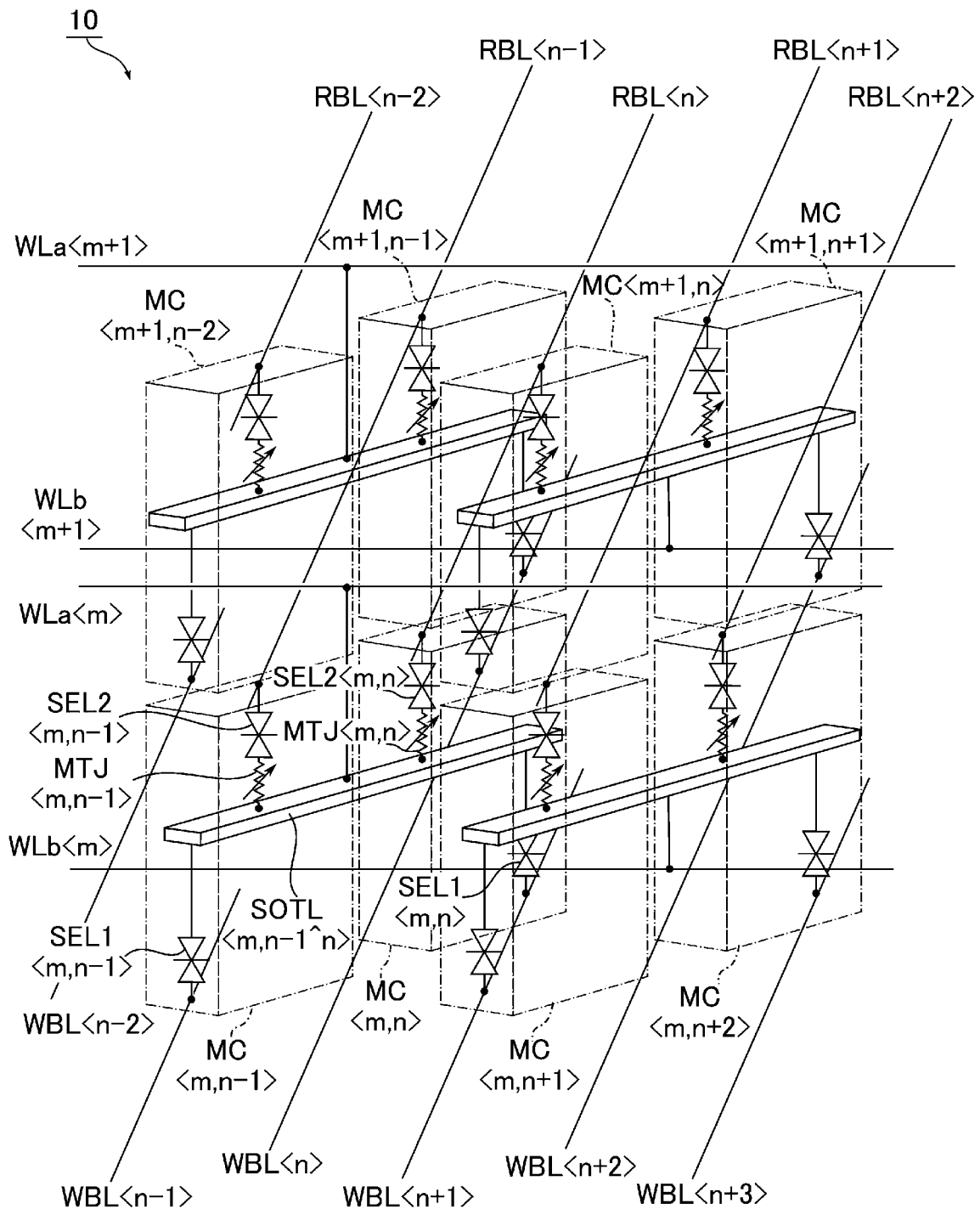
FIG. 27 is a circuit diagram of a memory cell array according to a third embodiment.

FIG. 27 is a circuit diagram illustrating an example of the circuit configuration of the memory cell array according to the third embodiment.

The memory cell array 10 includes the plurality of memory cells MC, the plurality of word lines WLa and WLb, the plurality of read bit lines RBL, and the plurality of write bit lines WBL. In the example of FIG. 27, among the plurality of memory cells MC, eight memory cells MC<m, n−1>, MC<m, n>, MC<m, n+1>, MC<m, n+2>, MC<m+1, n−2>, MC<m+1, n−1>, MC<m+1, n>, and MC<m+1, n+1> are illustrated. Among the plurality of word lines WLa and WLb, two word lines WLa<m> and WLa<m+1> and two word lines WLb<m> and WLb<m+1> are illustrated. Among the plurality of read bit lines RBL, five read bit lines RBL<n−2>, RBL<n−1>, RBL<n>, RBL<n+1>, and RBL<n+2> are illustrated. Among the plurality of write bit lines WBL, six write bit lines WBL<n−2>, WBL<n−1>, WBL<n>, WBL<n+1>, WBL<n+2>, and WBL<n+3> are illustrated.

The memory cell MC<m, n−1> includes a first end connected to the word line WLa<m>, a second end connected to the write bit line WBL<n−1>, and a third end connected to the read bit line RBL<n−1>. The memory cell MC<m, n> includes a first end connected to the word line WLa<m>, a second end connected to the write bit line WBL<n+1>, and a third end connected to the read bit line RBL<n>. The first end of the memory cell MC<m, n−1> and the first end of the memory cell MC<m, n> are shared by each other.

The memory cell MC<m, n+1> includes a first end connected to the word line WLb<m>, a second end connected to the write bit line WBL<n+1>, and a third end connected to the read bit line RBL<n+1>. The memory cell MC<m, n+2> includes a first end connected to the word line WLb<m>, a second end connected to the write bit line WBL<n+3>, and a third end connected to the read bit line RBL<n+2>. The first end of the memory cell MC<m, n+1> and the first end of the memory cell MC<m, n+2> are shared by each other.

The memory cell MC<m+1, n−2> includes a first end connected to the word line WLa<m+1>, a second end connected to the write bit line WBL<n−2>, and a third end connected to the read bit line RBL<n−2>. The memory cell MC<m+1, n−1> includes a first end connected to the word line WLa<m+1>, a second end connected to the write bit line WBL<n>, and a third end connected to the read bit line RBL<n−1>. The first end of the memory cell MC<m+1, n−2> and the first end of the memory cell MC<m+1, n−1> are shared by each other.

The memory cell MC<m+1, n> includes a first end connected to the word line WLb<m+1>, a second end connected to the write bit line WBL<n>, and a third end connected to the read bit line RBL<n>. The memory cell MC<m+1, n+1> includes a first end connected to the word line WLb<m+1>, a second end connected to the write bit line WBL<n+2>, and a third end connected to the read bit line RBL<n+1>. The first end of the memory cell MC<m+1, n> and the first end of the memory cell MC<m+1, n+1> are shared by each other.

This set including eight memory cells MC<m, n−1>, MC<m, n>, MC<m, n+1>, MC<m, n+2>, MC<m+1, n−2>, MC<m+1, n−1>, MC<m+1, n>, and MC<m+1, n+1> is repeated in the row direction and the column direction to form the memory cell array 10. That is, in the same row (for example, the m-th row), two memory cells MC (for example, MC<m, n−1> and MC<m, n>) that are connected to the word lines WLa and adjacent to each other in the column direction and two memory cells MC (for example, MC<m, n+1> and MC<m, n+2>) that are connected to the word line WLb<m> and are adjacent to each other in the column direction are alternately arranged in the column direction.

Among the plurality of memory cells MC in the memory cell array 10 as described above, the configurations of two memory cells MC<m, n−1> and MC<m, n> that are connected to the same word line WLa and adjacent to each other in the column direction are described. The memory cell MC<m, n−1> includes the switching elements SEL1<m, n−1> and SEL2<m, n−1> and the magnetoresistance effect element MTJ<m, n−1>. The memory cell MC<m, n> includes the switching elements SEL1<m, n> and SEL2<m, n> and the magnetoresistance effect element MTJ<m, n>. The memory cells MC<m, n−1> and MC<m, n> share the wiring SOTL<m, n−1^n>. The notation "n−1^n" in this context indicates this wiring SOTL bridges/spans/crosses between column (n−1) and column (n).

A first portion of the wiring SOTL<m, n−1^n> is connected to the word line WLa<m>. A second portion of the wiring SOTL<m, n−1^n> is connected to the write bit line WBL<n−1>. A third portion of the wiring SOTL<m, n−1^n> is connected to the read bit line RBL<n−1>. A fourth portion of the wiring SOTL<m, n−1^n> is connected to the write bit line WBL<n+1>. A fifth portion of the wiring SOTL<m, n−1^n> is connected to the read bit line RBL<n>.

The switching element SEL1<m, n−1> is connected between the second portion of the wiring SOTL<m, n−1^n> and the write bit line WBL<n−1>. The magnetoresistance effect element MTJ<m, n−1> is connected between the third portion of the wiring SOTL<m, n−1^n> and the read bit line RBL<n−1>. The switching element SEL2<m, n 1> is connected between the magnetoresistance effect element MTJ<m, n−1> and the read bit line RBL<n−1>.

The switching element SEL1<m, n> is connected between the fourth portion of the wiring SOTL<m, n−1^n> and the write bit line WBL<n+1>. The magnetoresistance effect element MTJ<m, n> is connected between the fifth portion of the wiring SOTL<m, n−1^n> and the read bit line RBL<n>. The switching element SEL2<m, n> is connected between the magnetoresistance effect element MTJ<m, n> and the read bit line RBL<n>.

3.2 Planar Layout of Memory Cell Array

Figure 28:
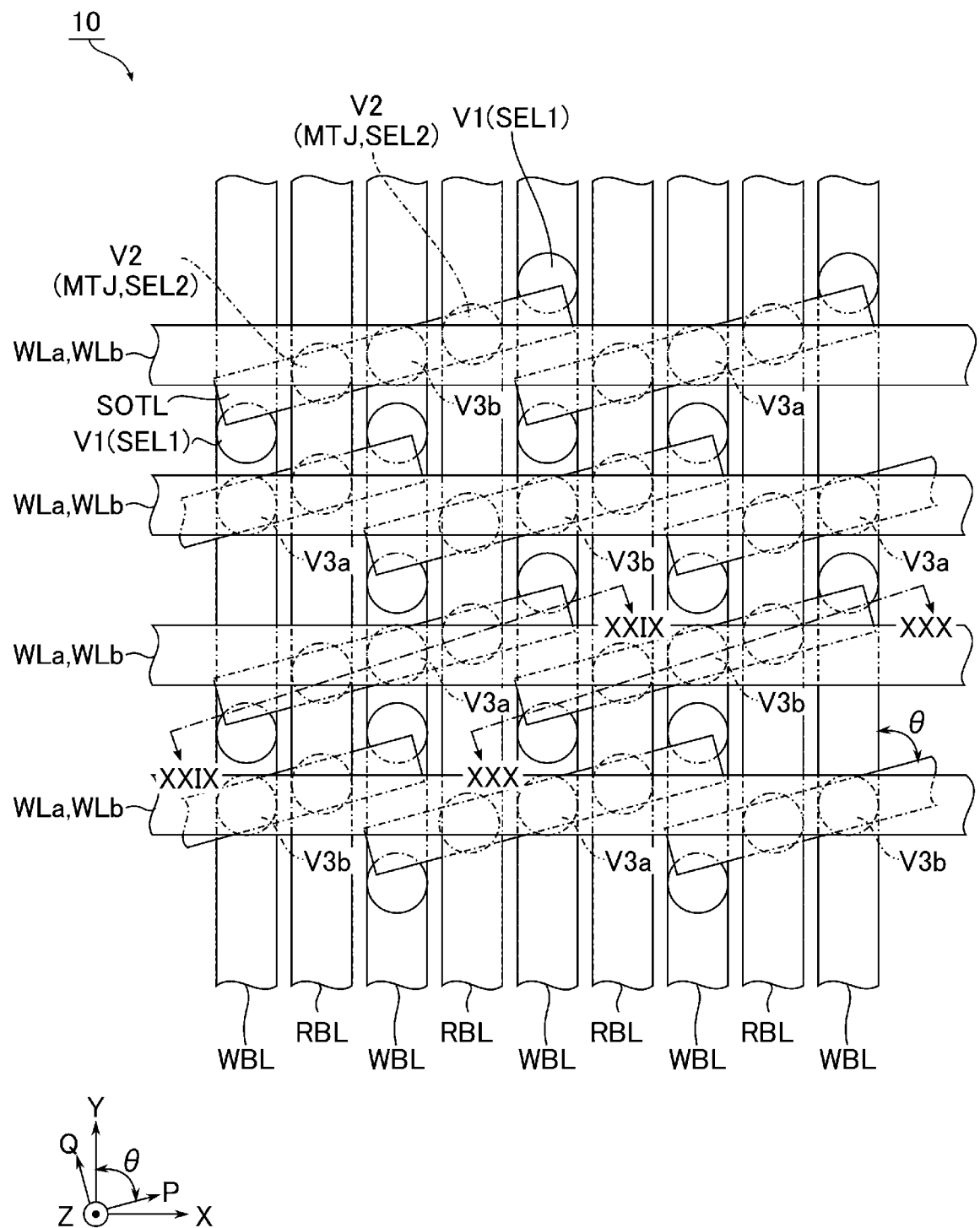
FIG. 28 is a plan view of a memory cell array according to a third embodiment.

FIG. 28 is a plan view illustrating an example of the planar layout of the memory cell array according to the third embodiment.

The memory cell array 10 includes the vertical structures V1, the vertical structures V2, a plurality of vertical structures V3a, and a plurality of vertical structures V3b. Each of the vertical structures V1 includes the switching element SEL1. Each of the vertical structures V2 includes the magnetoresistance effect element MTJ and the switching element SEL2.

The plurality of write bit lines WBL are arranged in the X direction. Each of the write bit lines WBL extends in the Y direction.

The plurality of word lines WLb are provided above the plurality of write bit lines WBL. The plurality of word lines WLb are arranged in the Y direction. Each of the word lines WLb extends in the X direction.

The plurality of wirings SOTL are provided above the plurality of word lines WLb. In a plan view, each of the wirings SOTL has a rectangular shape. The long side direction and the short side direction of the wirings SOTL intersect with the X direction and the Y direction in the XY plane, respectively. In the following description, the long side direction and the short side direction of the wiring SOTL are referred to as a P direction and a Q direction, respectively. An angle θ formed by the Y direction and the P direction is, for example, (90−a tan (⅓)) degrees. In a plan view, each of the wirings SOTL is provided at the position overlapping with one word line WLb (or WLa), and three adjacent write bit lines WBL.

The plurality of read bit lines RBL are provided above the plurality of wirings SOTL. The plurality of read bit lines RBL are arranged in the X direction. Each of the read bit lines RBL extends in the Y direction. In a plan view, each of the read bit lines RBL is provided between the two adjacent write bit lines WBL.

The plurality of word lines WLa are provided above the plurality of read bit lines RBL. The plurality of word lines WLa are arranged in the Y direction. Each of the word lines WLa extends in the X direction. In a plan view, one word line WLa and one word line WLb corresponding to each other are provided at an overlapping position.

The vertical structures V1 extend in the Z direction. In a plan view, the vertical structures V1 each have a circular shape. Each of the vertical structures V1 is connected between one corresponding write bit line WBL and one corresponding wiring SOTL.

The vertical structures V2 extend in the Z direction. In a plan view, the vertical structures V2 each have a circular shape. Each of the vertical structures V2 is connected between one corresponding read bit line RBL and one corresponding wiring SOTL.

The vertical structures V3a extend in the Z direction. In a plan view, the vertical structures V3a each have a circular shape. Each of the vertical structures V3a is connected between one corresponding word line WLa and one corresponding wiring SOTL.

The vertical structures V3b extend in the Z direction. In a plan view, the vertical structures V3b each have a circular shape. Each of the vertical structures V3b is connected between one corresponding word line WLb and one corresponding wiring SOTL.

In the configuration as above, a set including one wiring SOTL, and one vertical structure V1, one vertical structure V2, and one vertical structure V3a or V3b connected to one corresponding wiring SOTL functions as one memory cell MC. Also, a wiring SOTL and a vertical structure V3a are shared by two memory cells MC. A wiring SOTL and a vertical structure V3b are shared by two memory cells MC.

Two vertical structures V2 respectively provided for the two memory cells MC that share the same wiring SOTL are arranged in the P direction. Also, in a plan view, the center of each vertical structure V2 is positioned on a symmetric axis along the P direction of a wiring SOTL. That is, the wiring SOTL and two vertical structures V2 respectively provided for the two memory cells MC that share the corresponding wiring SOTL are provided on the same axis along the P direction. The two vertical structures V2 may be said to be "on-axis" with each other. In this context, the "same" includes substantially the same such as pattern/position alignment within normal manufacturing tolerances or the like.

3.3 Cross-Sectional Structure of Memory Cell Array

Figure 29:
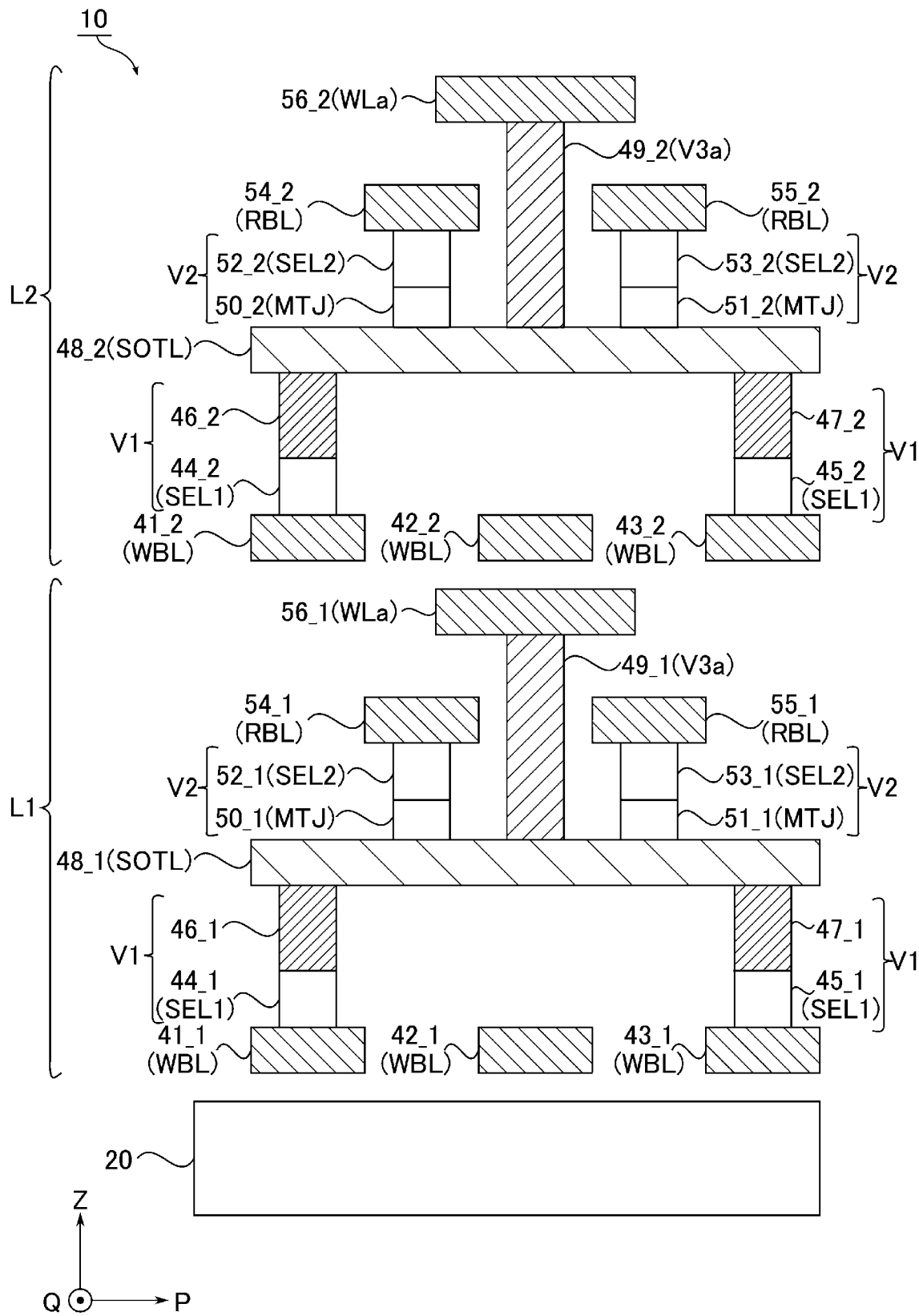
FIG. 29 is a cross-sectional view of a memory cell array according to a third embodiment.

FIG. 29 is a cross-sectional view illustrating an example of the cross-sectional structure of the memory cell array according to the third embodiment, that is taken along the line XXIX-XXIX of FIG. 28. In FIG. 29, the configuration connected to the word line WLa is illustrated.

The hierarchical structure L1 includes the conductor layers 41_1, 42_1, 43_1, 46_1, 47_1, 48_1, 49_1, 54_1, 55_1, and 56_1, and element layers 44_1, 45_1, 50_1, 51_1, 52_1, and 53_1. The hierarchical structure L2 includes conductor layers 41_2, 42_2, 43_2, 46_2, 47_2, 48_2, 49_2, 54_2, 55_2, and 56_2, and the element layers 44_2, 45_2, 50_2, 51_2, 52_2, and 53_2.

First, the hierarchical structure L1 is described.

The conductor layers 41_1, 42_1, and 43_1 are provided above the semiconductor substrate 20. The conductor layers 41_1, 42_1, and 43_1 are used as the write bit lines WBL adjacent to each other. Each of the conductor layers 41_1, 42_1, and 43_1 extends in the Y direction.

The element layers 44_1 and 45_1 are provided on the upper surfaces of the conductor layers 41_1 and 43_1, respectively. Each of the element layers 44_1 and 45_1 is used as the switching element SEL1.

The conductor layers 46_1 and 47_1 are provided on the upper surfaces of the element layers 44_1 and 45_1, respectively. Each of the conductor layers 46_1 and 47_1 is used as a contact. The element layer 44_1 and the conductor layer 46_1 configure the vertical structure V1. The element layer 45_1 and the conductor layer 47_1 configure the vertical structure V1.

The vertical structures V1 can also be on the upper surface of the conductor layer 42_1. However, the vertical structure V1 on the conductor layer 42_1 is not aligned with the vertical structure V1 on the conductor layer 41_1 or the vertical structure V1 on the conductor layer 43_1 in the P direction. The vertical structure V1 specifically on the conductor layer 42_1 is not illustrated in FIG. 29.

The conductor layer 48_1 extending in the P direction is in contact with the upper surface of the conductor layer 46_1 and the upper surface of the conductor layer 47_1. The conductor layer 48_1 is used as the wiring SOTL. On the conductor layer 48_1, the connection portion with the conductor layer 46_1 and the connection portion with the conductor layer 47_1 correspond to the second portion and the fourth portion of the wiring SOTL, respectively.

The conductor layer 49_1, and the element layers 50_1 and 51_1 are provided on the upper surface of the conductor layer 48_1.

The conductor layer 49_1 is provided above the conductor layer 42_1. On the conductor layer 48_1, the connection portion with the conductor layer 49_1 corresponds to the first portion of the wiring SOTL. The conductor layer 49_1 is used as a contact.

The element layer 50_1 is provided between the connection portion with the conductor layer 46_1 and the connection portion with the conductor layer 49_1. The element layer 51_1 is provided between the connection portion with the conductor layer 47_1 and the connection portion with the conductor layer 49_1. On the conductor layer 48_1, the connection portion with the element layer 50_1 and the connection portion with the element layer 51_1 correspond to the third portion and the fifth portion of the wiring SOTL, respectively. Each of the element layers 50_1 and 51_1 is used as the magnetoresistance effect element MTJ.

The element layers 52_1 and 53_1 are provided on the upper surfaces of the element layers 50_1 and 51_1, respectively. Each of the element layers 52_1 and 53_1 is used as the switching element SEL2. The element layer 50_1 and the element layer 52_1 configure the vertical structure V2. The element layer 51_1 and the element layer 53_1 configure the vertical structure V2.

The conductor layers 54_1 and 55_1 are provided on the upper surfaces of the element layers 52_1 and 53_1, respectively. Each of the conductor layers 54_1 and 55_1 is used as the read bit line RBL. Each of the conductor layers 54_1 and 55_1 extends in the Y direction.

Above the conductor layers 54_1 and 55_1, the conductor layer 56_1 is provided on the upper surface of the conductor layer 49_1. The conductor layer 56_1 is used as the word line WLa. The conductor layer 56_1 extends in the X direction.

In the configuration as above, one conductor layer 48_1, two vertical structures V1, two vertical structures V2, and one vertical structure Via in the hierarchical structure L1 function as two memory cells MC that share the conductor layer 49_1 and the conductor layer 56_1.

The hierarchical structure L2 has the same configuration as the hierarchical structure L1. That is, the conductor layers 41_2, 42_2, 43_2, 46_2, 47_2, 48_2, 49_2, 54_2, 55_2, and 56_2, and the element layers 44_2, 45_2, 50_2, 51_2, 52_2, and 53_2 have the same structures and the same functions as the conductor layers 41_1, 42_1, 43_1, 46_1, 47_1, 48_1, 49_1, 54_1, 55_1, and 56_1, and the element layers 44_1, 45_1, 50_1, 51_1, 52_1, and 53_1, respectively. Accordingly, one conductor layer 48_2, two vertical structures V1, two vertical structures V2, and one vertical structure Via in the hierarchical structure L2 function as two memory cells MC that share the conductor layer 49_2 and the conductor layer 56_2.

Figure 30:
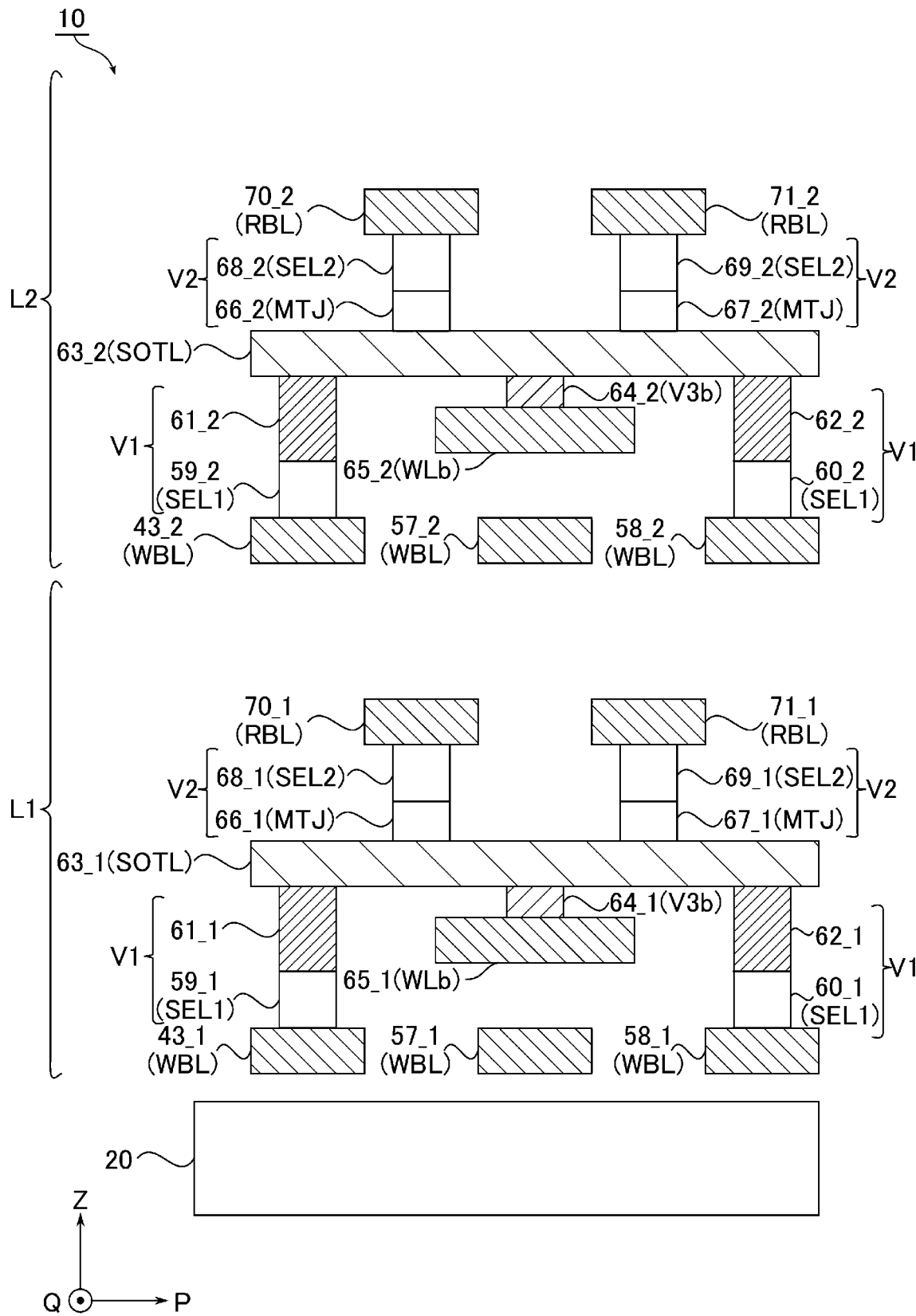
FIG. 30 is a cross-sectional view of a memory cell array according to a third embodiment.

FIG. 30 is a cross-sectional view illustrating an example of the cross-sectional structure of the memory cell array according to the third embodiment, which is taken along the line XXX-XXX of FIG. 28. In FIG. 30, the configuration connected to the word line WLb is illustrated.

The hierarchical structure L1 includes the conductor layers 43_1, 57_1, 58_1, 61_1, 62_1, 63_1, 64_1, 65_1, 70_1, and 71_1, and the element layers 59_1, 60_1, 66_1, 67_1, 68_1, and 69_1. The hierarchical structure L2 includes the conductor layers 43_2, 57_2, 58_2, 61_2, 62_2, 63_2, 64_2, 65_2, 70_2, and 71_2, and element layers 59_2, 60_2, 66_2, 67_2, 68_2, and 69_2.

First, the hierarchical structure L1 is described.

The configurations of the conductor layer 43_1, 57_1, 58_1, 61_1, 62_1, 63_1, 70_1, and 71_1, and the element layers 59_1, 60_1, 66_1, 67_1, 68_1, and 69_1 in FIG. 30 are the same as the configurations of the conductor layers 41_1, 42_1, 43_1, 46_1, 47_1, 48_1, 54_1, and 55_1, and the element layers 44_1, 45_1, 50_1, 51_1, 52_1, and 53_1 in FIG. 29.

The conductor layer 64_1 is provided on the lower surface of the conductor layer 63_1.

The conductor layer 64_1 is provided directly above the conductor layer 57_1. On the conductor layer 63_1, the connection portion with the conductor layer 64_1 corresponds to the first portion of the wiring SOTL. The conductor layer 64_1 is used as a contact.

Above the conductor layer 57_1, the conductor layer 65_1 is provided on the lower surface of the conductor layer 64_1. The conductor layer 65_1 is used as the word line WLb. The conductor layer 65_1 extends in the X direction. Though not specifically illustrated in FIG. 30, the conductor layer 65_1 passes between the vertical structure V1 including the element layer 59_1 and the conductor layer 61_1 and the vertical structure V1 including the element layer 60_1 and the conductor layer 62_1.

In the configuration as above, one conductor layer 63_1, two vertical structures V1, two vertical structures V2, and one vertical structure V3b in the hierarchical structure L1 function as two memory cells MC that share the conductor layer 64_1 and the conductor layer 65_1.

The hierarchical structure L2 has the same configuration as the hierarchical structure L1. That is, the conductor layers 43_2, 57_2, 58_2, 61_2, 62_2, 63_2, 64_2, 65_2, 70_2, and 71_2, and the element layers 59_2, 60_2, 66_2, 67_2, 68_2, and 69_2 have the same structure and the same function as the conductor layers 43_1, 57_1, 58_1, 61_1, 62_1, 63_1, 64_1, 65_1, 70_1, and 71_1, and the element layers 59_1, 60_1, 66_1, 67_1, 68_1, and 69_1, respectively. Accordingly, one conductor layer 63_2, two vertical structures V1, two vertical structures V2, and one vertical structure V3b in the hierarchical structure L2 function as two memory cells MC that share the conductor layer 64_2 and the conductor layer 65_2.

3.4 Effect of Third Embodiment

According to the third embodiment, the wiring SOTL<m, n−1^n> includes a first portion, a second portion, a third portion between the first portion and the second portion, a fourth portion provided on the opposite side to the second portion with respect to the first portion, and a fifth portion between the first portion and the fourth portion. The first portion of the wiring SOTL<m, n−1^n> is connected to the word line WLa<m>. The second portion and the fourth portion of the wiring SOTL<m, n−1^n> are connected to the write bit lines WBL<n−1> and WBL<n+1>, respectively. The third portion and the fifth portion of the wiring SOTL<m, n−1^n> are connected to the read bit lines RBL<n−1> and RBL<n>, respectively. Accordingly, two memory cells MC<m, n−1> and MC<m, n> can share the word line WLa<m>.

The wiring SOTL<m, n+1^n+2> includes a first portion, a second portion, a third portion between the first portion and the second portion, a fourth portion provided on the opposite side to the second portion with respect to the first portion, and a fifth portion between the first portion and the fourth portion. The first portion of the wiring SOTL<m, n+1^n+2> is connected to the word line WLb<m>. The second portion and the fourth portion of the wiring SOTL<m, n+1^n+2> are connected to the write bit lines WBL<n+1> and WBL<n+3>, respectively. The third portion and the fifth portion of the wiring SOTL<m, n+1^n+2> are connected to the read bit lines RBL<n+1> and RBL<n+2>, respectively. Accordingly, two memory cells MC<m, n+1> and MC<m, n+2> can share the word line WLb<m>.

The memory cell array 10 includes the word lines WLa<m> and WLb<m>. The word lines WLa<m> and WLb<m> are disposed at the overlapping position in a plan view. The word line WLa<m> is provided above the wiring SOTL<m, n−1^n>. The word line WLb<m> is provided under the wiring SOTL<m, n+1^n+2>. Accordingly, two memory cells MC<m, n> and MC<m, n+1> connected to the same write bit line WBL<n+1> can be independently selected.

The wiring SOTL has a rectangular shape having long sides extending in the direction intersecting with the write bit lines WBL and a read bit line at the angle θ (=90−a tan (⅓) degrees). Accordingly, the magnetoresistance effect element MTJ can be disposed in the closest packing while the word lines WLa and WLb are shared by two memory cells.

In a plan view, two vertical structures V2 that share the wiring SOTL are provided on the same axis as the corresponding wiring SOTL. Accordingly, compared with in a case where the vertical structures V2 are not provided on the same axis as the wiring SOTL, the contact area with the magnetoresistance effect element MTJ and the wiring SOTL can be increased. Therefore, during the write operation, the wiring SOTL can inject the larger spin orbit torque to the magnetoresistance effect element MTJ.

The configurations and the operations according to the first modification of the first embodiment, the second modification of the first embodiment, and the third modification of the first embodiment can be applied to the magnetic memory device according to the third embodiment. In this case, the magnetic memory device according to the third embodiment can exhibit the same effect as those in the first modification of the first embodiment, the second modification of the first embodiment, and the third modification of the first embodiment.

4. Fourth Embodiment

A magnetic memory device according to a fourth embodiment is described. The fourth embodiment is different from the third embodiment in that two vertical structures V2 that share the wiring SOTL are not provided on the same axis as the corresponding wiring SOTL. In the following description, the configurations and the operations different from those in the third embodiment are mainly described. The description of the configurations and the operations that are the same as those in the third embodiment may be omitted.

4.1 Planar Layout of Memory Cell Array

Figure 31:
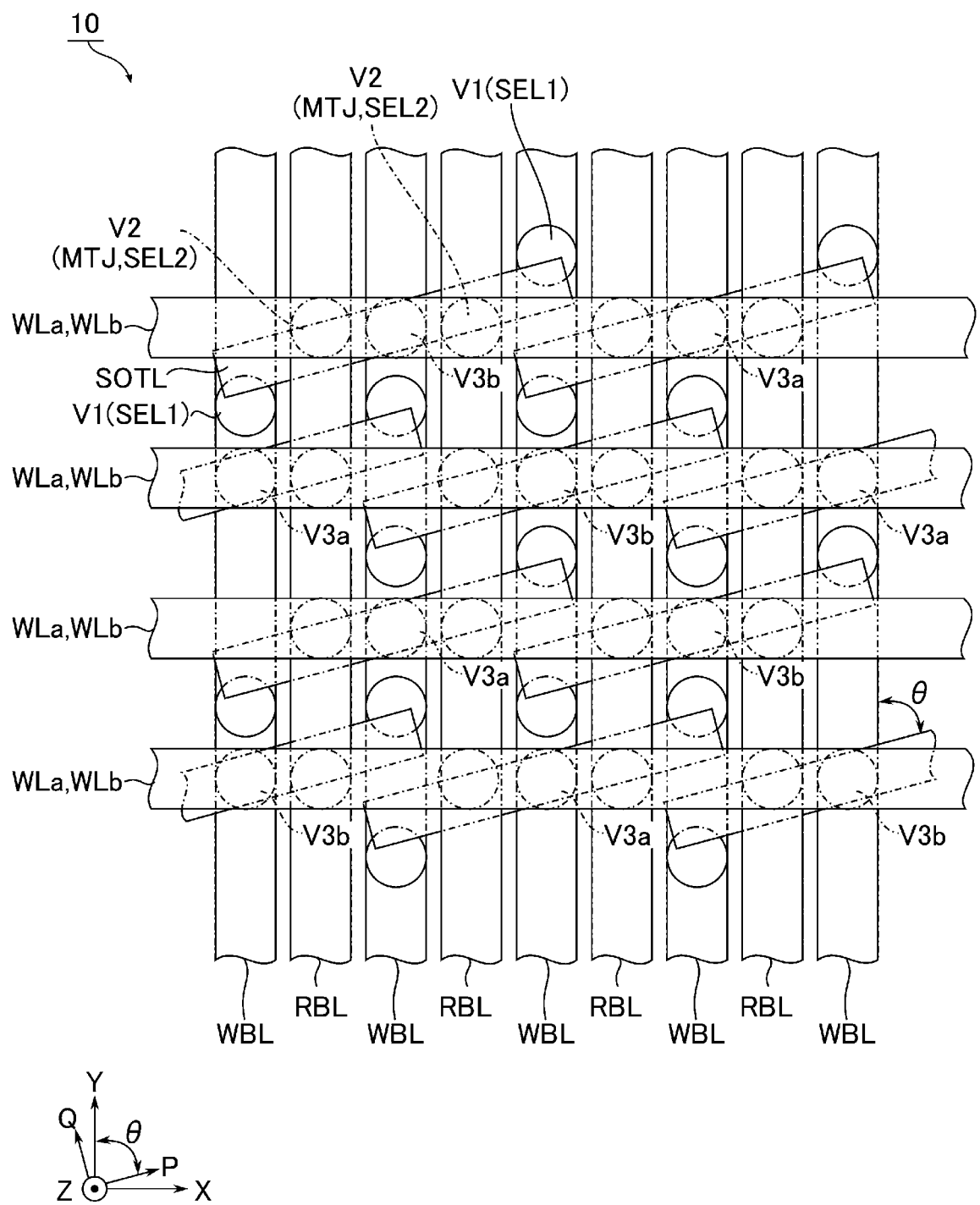
FIG. 31 is a plan view of a memory cell array according to a fourth embodiment.

FIG. 31 is a plan view illustrating an example of the planar layout of the memory cell array according to the fourth embodiment. FIG. 31 corresponds to FIG. 28 according to the third embodiment.

In a plan view, the plurality of vertical structures V2 are arranged in a square grid pattern shape. Accordingly, two vertical structures V2 respectively provided in two memory cells MC that share the wiring SOTL are arranged in the X direction. However, the long side direction of the wiring SOTL is the P direction. Therefore, in a plan view, the center of the vertical structure V2 is deviated from the symmetric axis along the P direction of the wiring SOTL to the Q direction.

4.2 Effect According to Fourth Embodiment

According to the fourth embodiment, the vertical structures V2 can be arranged at equal intervals in the X direction and the Y direction. Therefore, the processing loads of the magnetoresistance effect element MTJ and the switching element SEL2 can be reduced.

The configuration and the operation according to the first modification of the first embodiment, the second modification of the first embodiment, and the third modification of the first embodiment can be applied to the magnetic memory device according to the fourth embodiment. In this case, the magnetic memory device according to the fourth embodiment can exhibit the same effect as in the first modification of the first embodiment, the second modification of the first embodiment, and the third modification of the first embodiment.

5. Fifth Embodiment

A magnetic memory device according to a fifth embodiment is described. The fifth embodiment is different from the third and fourth embodiments in that all word lines are provided above the wiring SOTL. In the following description, the configurations and the operations different from those in the third embodiment are mainly described. The description of the configurations and the operations that are the same as those in the third embodiment may be omitted.

5.1 Planar Layout of Memory Cell Array

Figure 32:
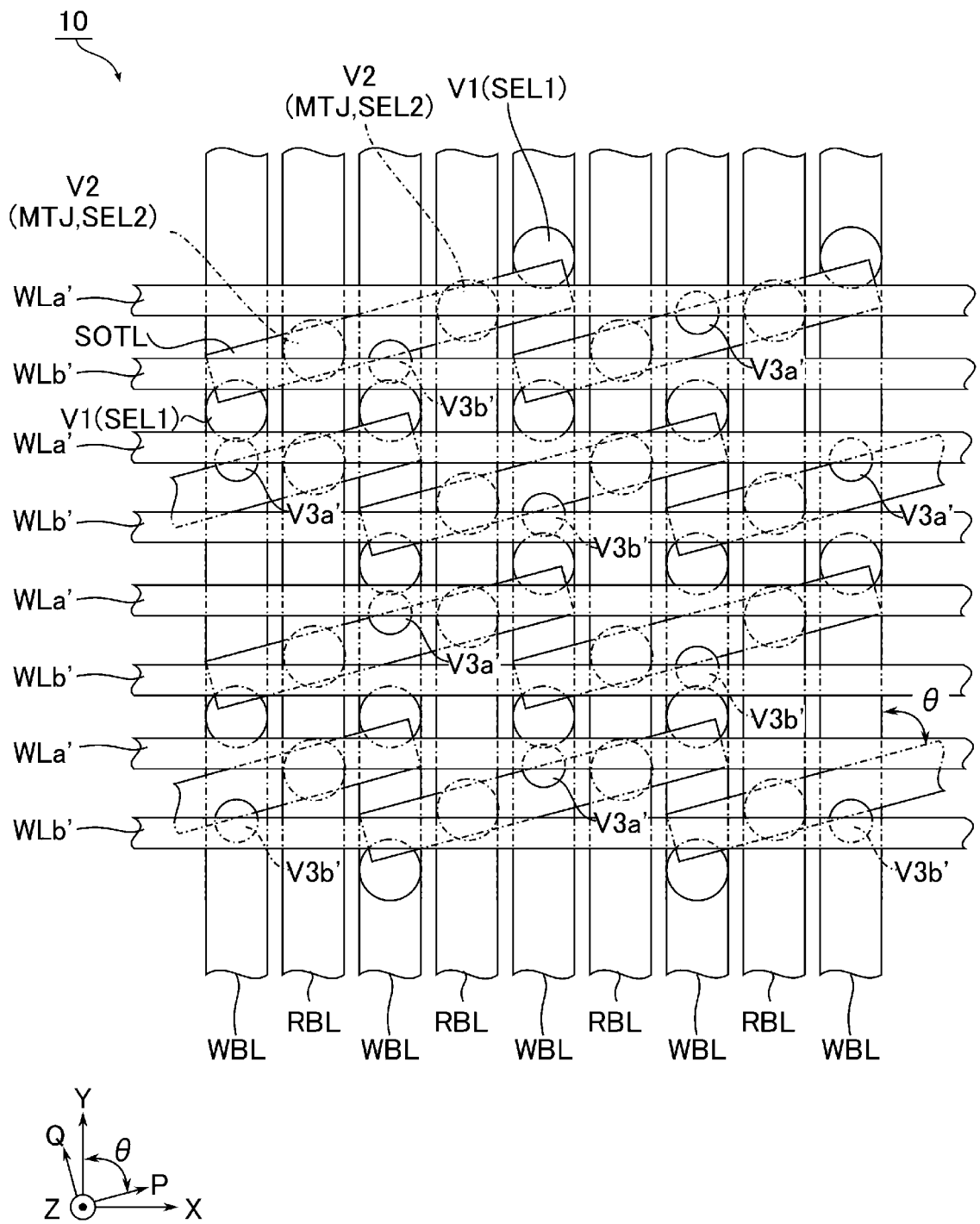
FIG. 32 is a plan view of a memory cell array according to a fifth embodiment.

FIG. 32 is a plan view illustrating an example of the planar layout of the memory cell array according to the fifth embodiment. FIG. 32 corresponds to FIG. 28 according to the third embodiment.

The memory cell array 10 includes a plurality of word lines WLa' and WLb' instead of the plurality of word lines WLa and WLb. The memory cell array 10 further includes vertical structures V3a' and V3b' instead of vertical structures V3a and V3b.

The plurality of word lines WLa' and WLb' are provided above the plurality of read bit lines RBL. The plurality of word lines WLa' and WLb' are alternately arranged in the Y direction. Each of the word lines WLa' and WLb' extends in the X direction. The intervals (pitches) between word lines WLa' and WLb' in the Y direction are half the interval of the word lines WLa in the Y direction and half the interval of the word lines WLb in the Y direction according to the third embodiment.

The vertical structures V3a' extend in the Z direction. In a plan view, the vertical structures V3a' each have a circular shape. Each of the vertical structures V3a' are connected between one corresponding word line WLa' and one corresponding wiring SOTL.

The vertical structures V3b' extend in the Z direction. In a plan view, the vertical structures V3b' each have a circular shape. Each of the vertical structures V3b' is connected between one corresponding word line WLb' and one corresponding wiring SOTL.

5.2 Effect of Fifth Embodiment

According to the fifth embodiment, the plurality of word lines WLa' and WLb' can be disposed at the same height (level). Accordingly, the plurality of word lines WLa' and WLb' can be formed in the same process. Therefore, the manufacturing load of the memory cell array 10 can be reduced.

The configuration and the operation according to the first modification of the first embodiment, the second modification of the first embodiment, and the third modification of the first embodiment can be applied to the magnetic memory device according to the fifth embodiment. In this case, the magnetic memory device according to the fifth embodiment can exhibit the same effect as those of the first modification of the first embodiment, the second modification of the first embodiment, and the third modification of the first embodiment.

The configuration of the fourth embodiment can be applied to the magnetic memory device according to the fifth embodiment. In this case, the magnetic memory device according to the fifth embodiment can exhibit the same effect as that of the fourth embodiment.

6. Sixth Embodiment

A magnetic memory device according to a sixth embodiment is described. The sixth embodiment is different from the third embodiment in that the wiring SOTL is provided to be arranged in parallel to the word line WL. In the following description, the configurations and the operations different from those in the third embodiment are mainly described. The description of the configurations and the operations that are the same as those in the third embodiment may be omitted.

6.1 Circuit Configuration of Memory Cell Array

Figure 33:
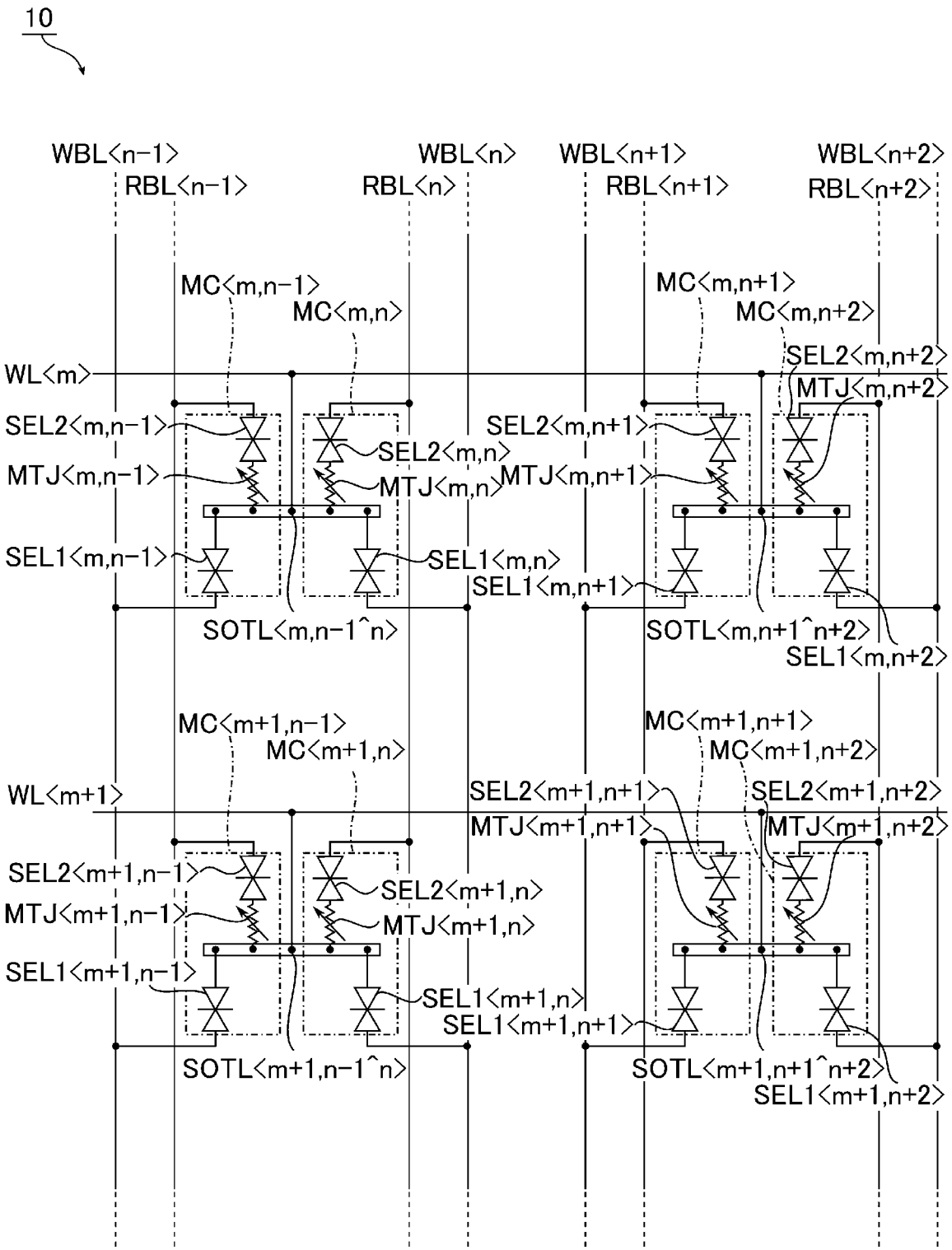
FIG. 33 is a circuit diagram of a memory cell array according to a sixth embodiment.

FIG. 33 is a circuit diagram illustrating an example of the circuit configuration of the memory cell array according to the sixth embodiment. FIG. 33 corresponds to FIG. 27 according to the third embodiment.

The memory cell array 10 of this embodiment includes the plurality of memory cells MC, the plurality of word lines WL, the plurality of read bit lines RBL, and the plurality of write bit lines WBL. In FIG. 33, among the plurality of memory cells MC, eight memory cells MC<m, n−1>, MC<m, n>, MC<m, n+1>, MC<m, n+2>, MC<m+1, n−1>, MC<m+1, n>, MC<m+1, n+1>, and MC<m+1, n+2> are illustrated. Among the plurality of word lines WL, two word line WL<m> and WL<m+1> are illustrated. Among the plurality of read bit lines RBL, four read bit lines RBL<n−1>, RBL<n>, RBL<n+1>, and RBL<n+2> are illustrated. Among the plurality of write bit lines WBL, four write bit lines WBL<n−1>, WBL<n>, WBL<n+1>, and WBL<n+2> are illustrated.

The memory cell MC<m, n−1> includes a first end connected to the word line WL<m>, a second end connected to the write bit line WBL<n−1>, and a third end connected to the read bit line RBL<n−1>. The memory cell MC<m, n> includes a first end connected to the word line WL<m>, a second end connected to the write bit line WBL<n>, and a third end connected to the read bit line RBL<n>. The first end of the memory cell MC<m, n−1> and the first end of the memory cell MC<m, n> are shared by each other.

The memory cell MC<m, n+1> includes a first end connected to the word line WL<m>, a second end connected to the write bit line WBL<n+1>, and a third end connected to the read bit line RBL<n+1>. The memory cell MC<m, n+2> includes a first end connected to the word line WL<m>, a second end connected to the write bit line WBL<n+2>, and a third end connected to the read bit line RBL<n+2>. The first end of the memory cell MC<m, n+1> and the first end of the memory cell MC<m, n+2> are shared by each other.

The memory cell MC<m+1, n−1> includes a first end connected to the word lines WL<m+1>, a second end connected to the write bit line WBL<n−1>, and a third end connected to the read bit line RBL<n−1>. The memory cell MC<m+1, n> includes a first end connected to the word lines WL<m+1>, a second end connected to the write bit line WBL<n>, and a third end connected to the read bit line RBL<n>. The first end of the memory cell MC<m+1, n−1> and the first end of the memory cell MC<m+1, n> are shared by each other.

The memory cell MC<m+1, n+1> includes a first end connected to the word lines WL<m+1>, a second end connected to the write bit line WBL<n+1>, and a third end connected to the read bit line RBL<n+1>. The memory cell MC<m+1, n+2> includes a first end connected to the word lines WL<m+1>, a second end connected to the write bit line WBL<n+2>, a third end connected to the read bit line RBL<n+2>. The first end of the memory cell MC<m+1, n+1> and the first end of the memory cell MC<m+1, n+2> are shared by each other.

This set including the eight memory cells MC<m, n−1>, MC<m, n>, MC<m, n+1>, MC<m, n+2>, MC<m+1, n−1>, MC<m+1, n>, MC<m+1, n+1>, and MC<m+1, n+2> is repeated in the row direction and the column direction to form the memory cell array 10.

Among the plurality of memory cells MC in the memory cell array 10 described above, the configurations of two memory cells MC<m, n−1> and MC<m, n> that are connected to the same word lines WL and adjacent to each other in the column direction are described. The memory cell MC<m, n−1> includes the switching elements SEL1<m, n−1> and SEL2<m, n−1> and the magnetoresistance effect element MTJ<m, n−1>. The memory cell MC<m, n> includes the switching elements SEL1<m, n> and SEL2<m, n> and the magnetoresistance effect element MTJ<m, n>. The memory cells MC<m, n−1> and MC<m, n> share the wiring SOTL<m, n−1^n>.

The wiring SOTL<m, n−1^n> includes a first portion, a second portion, a third portion, a fourth portion, and a fifth portion. The third portion of the wiring SOTL<m, n−1^n> is provided between the first portion of the wiring SOTL<m, n−1^n> and the second portion of the wiring SOTL<m, n−1^n>. The fourth portion of the wiring SOTL<m, n−1^n> is provided on the opposite side to the second portion of the wiring SOTL<m, n−1^n> with respect to the first portion of the wiring SOTL<m, n−1^n>. The fifth portion of the wiring SOTL<m, n−1^n> is provided between the first portion of the wiring SOTL<m, n−1^n> and the fourth portion of the wiring SOTL<m, n−1^n>.

The first portion of the wiring SOTL<m, n−1^n> is connected to the word line WL<m>. The second portion of the wiring SOTL<m, n−1^n> is connected to the write bit line WBL<n−1>. The third portion of the wiring SOTL<m, n−1^n> is connected to the read bit line RBL<n−1>. The fourth portion of the wiring SOTL<m, n−1^n> is connected to the write bit line WBL<n>. The fifth portion of the wiring SOTL<m, n−1^n> is connected to the read bit line RBL<n>.

The switching element SEL1<m, n−1> is connected between the second portion of the wiring SOTL<m, n−1^n> and the write bit line WBL<n−1>. The magnetoresistance effect element MTJ<m, n−1> is connected between the third portion of the wiring SOTL<m, n−1^n> and the read bit line RBL<n−1>. The switching element SEL2<m, n 1> is connected between the magnetoresistance effect element MTJ<m, n−1> and the read bit line RBL<n−1>.

The switching element SEL1<m, n> is connected between the fourth portion of the wiring SOTL<m, n−1^n> and the write bit line WBL<n>. The magnetoresistance effect element MTJ<m, n> is connected between the fifth portion of the wiring SOTL<m, n−1^n> and the read bit line RBL<n>. The switching element SEL2<m, n> is connected between the magnetoresistance effect element MTJ<m, n> and the read bit line RBL<n>.

6.2 Planar Layout of Memory Cell Array

Figure 34:
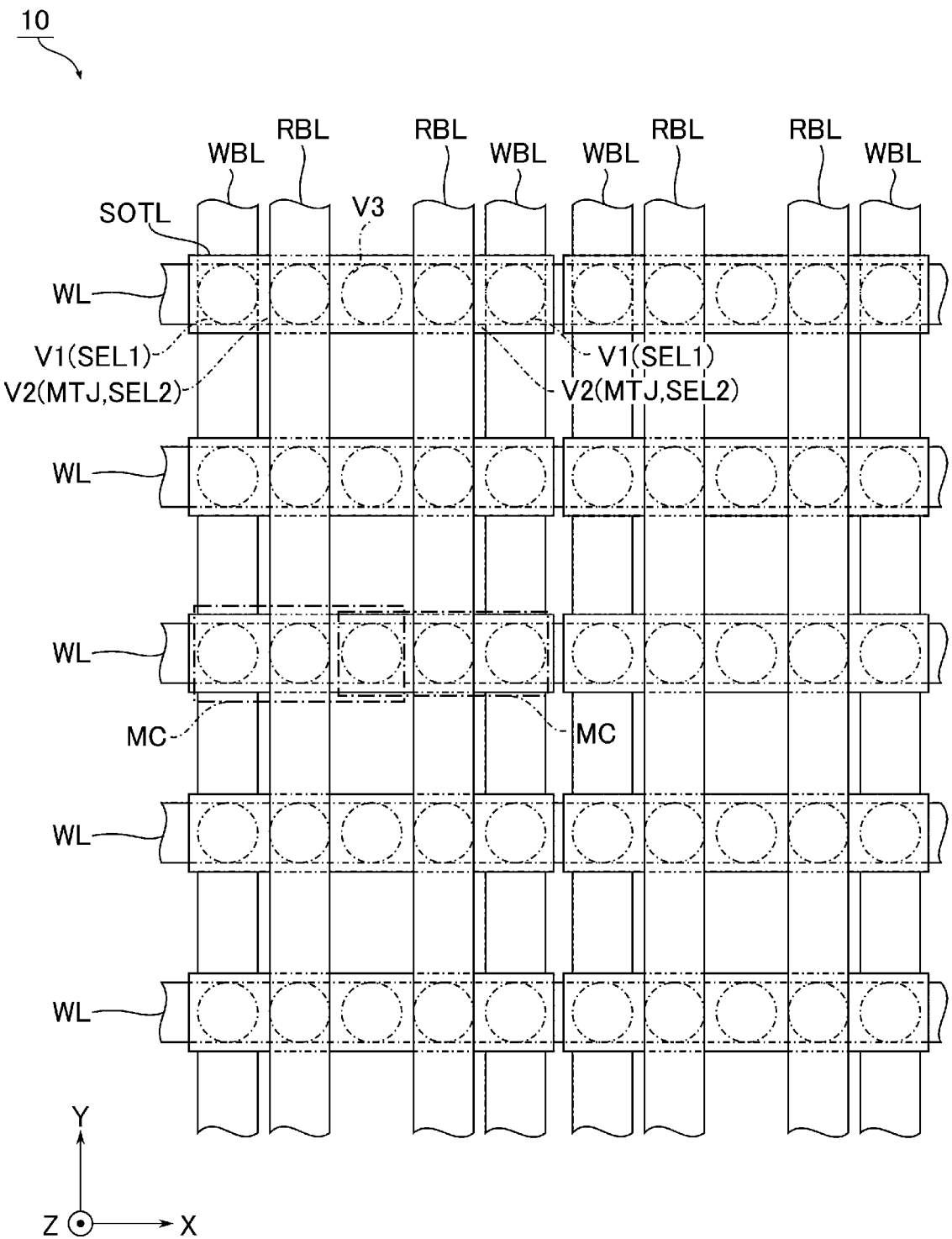
FIG. 34 is a plan view a memory cell array according to a sixth embodiment.

FIG. 34 is a plan view illustrating an example of the planar layout of the memory cell array according to the sixth embodiment. FIG. 34 corresponds to FIG. 28 according to the third embodiment.

The memory cell array 10 includes vertical structures V1, vertical structures V2, and vertical structures V3. Each of the vertical structures V1 includes the switching element SEL1. Each of the vertical structures V2 includes the magnetoresistance effect element MTJ and the switching element SEL2.

The plurality of word lines WL are arranged in the Y direction. Each of the word lines WL extends in the X direction.

The plurality of write bit lines WBL are provided above the plurality of word lines WL. The plurality of write bit lines WBL are arranged in the X direction. Each of the write bit lines WBL extends in the Y direction.

The plurality of wirings SOTL are provided above the plurality of write bit lines WBL. In a plan view, each of the wirings SOTL has a rectangular shape. The long side directions and the short side directions of the plurality of wirings SOTL are parallel to the X direction and the Y direction, respectively. That is, the long side direction of the wiring SOTL is orthogonal to the write bit line WBL. In a plan view, each of the plurality of wirings SOTL is provided at positions overlapping with one word line WL, and two adjacent write bit lines WBL and two adjacent read bit lines RBL.

The plurality of read bit lines RBL are provided above the plurality of wirings SOTL. The plurality of read bit lines RBL are arranged in the X direction. Each of the read bit lines RBL extends in the Y direction. In a plan view, two read bit lines RBL are provided between two adjacent write bit lines WBL.

The vertical structures V1 extend in the Z direction. In a plan view, the vertical structures V1 each have a circular shape. Each of the vertical structures V1 is connected between one corresponding write bit line WBL and one corresponding wiring SOTL.

The vertical structures V2 extend in the Z direction. In a plan view, the vertical structures V2 each have a circular shape. Each of the vertical structures V2 is connected between one corresponding read bit line RBL and one corresponding wiring SOTL.

The vertical structures V3 extends in the Z direction. In a plan view, the vertical structures V3 each have a circular shape. Each of the vertical structures V3 is connected between one corresponding word lines WL and one corresponding wiring SOTL.

In the configuration as above, a set including one wiring SOTL and one vertical structure V1, one vertical structure V2, and one vertical structure V3 connected to one corresponding wiring SOTL functions as one memory cell MC. Also, a wiring SOTL and a vertical structure V3 are shared by two memory cells MC.

Two vertical structures V2 respectively provided for two memory cells MC that share the wiring SOTL are arranged in the X direction. In a plan view, the center of the vertical structures V2 are positioned on the symmetric axis along the X direction of the wiring SOTL. That is, the wiring SOTL and two vertical structures V2 respectively provided for two memory cells MC that share the same wiring SOTL are provided on the same axis along the X direction.

6.3 Effect According to Sixth Embodiment

According to the sixth embodiment, the wiring SOTL has a rectangular shape having a long side extending in the direction intersecting with the write bit lines WBL and the read bit line at 90 degrees. Accordingly, the magnetoresistance effect element MTJ can be disposed while the word lines WL are shared by two memory cells.

Two vertical structures V2 that share the wiring SOTL are provided on the same axis as the corresponding wiring SOTL in a plan view. Accordingly, compared to a case where the vertical structures V2 are not provided on the same axis as the wiring SOTL, the contact area between the magnetoresistance effect element MTJ and the wiring SOTL can be increased. Therefore, in the same manner as the third embodiment, during the write operation, the wiring SOTL can inject the larger spin orbit torque to the magnetoresistance effect element MTJ.

The configuration and the operation according to the first modification of the first embodiment, the second modification of the first embodiment, and the third modification of the first embodiment can be applied to the magnetic memory device according to the sixth embodiment. In this case, the magnetic memory device according to the sixth embodiment can exhibit the same effect as those in the first modification of the first embodiment, the second modification of the first embodiment, and the third modification of the first embodiment.

7. Others

In the first to sixth embodiments, and the first to third modifications described above, the memory cell array 10 in which two hierarchical structures L1 and L2 are stacked above the semiconductor substrate 20 is illustrated, but the embodiment is not limited thereto. For example, three or more hierarchical structures having the same structure may be stacked above the semiconductor substrate 20. For example, one hierarchical structure may be stacked above the semiconductor substrate 20.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic memory device, comprising:
    a first conductor layer;
    a second conductor layer;
    a third conductor layer; and
    a first memory cell of a three-terminal type that is connected to the first conductor layer, the second conductor layer, and the third conductor layer, the first memory cell including:
        a fourth conductor layer including a first portion connected to the first conductor layer, a second portion connected to the second conductor layer, and a third portion that is connected to the third conductor layer,
        a first magnetoresistance effect element connected between the third conductor layer and the fourth conductor layer,
        a first switching element of a two-terminal-type that is connected between the second conductor layer and the fourth conductor layer, and
        a second switching element of a two-terminal-type that is connected between the first conductor layer and the third conductor layer;
    a fifth conductor layer;
    a sixth conductor layer; and
    a second memory cell of a three-terminal-type that is connected to the first conductor layer, the fifth conductor layer, and the sixth conductor layer, wherein
    the fourth conductor layer includes a fourth portion that is connected to the fifth conductor layer and a fifth portion that is connected to the sixth conductor layer,
    the second memory cell shares the fourth conductor layer with the first memory cell and includes:
        a second magnetoresistance effect element connected between the sixth conductor layer and the fourth conductor layer,
        a third switching element of a two-terminal-type that is connected between the fifth conductor layer and the fourth conductor layer, and
        a fourth switching element of a two-terminal-type that is connected between the sixth conductor layer and the second magnetoresistance effect element, and
    the second switching element is connected between the third conductor layer and the first magnetoresistance effect element.

2. The magnetic memory device according to claim 1, wherein the first switching element has current-voltage characteristics with snapback.

3. The magnetic memory device according to claim 1, wherein the second switching element has current-voltage characteristics without snapback.

4. The magnetic memory device according to claim 1, wherein
    the first conductor layer and the fourth conductor layer extend in a first direction,
    the second conductor layer and the third conductor layer extend in a second direction intersecting the first direction, and
    when viewed from a third direction intersecting a plane including the first direction and the second direction:
    the first magnetoresistance effect element and the second switching element overlap the third conductor layer and the fourth conductor layer,
    the first switching element overlaps the second conductor layer and the fourth conductor layer,
    the second magnetoresistance effect element and the fourth switching element overlap the sixth conductor layer and the fourth conductor layer, and
    the third switching element overlaps the fifth conductor layer and the fourth conductor layer.

5. The magnetic memory device according to claim 4, wherein the first magnetoresistance effect element and the second magnetoresistance effect element are aligned with each other along the first direction.

6. The magnetic memory device according to claim 1, wherein
    the first conductor layer extends in a first direction,
    the second conductor layer and the third conductor layer extend in a second direction intersecting the first direction,
    the fourth conductor layer extends in a fourth direction intersecting both the first direction and the second direction but within the same plane as the first direction and the second direction, and
    when viewed from a third direction intersecting with the plane including the first direction and the second direction:
    the first magnetoresistance effect element and the second switching element overlap the third conductor layer and the fourth conductor layer, the first switching element overlaps the second conductor layer and the fourth conductor layer,
the second magnetoresistance effect element and the fourth switching element overlap the sixth conductor layer and the fourth conductor layer, and
the third switching element overlaps the fifth conductor layer and the fourth conductor layer.

7. The magnetic memory device according to claim 6, wherein an angle formed by the second direction and the fourth direction is (90−a tan (⅓)) degrees.

8. The magnetic memory device according to claim 6, wherein the first magnetoresistance effect element and the second magnetoresistance effect element are aligned with each other along the fourth direction.

9. The magnetic memory device according to claim 6, wherein
the first magnetoresistance effect element and the second magnetoresistance effect element are aligned with each other along the first direction, and
a center of the first magnetoresistance effect element and a center of the second magnetoresistance effect element are offset from a central axis of the fourth conductor layer along the fourth direction.

10. The magnetic memory device according to claim 6, further comprising:
a seventh conductor layer extending in the first direction;
an eighth conductor layer extending in the second direction;
a ninth conductor layer extending in the second direction;
a tenth conductor layer extending in the second direction;
a third memory cell of a three-terminal-type that is connected to the seventh conductor layer, the fifth conductor layer, and the eighth conductor layer; and
a fourth memory cell of a three-terminal-type that is connected to the seventh conductor layer, the ninth conductor layer, and the tenth conductor layer, wherein
the third memory cell includes:
an eleventh conductor layer extending in the fourth direction and including a sixth portion connected to the seventh conductor layer, a seventh portion connected to the fifth conductor layer, an eighth portion connected to the eighth conductor layer, a ninth portion that is connected to the ninth conductor layer, and a tenth portion that is connected to the tenth conductor layer,
a third magnetoresistance effect element connected between the eighth conductor layer and the eleventh conductor layer,
a fifth switching element of a two-terminal-type that is connected between the fifth conductor layer and the eleventh conductor layer, and
a sixth switching element of a two-terminal-type that is connected between the eighth conductor layer and the third magnetoresistance effect element; and
the fourth memory cell shares the eleventh conductor layer with the third memory cell and includes:
a fourth magnetoresistance effect element connected between the tenth conductor layer and the eleventh conductor layer,
a seventh switching element of a two-terminal-type that is connected between the ninth conductor layer and the eleventh conductor layer, and
an eighth switching element of a two-terminal-type that is connected between the tenth conductor layer and the fourth magnetoresistance effect element.

11. The magnetic memory device according to claim 10, wherein, when viewed from the third direction, the first conductor layer is positioned on the opposite side of the fourth conductor layer and the eleventh conductor layer from the seventh conductor layer.

12. The magnetic memory device according to claim 10, wherein, when viewed from the third direction, the first conductor layer is positioned on the same side of the fourth conductor layer and the eleventh conductor layer as the seventh conductor layer.

13. A magnetic memory device, comprising:
a first conductor layer;
a second conductor layer:
a third conductor layer; and
a first memory cell of a three-terminal type that is connected to the first conductor layer, the second conductor layer, and the third conductor layer, the first memory cell including:
a fourth conductor layer including a first portion connected to the first conductor layer, a second portion connected to the second conductor layer, and a third portion that is connected to the third conductor layer,
a first magnetoresistance effect element connected between the third conductor layer and the fourth conductor layer,
a first switching element of a two-terminal-type that is connected between the second conductor layer and the fourth conductor layer, and
a second switching element of a two-terminal-type that is connected between the first conductor layer and the third conductor layer, wherein
the second switching element is connected between the third conductor layer and the first magnetoresistance effect element,
the first conductor layer extends in a first direction,
the second conductor layer, the third conductor layer, and the fourth conductor layer extend in a second direction intersecting with the first direction, and
when viewed from a third direction intersecting with a plane including the first direction and the second direction:
the first magnetoresistance effect element and the second switching element overlap the third conductor layer and the fourth conductor layer, and
the first switching element overlaps the second conductor layer and the fourth conductor layer.

14. The magnetic memory device according to claim 13, wherein
the first magnetoresistance effect element includes:
a first ferromagnetic layer having a magnetization direction orthogonal to the plane,
a second ferromagnetic layer having a magnetization direction orthogonal to the plane, and
a first non-magnetic layer between the first ferromagnetic layer and the second ferromagnetic layer,
the fourth conductor layer includes:
a second non-magnetic layer positioned on an opposite side of the first ferromagnetic layer from the first non-magnetic layer, and
a third ferromagnetic layer positioned on an opposite side of the second non-magnetic layer from the first ferromagnetic layer, and
the second non-magnetic layer contains at least one element selected from platinum, palladium, gold, and silver.

15. The magnetic memory device according to claim 13, wherein
the first magnetoresistance effect element includes:

a first ferromagnetic layer having a magnetization direction orthogonal to the plane,
a second ferromagnetic layer having a magnetization direction orthogonal to the plane,
a first non-magnetic layer between the first ferromagnetic layer and the second ferromagnetic layer,
the fourth conductor layer includes a second non-magnetic layer positioned on an opposite side of the first ferromagnetic layer from the first non-magnetic layer, and
the second non-magnetic layer contains at least one element selected from platinum, palladium, gold, silver, hafnium, tantalum, and tungsten.

16. The magnetic memory device according to claim 13, wherein
the first magnetoresistance effect element includes:
a first ferromagnetic layer having a magnetization direction to parallel the plane,
a second ferromagnetic layer having a magnetization direction parallel to the plane, and
a first non-magnetic layer between the first ferromagnetic layer and the second ferromagnetic layer,
the fourth conductor layer includes a second non-magnetic layer positioned on an opposite side of the first ferromagnetic layer from the first non-magnetic layer, and
the second non-magnetic layer contains at least one element selected from platinum, palladium, gold, silver, hafnium, tantalum, and tungsten.

17. The magnetic memory device according to claim 13, wherein the second switching element is connected between the first conductor layer and the fourth conductor layer.

18. The magnetic memory device according to claim 17, wherein the second switching element has current-voltage characteristics with snapback.

19. The magnetic memory device according to claim 17, wherein
the first conductor layer extends in a first direction,
the second conductor layer, the third conductor layer, and the fourth conductor layer extend in a second direction intersecting with the first direction, and
when viewed from a third direction intersecting with a plane including the first direction and the second direction:
the first magnetoresistance effect element overlaps the third conductor layer and the fourth conductor layer,
the first switching element overlaps the second conductor layer and the fourth conductor layer, and
the second switching element overlaps the first conductor layer and the fourth conductor layer.

20. A magnetic memory device, comprising:
a first conductor layer;
a second conductor layer:
a third conductor layer;
a first memory cell of a three-terminal type that is connected to the first conductor layer, the second conductor layer, and the third conductor layer, the first memory cell including:
a fourth conductor layer including a first portion connected to the first conductor layer, a second portion connected to the second conductor layer, and a third portion that is connected to the third conductor layer,
a first magnetoresistance effect element connected between the third conductor layer and the fourth conductor layer,
a first switching element of a two-terminal-type that is connected between the second conductor layer and the fourth conductor layer, and
a second switching element of a two-terminal-type that is connected between the first conductor layer and the third conductor layer;
a twelfth conductor layer;
a thirteenth conductor layer;
a fourteenth conductor layer; and
a fifth memory cell of a three-terminal-type that is connected to the twelfth conductor layer, the thirteenth conductor layer, and the fourteenth conductor layer, wherein
the fifth memory cell includes:
a fifteenth conductor layer including:
an eleventh portion connected to the twelfth conductor layer,
a twelfth portion connected to the thirteenth conductor layer, and
a thirteenth portion that is connected to the fourteenth conductor layer,
a fifth magnetoresistance effect element connected between the fourteenth conductor layer and the fifteenth conductor layer,
a ninth switching element of a two-terminal-type that is connected between the thirteenth conductor layer and the fifteenth conductor layer, and
a tenth switching element of a two-terminal-type that is connected between the twelfth conductor layer and the fourteenth conductor layer, and
the fifth memory cell is on an opposite side of the first memory cell from a substrate.

* * * * *